United States Patent [19]
Ohtaki et al.

[11] Patent Number: 5,847,451
[45] Date of Patent: Dec. 8, 1998

[54] MULTI-LAYERED PRINTED CIRCUIT BOARD, AND GRID ARRAY PACKAGE ADOPTING THE SAME

[76] Inventors: Toru Ohtaki; Yasuteru Ichida; Yasushi Takeuchi, all of c/o Canon Kabushiki Kaisha 30-2, Shimomaruko 3-chome, Ohta-ku, Tokyo, Japan

[21] Appl. No.: 721,793

[22] Filed: Sep. 25, 1996

[30] Foreign Application Priority Data

| Sep. 29, 1995 | [JP] | Japan | 7-252680 |
| Apr. 2, 1996 | [JP] | Japan | 8-079931 |
| Aug. 30, 1996 | [JP] | Japan | 8-230563 |

[51] Int. Cl.⁶ .......... H01L 23/48; H01L 29/00; H01L 29/053; H01L 23/34
[52] U.S. Cl. .......... 257/697; 257/531; 257/701; 257/723; 257/924; 361/777; 361/782; 361/794
[58] Field of Search .......... 257/701, 697, 257/72, 3, 4, 924, 531; 361/777, 782

[56] References Cited

U.S. PATENT DOCUMENTS

| 4,035,695 | 7/1977 | Knutson et al. | 361/782 |
| 5,027,089 | 6/1991 | Henke | 333/12 |
| 5,068,631 | 11/1991 | Vince | 333/181 |
| 5,131,140 | 7/1992 | Zimmer | 29/846 |
| 5,278,524 | 1/1994 | Mullen | 333/1 |
| 5,488,539 | 1/1996 | Testa et al. | 361/720 |
| 5,504,370 | 4/1996 | Lin et al. | 257/676 |
| 5,650,665 | 7/1997 | Yamamoto et al. | 257/773 |
| 5,661,336 | 8/1997 | Phelps, Jr. et al. | 257/668 |

FOREIGN PATENT DOCUMENTS

| 1-134489 | 10/1982 | Canada | 257/924 |
| 0513909 | 1/1993 | Japan . | |

*Primary Examiner*—Teresa Maria Arroyo

[57] ABSTRACT

In a multi-layered printed circuit board on which an LSI having a plurality of power supply pins and a plurality of signal pins is mounted, and a grid array package which adopts the printed circuit board, some or all of the plurality of power supply pins are connected to a power supply pattern via an inductance pattern, thereby reducing generation of radiation noise.

26 Claims, 44 Drawing Sheets

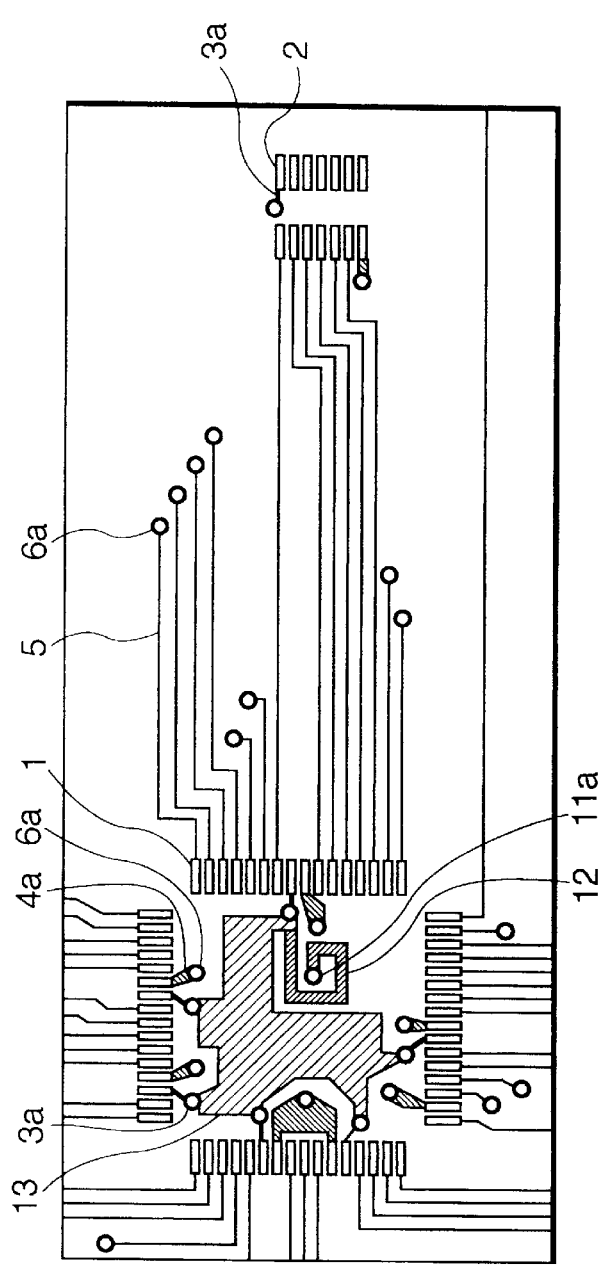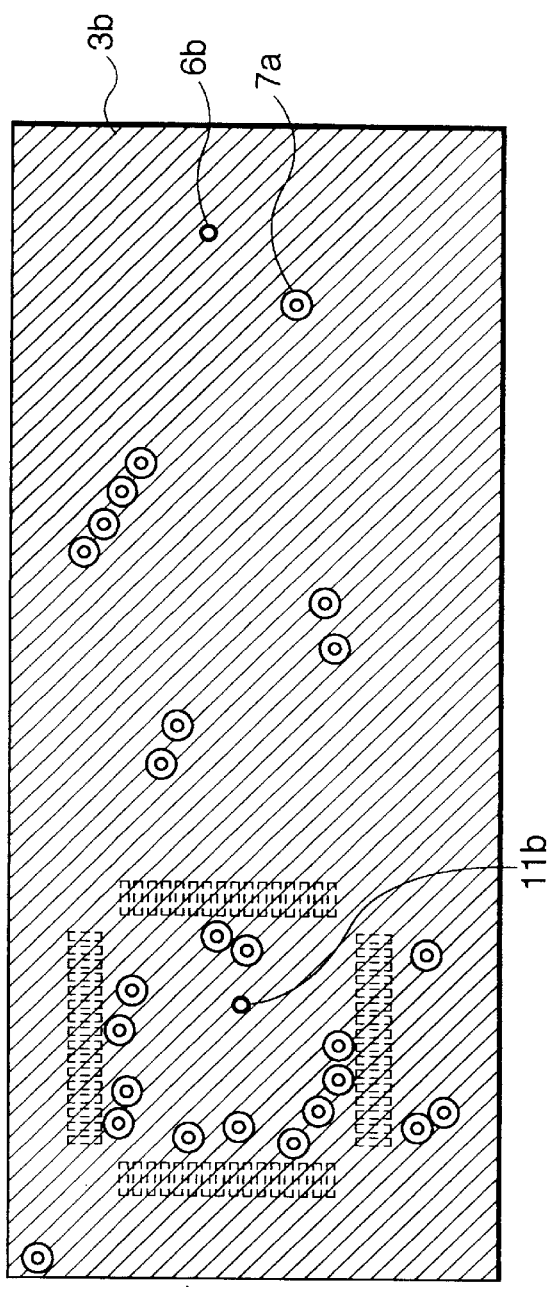
FIG. 1A
FIG. 1B

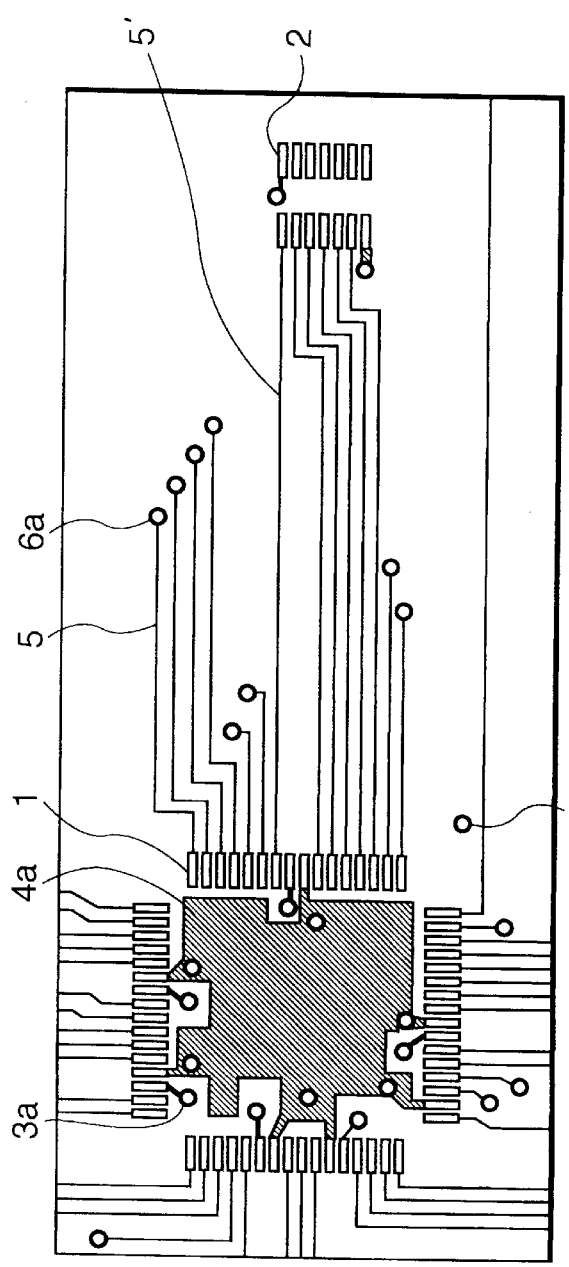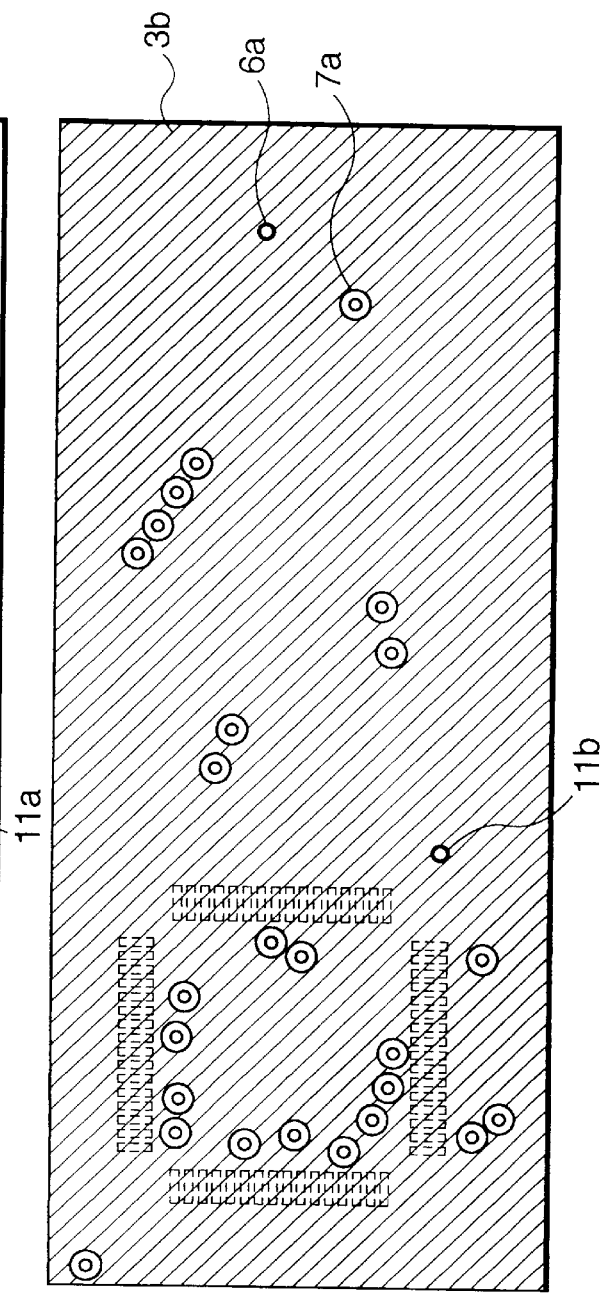
FIG. 3A
FIG. 3B

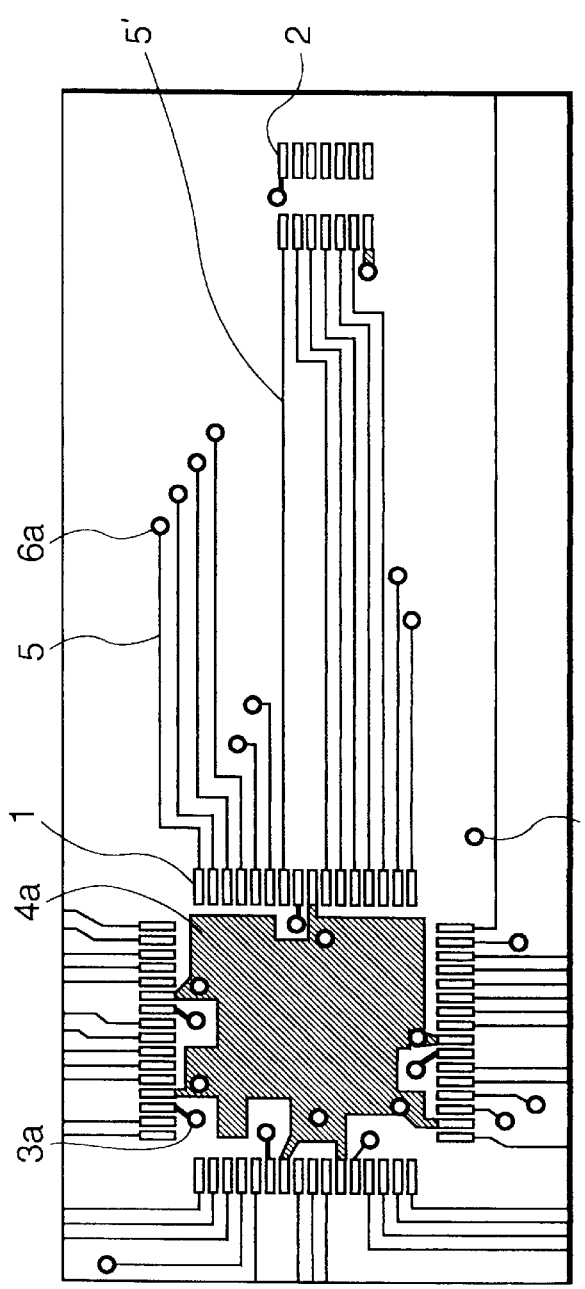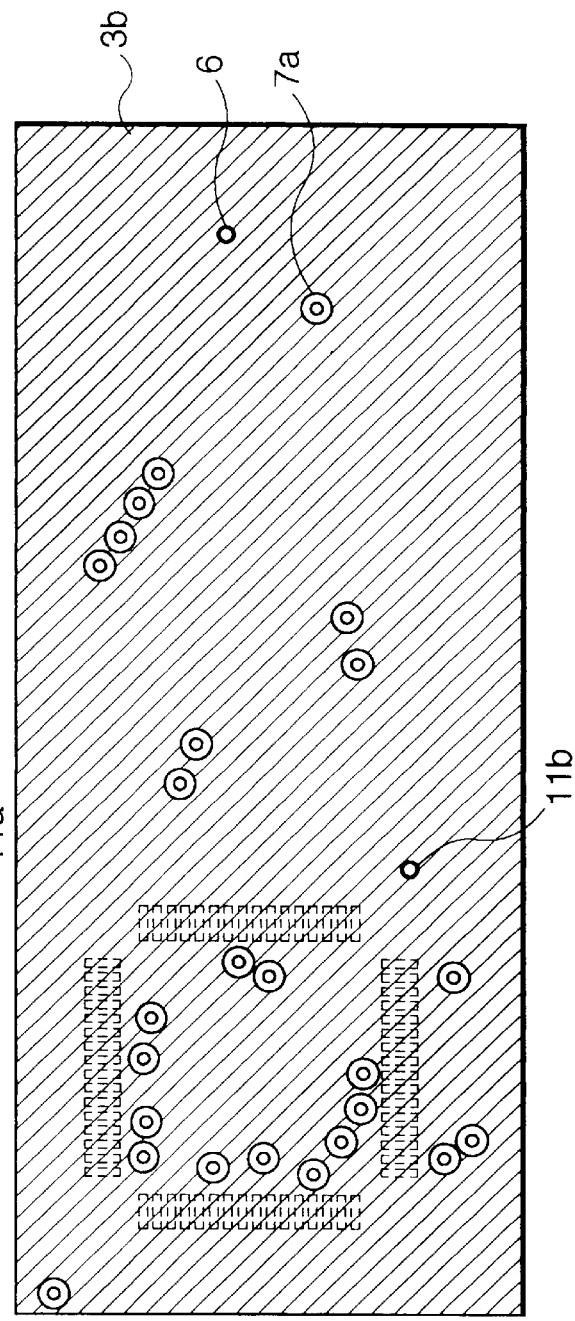
FIG. 4A
FIG. 4B

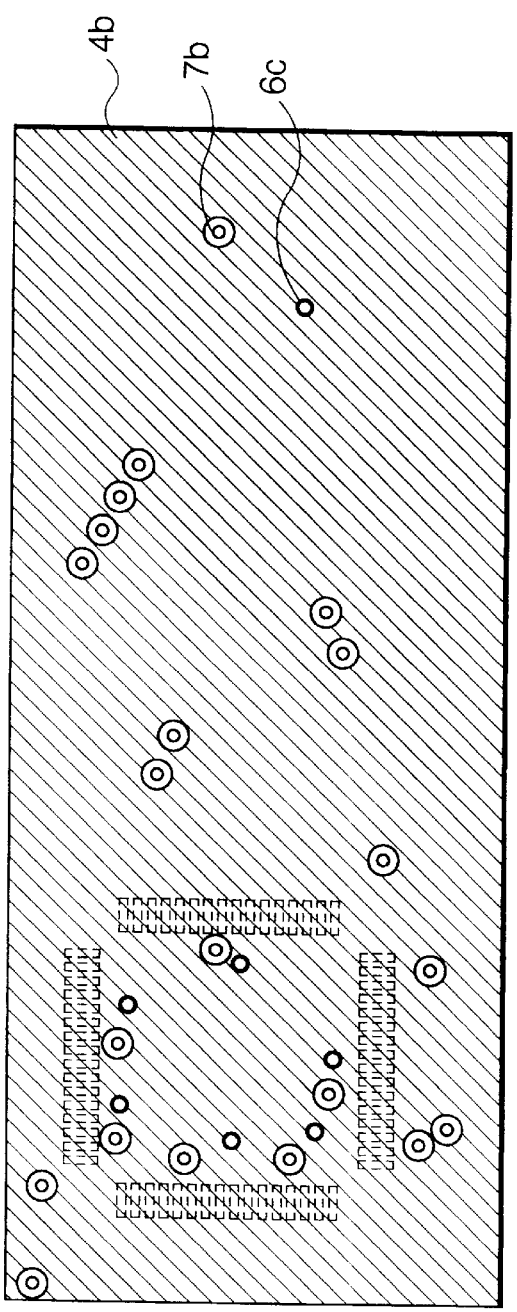
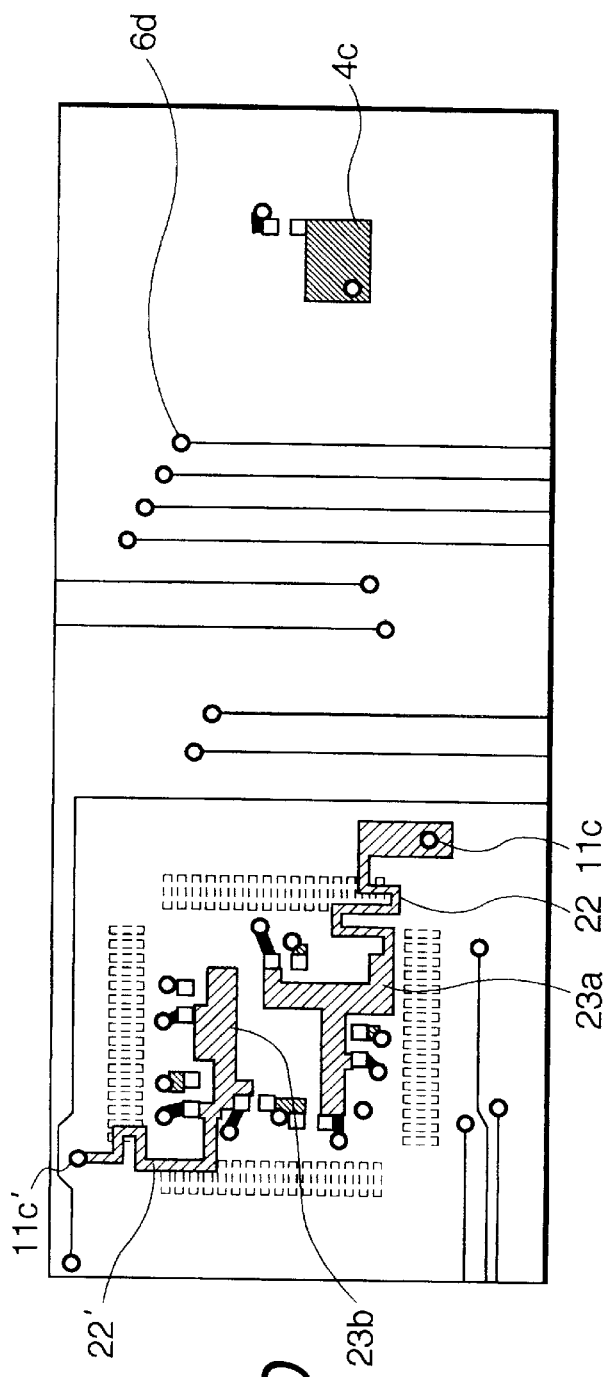
FIG. 6C
FIG. 6D

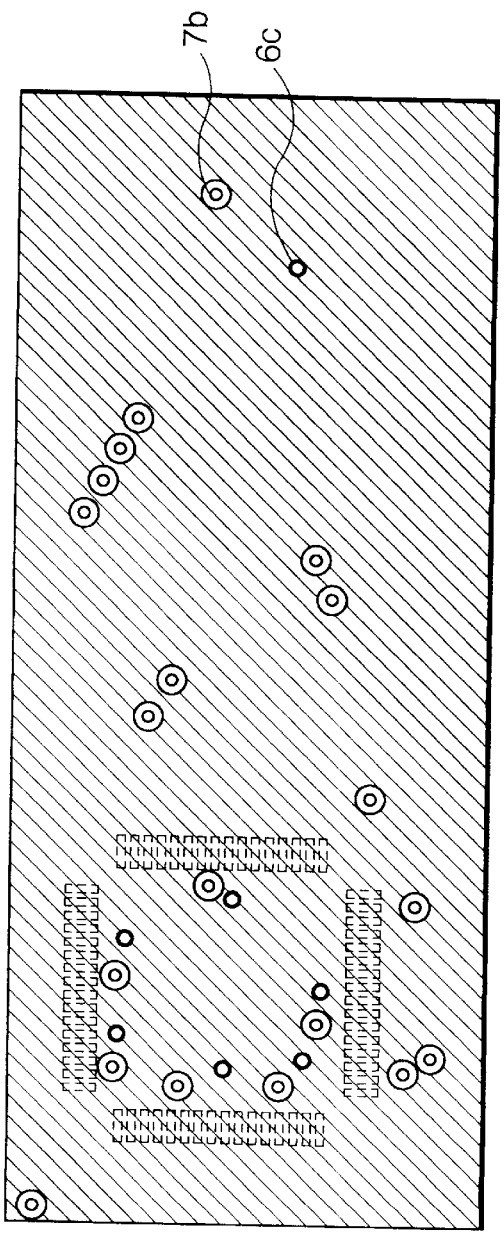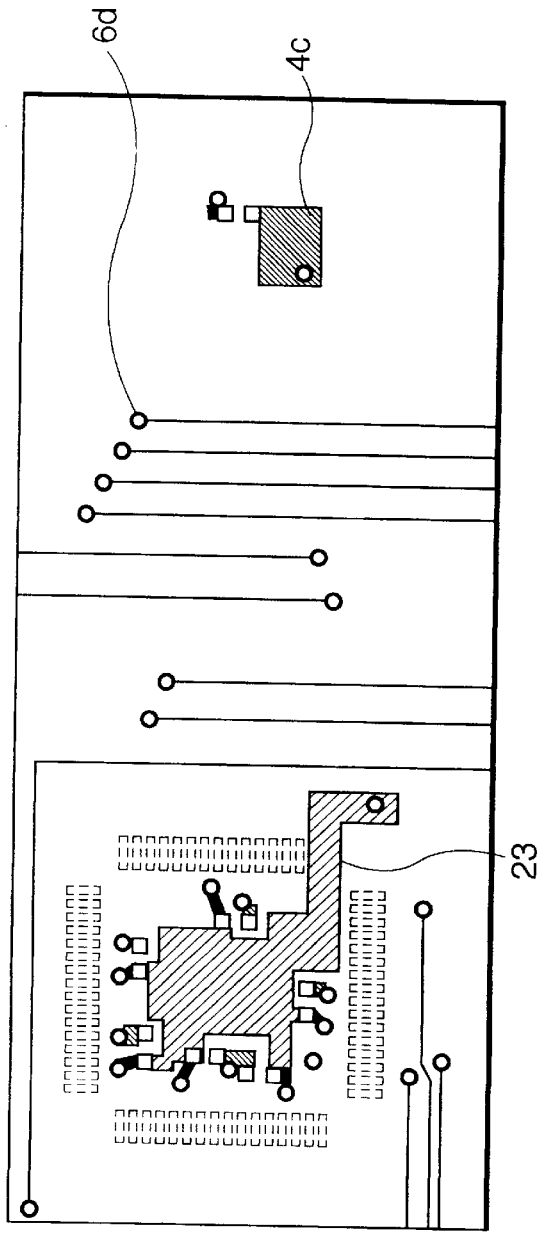
FIG. 9C
FIG. 9D

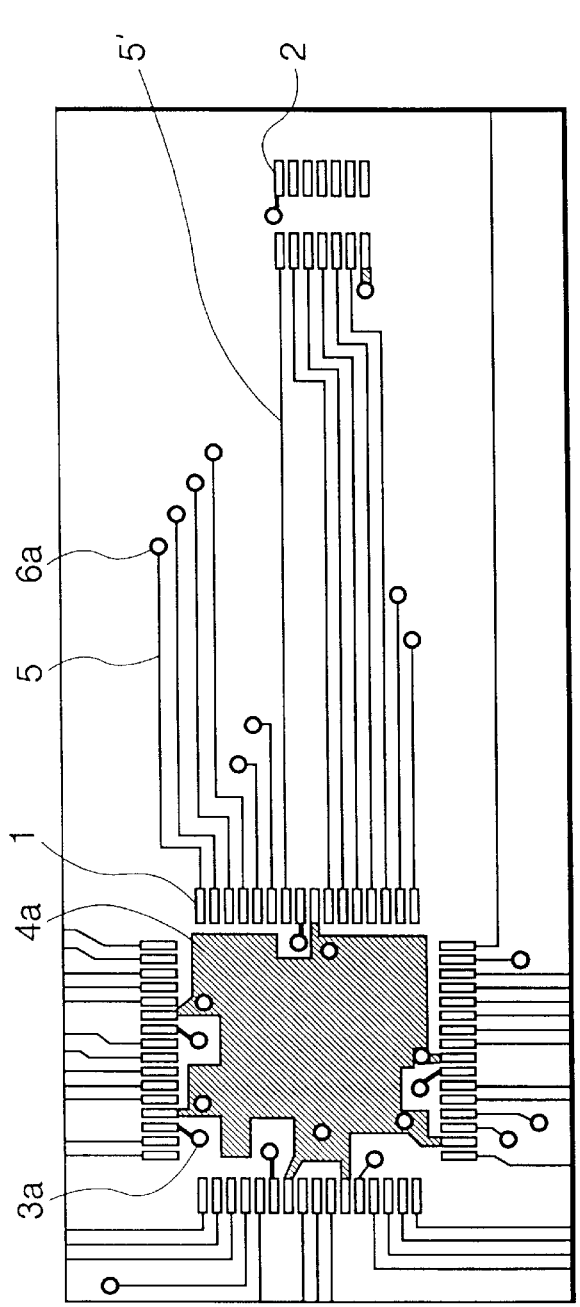
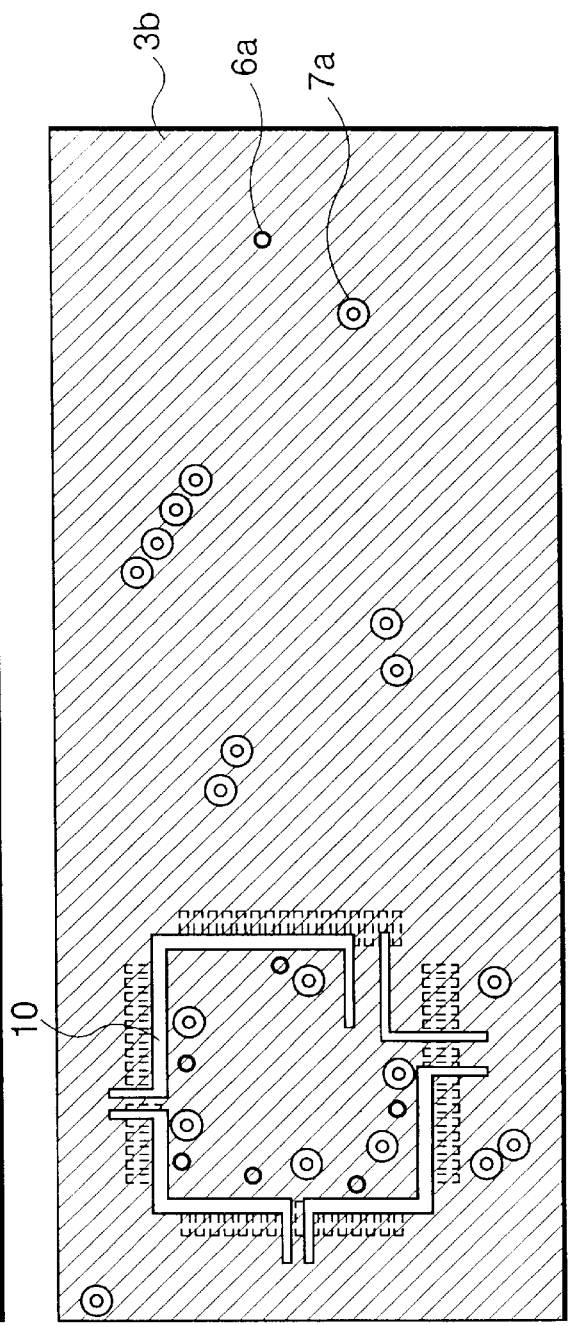
FIG. 12A
FIG. 12B

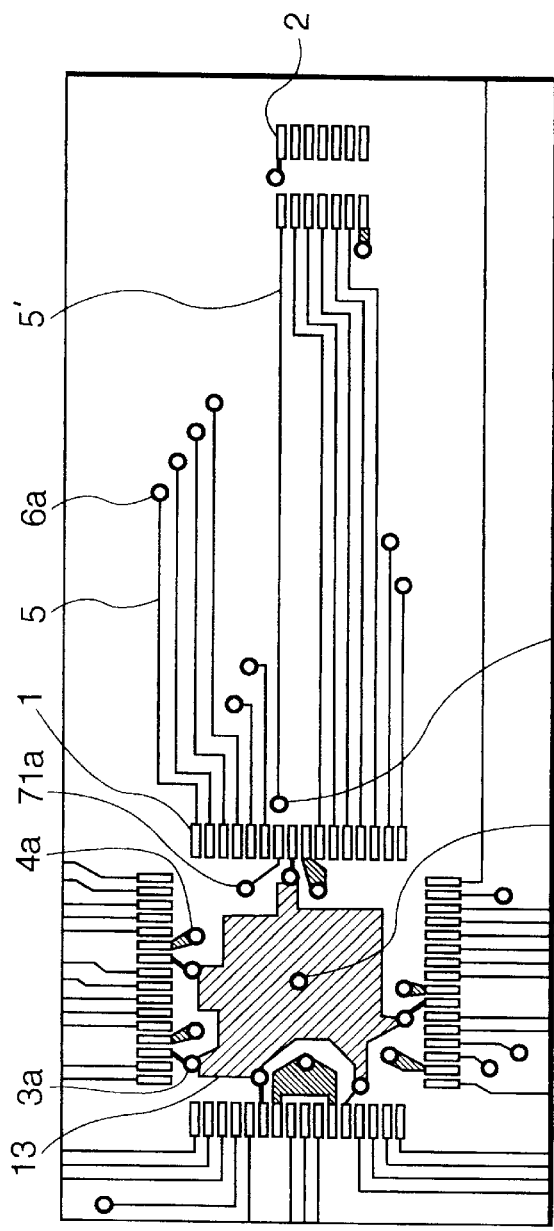
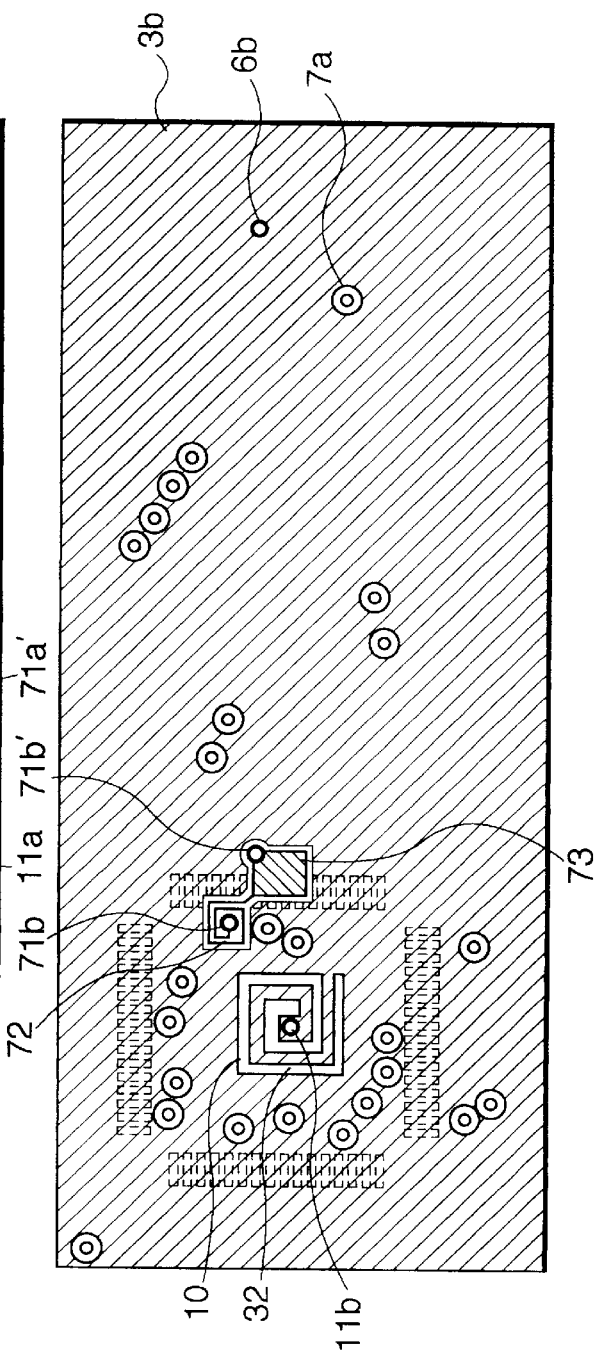
FIG. 14A
FIG. 14B

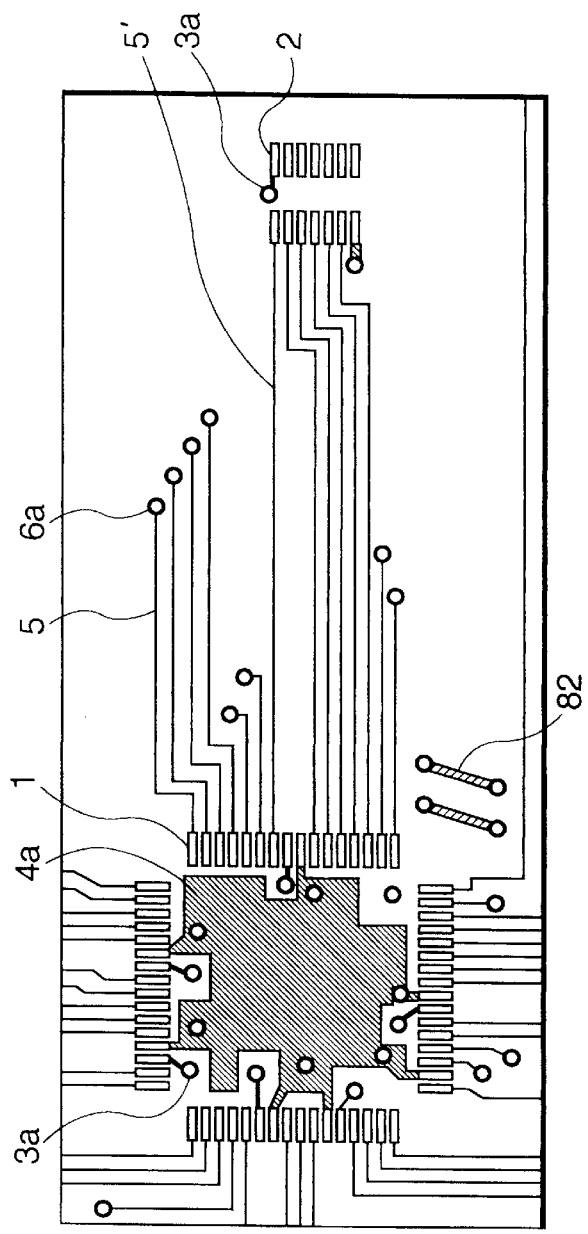
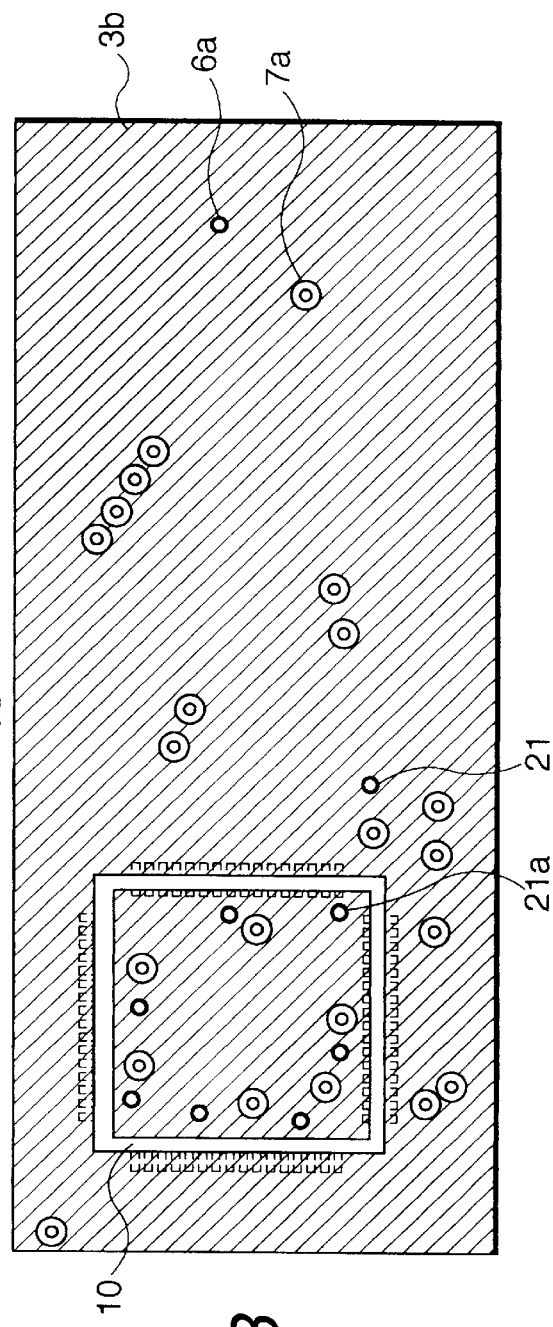
FIG. 15A
FIG. 15B

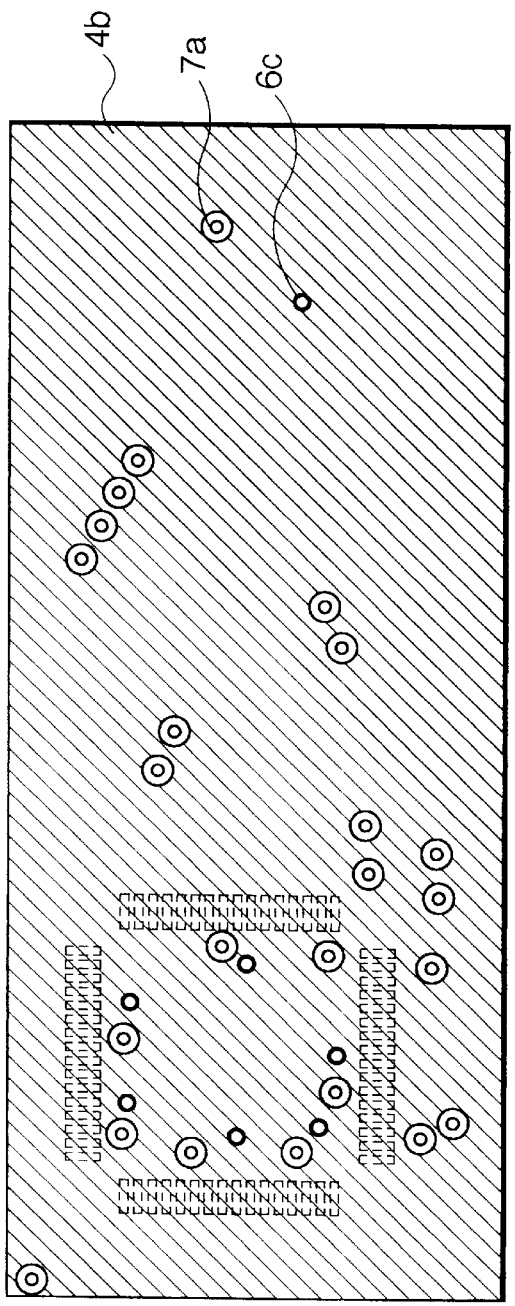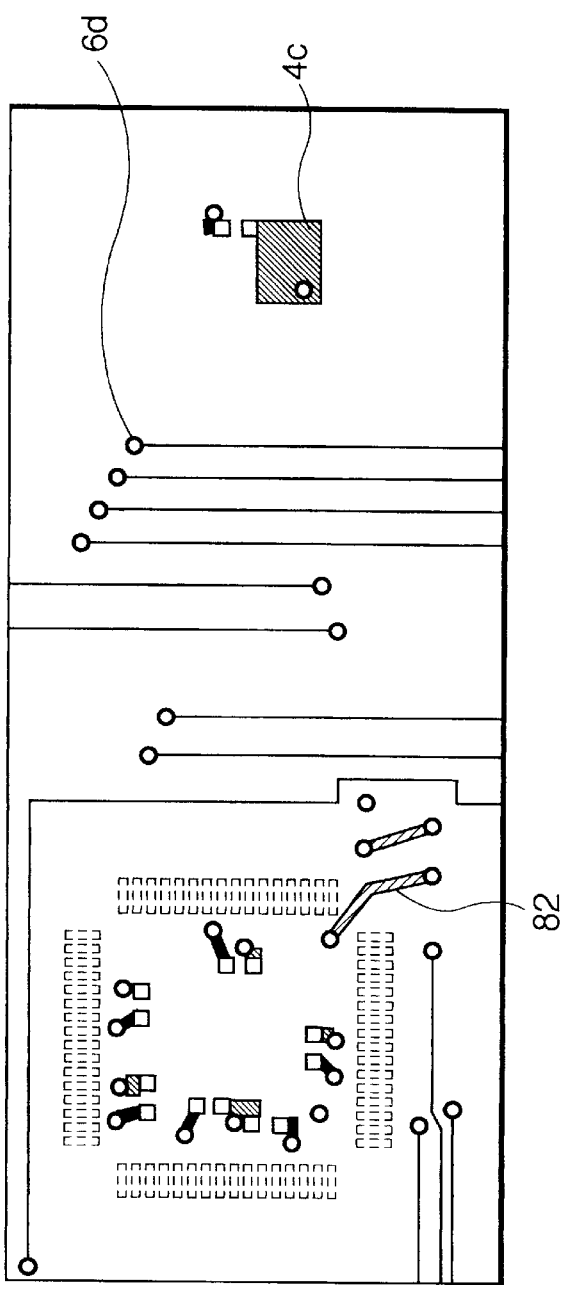
FIG. 15C
FIG. 15D

MULTI-LAYERED PRINTED CIRCUIT BOARD, AND GRID ARRAY PACKAGE ADOPTING THE SAME

BACKGROUND OF THE INVENTION

1. Field of the Invention

The present invention relates to a multi-layered printed circuit board that takes a countermeasure against noise corresponding to, e.g., EMI (Electron Magnetic Interference) standards, and a grid array package adopting the same.

2. Related Background Art

Conventionally, as a countermeasure against radiation noise, a printed circuit board with a power supply pattern structure which attains connections between lands for mounting the power supply pins of an LSI and a power supply pattern via through holes in the vicinities of the lands using a multi-layered board having a structure in which the power supply pattern and the GND pattern oppose each other in a plane, is used.

FIGS. 28A to 28D show the structure of a printed circuit board having a general power supply pattern structure. More specifically, FIG. 28A is a plan view of a first layer, FIG. 28B is a plan view of a second layer, FIG. 28C is a plan view of a third layer, and FIG. 28D is a plan view of a fourth layer. In order to allow easy understanding of the positional relationship among layers, the land positions are indicated by dotted lines in FIGS. 28B to 28D.

The printed circuit board with the power supply pattern structure is a four-layered printed circuit board on which an LSI having a plurality of power supply pins and a plurality of signal pins is mounted, and is constituted by four layers, i.e., a first layer (signal layer), a second layer (power supply layer), a third layer (GND layer), and a fourth layer (signal layer). The structures of the respective layers will be explained in detail below.

As shown in FIG. 28A, the first layer is formed with LSI lands 201 on which a QFP LSI is to be mounted, IC lands 202 on which an SOS IC is to be mounted, a power supply pattern 203a (portions indicated by solid lines) connected to the power supply lands of the LSI and IC lands 201 and 202, a GND pattern 204a (a light hatched portion) connected to the ground lands of the LSI lands 201, a signal pattern 205, a signal pattern 205' for transmitting a clock signal, and through hole lands 206a (bold circles) electrically connected to through holes for interlayer connections. The GND pattern 204a is electrically connected to the through hole lands 206a, and is also connected to a GND pattern 204b via through hole lands 206c of the third layer (to be described later), which are connected to the through hole lands 206a via through holes.

As shown in FIG. 28B, the second layer is formed with a power supply pattern 203b (a dark hatched portion), through hole lands 206b (bold circles), and clearance holes 207a (double circles). The power supply pattern 203b is electrically connected to the through hole lands 206b, and is also connected to the power supply pattern 203a of the first layer and a power supply pattern 203c of the fourth layer (to be described later) via through holes. In each clearance hole 207a (double circle), a through hole is formed in the outer circle to extend through the second layer, and hence, each clearance hole 207a is not electrically connected to the power supply pattern 203b.

As shown in FIG. 28C, the third layer is formed with a GND pattern 204b (a light hatched portion), through hole lands 206c (bold circles), and clearance holes 207b (double circles). The GND pattern 204b is electrically connected to the through hole lands 206c. In each clearance hole 207b (double circle), a through hole is formed in the outer circle to extend through the third layer, and hence, each clearance hole 207b is not electrically connected to the GND pattern 204b.

As shown in FIG. 28D, the fourth layer is formed with a power supply pattern 203c (portions indicated by solid lines), a GND pattern (a light hatched portion), through hole lands 206d (bold circles), and lands 208 and 209 on which a chip type bypass capacitor is to be mounted. The power supply pattern 203c is connected to the power supply pattern 203b of the second layer via through holes, and is electrically connected to the land 208. The land 209 is connected, via the GND pattern 204c, to a land, which is connected to the GND pattern 204b of the third layer via a through hole, of the through hole land 206d.

The above-mentioned printed circuit board, in which the power supply pattern 203b of the second layer (power supply layer) is connected to the power supply lands of the LSI lands 201 of the first layer via through holes, must take a countermeasure against radiation noise owing to the power supply pattern. As a countermeasure against radiation noise owing to the power supply pattern, an article in "Electronic Technique" (June, 1988, pp. 36–37) describes an example wherein a ferrite bead is inserted by isolating the power supply pattern to be connected to an IC, and a π type filter is formed by utilizing a 0.1-$\mu$F bypass capacitor, thus realizing a radiation noise measure. Furthermore, this reference also describes a countermeasure for a gate array having two or more power supply pins. For example, in the case of an IC having two or more power supply pins, a power supply pattern isolated from that of a board forms a power supply pattern block, and is connected to the power supply pattern of the board via a three-terminal capacitor. With this structure, even when there are many power supply pins, a countermeasure can be taken by inserting only one filter.

Japanese Laid-Open Patent Application No. 5-13909 also describes an example wherein the same circuit arrangement as the above-mentioned arrangement is formed on a board using an SLSI having a plurality of power supplies.

Likewise, it is a common practice to insert a filter element, an inductor element, or a capacitor element between a land used for mounting a signal pin and a signal line as a countermeasure against radiation noise with respect to the signal line.

A grid array package will be described below.

As one of semiconductor members, a grid array package such as a ball grid array package (to be referred to as a "BGA package" hereinafter), a pin grid array package (to be referred to as a "PGA package" hereinafter), or the like is used. A grid array package is constituted by mounting a semiconductor chip on a base board, and is mounted on a printed circuit board by soldering electrodes formed in a matrix pattern on the rear surface of the base board to connection pads of the printed circuit board.

Conventionally, when a grid array package is used, it is handled as one package like ICs such as a QFP (Quad Flat Package), an SOS (Small Out Line Package), and the like. That is, when an inductor element, a capacitor element, or a filter element for decoupling a power supply is arranged as a countermeasure against electromagnetic wave radiation noise for a power supply line, such element is inserted in the power supply line of a printed circuit board on which the grid array package is mounted. Similarly, when an inductor element, a capacitor element, or a filter element is to be inserted to cut high-frequency components of a signal so as to take a countermeasure against electromagnetic wave radiation noise for a signal line, such element is arranged on a printed circuit board on which the grid array package is mounted.

However, when a countermeasure member such as a ferrite bead, a filter, or the like is to be used, it must be disposed at its optimal position. However, in an LSI having a plurality of power supply pins and a plurality of signal pins, since the surface of the printed circuit board is crowded with patterns, such member must be disposed at a position with a low effect. Furthermore, since a noise preventive measure member which is not related to the original circuit operation is added, the number of members increases when members must be disposed or a pattern must be formed at high density, resulting in a disadvantage.

In consideration of differential-mode radiation, the electric field strength, which is assumed to be generated by a loop antenna, in the maximum radiation direction is given by the following equation (1) ("*Practical Noise Reduction Technique*", Jatech Press, p. 324):

$$E = 263 \times 10^{-16} (f^2 AI)(I/r) \tag{1}$$

where E is the electric field strength [V/m], f is the frequency [Hz], A is the loop area [m$^2$], I is the current [A], and r is the distance to the receiving antenna [m]. From equation (1) above, the loop area A of the high-frequency current I that may pose a radiation noise problem is preferably minimized. That is, on a printed circuit board, it is more effective to take a countermeasure against noise in the vicinity of the land on which the lead line of an IC is to be mounted, or in the vicinity of the semiconductor chip if possible. However, as the degree of integration of an IC becomes higher, the number of power supply pins and signal pines increases, and the surface of the board is crowded with patterns. For this reason, it becomes more difficult to dispose a noise preventive measure member at an optimal position.

If coupling of the power supply or cutting of high-frequency components of a signal line is insufficient, electromagnetic radiation noise increases, and the regulation values of VCCI, FCC, and the like in the respective countries cannot be satisfied.

SUMMARY OF THE INVENTION

The present invention has been made to solve the above-mentioned drawbacks, and has as its object to minimize generation of radiation noise by forming an inductance pattern on an inner layer of a multi-layered printed circuit board.

It is another object of the present invention to suppress radiation noise by adopting a base board formed with an inductance pattern in a grid array package.

It is still another object of the present invention to dispose an inductance pattern at an optimal position and reduce the number of members to allow high-density packaging.

Other objects of the present invention will become apparent from the following description of the detailed embodiments.

BRIEF DESCRIPTION OF THE DRAWINGS

FIGS. 1A to 1D show the first embodiment of a multi-layered printed circuit board according to the present invention, in which FIG. 1A is a plan view of a first layer of the multi-layered printed board, FIG. 1B is a plan view of a second layer of the multi-layered printed board, FIG. 1C is a plan view of a third layer of the multi-layered printed board, and FIG. 1D is a plan view of a fourth layer of the multi-layered printed board;

FIGS. 2A to 2D show an example of a multi-layered printed circuit board on which the inductance pattern shown in FIGS. 1A to 1D is modified to have a parallel shape, in which FIG. 2A is a plan view of a first layer of the multi-layered printed board, FIG. 2B is a plan view of a second layer of the multi-layered printed board, FIG. 2C is a plan view of a third layer of the multi-layered printed board, and FIG. 2D is a plan view of a fourth layer of the multi-layered printed board;

FIGS. 3A to 3D show the second embodiment of a multi-layered printed circuit board according to the present invention, in which FIG. 3A is a plan view of a first layer of the multi-layered printed board, FIG. 3B is a plan view of a second layer of the multi-layered printed board, FIG. 3C is a plan view of a third layer of the multi-layered printed board, and FIG. 3D is a plan view of a fourth layer of the multi-layered printed board;

FIGS. 4A to 4D show an example of a multi-layered printed circuit board on which the inductance pattern shown in FIGS. 3A to 3D is modified to have a spiral shape, in which FIG. 4A is a plan view of a first layer of the multi-layered printed board, FIG. 4B is a plan view of a second layer of the multi-layered printed board, FIG. 4C is a plan view of a third layer of the multi-layered printed board, and FIG. 4D is a plan view of a fourth layer of the multi-layered printed board;

FIGS. 5A to 5D show the third embodiment of a multi-layered printed circuit board according to the present invention, in which FIG. 5A is a plan view of a first layer of the multi-layered printed board, FIG. 5B is a plan view of a second layer of the multi-layered printed board, FIG. 5C is a plan view of a third layer of the multi-layered printed board, and FIG. 5D is a plan view of a fourth layer of the multi-layered printed board;

FIGS. 6A to 6D show another example of the multi-layered printed circuit board shown in FIGS. 5A to 5D, in which FIG. 6A is a plan view of a first layer of the multi-layered printed board, FIG. 6B is a plan view of a second layer of the multi-layered printed board, FIG. 6C is a plan view of a third layer of the multi-layered printed board, and FIG. 6D is a plan view of a fourth layer of the multi-layered printed board;

FIGS. 7A to 7D show still another example of the multi-layered printed circuit board shown in FIGS. 5A to 5D, in which FIG. 7A is a plan view of a first layer of the multi-layered printed board, FIG. 7B is a plan view of a second layer of the multi-layered printed board, FIG. 7C is a plan view of a third layer of the multi-layered printed board, and FIG. 7D is a plan view of a fourth layer of the multi-layered printed board;

FIGS. 8A to 8D show the fourth embodiment of a multi-layered printed circuit board according to the present invention, in which FIG. 8A is a plan view of a first layer of the multi-layered printed board, FIG. 8B is a plan view of a second layer of the multi-layered printed board, FIG. 8C is a plan view of a third layer of the multi-layered printed board, and FIG. 8D is a plan view of a fourth layer of the multi-layered printed board;

FIGS. 9A to 9D show another example of the multi-layered printed circuit board shown in FIGS. 8A to 8D, in which FIG. 9A is a plan view of a first layer of the multi-layered printed board, FIG. 9B is a plan view of a second layer of the multi-layered printed board, FIG. 9C is a plan view of a third layer of the multi-layered printed board, and FIG. 9D is a plan view of a fourth layer of the multi-layered printed board;

FIGS. 10A to 10D show the fifth embodiment of a multi-layered printed circuit board according to the present invention, in which FIG. 10A is a plan view of a first layer of the multi-layered printed board, FIG. 10B is a plan view of a second layer of the multi-layered printed board, FIG. 10C is a plan view of a third layer of the multi-layered printed board, and FIG. 10D is a plan view of a fourth layer of the multi-layered printed board;

FIGS. 11A to 11D show other examples of a notched portion of the second layer of the multi-layered printed circuit board shown in FIGS. 10A to 10D, in which FIG. 11A is a plan view showing the first example of the notched portion, FIG. 11B is a plan view showing the second example of the notched portion, FIG. 11C is a plan view showing the third example of the notched portion, and FIG. 11D is a plan view showing the fourth example of the notched portion;

FIGS. 12A to 12D show another example of the multi-layered printed circuit board shown in FIGS. 11A to 11D, which FIG. 12A is a plan view of a first layer of the multi-layered printed board, FIG. 12B is a plan view of a second layer of the multi-layered printed board, FIG. 12C is a plan view of a third layer of the multi-layered printed board, and FIG. 12D is a plan view of a fourth layer of the multi-layered printed board;

FIGS. 13A to 13D show the sixth embodiment of a multi-layered printed circuit board according to the present invention, in which FIG. 13A is a plan view of a first layer of the multi-layered printed board, FIG. 13B is a plan view of a second layer of the multi-layered printed board, FIG. 13C is a plan view of a third layer of the multi-layered printed board, and FIG. 13D is a plan view of a fourth layer of the multi-layered printed board;

FIGS. 14A to 14D show the seventh embodiment of a multi-layered printed circuit board according to the present invention, in which FIG. 14A is a plan view of a first layer of the multi-layered printed board, FIG. 14B is a plan view of a second layer of the multi-layered printed board, FIG. 14C is a plan view of a third layer of the multi-layered printed board, and FIG. 14D is a plan view of a fourth layer of the multi-layered printed board;

FIGS. 15A to 15D show the eighth embodiment of a multi-layered printed circuit board according to the present invention, in which FIG. 15A is a plan view of a first layer of the multi-layered printed board, FIG. 15B is a plan view of a second layer of the multi-layered printed board, FIG. 15C is a plan view of a third layer of the multi-layered printed board, and FIG. 15D is a plan view of a fourth layer of the multi-layered printed board;

FIGS. 16A to 16D show another example of the multi-layered printed circuit board shown in FIGS. 15A to 15D, in which FIG. 16A is a plan view of a first layer of the multi-layered printed board, FIG. 16B is a plan view of a second layer of the multi-layered printed board, FIG. 16C is a plan view of a third layer of the multi-layered printed board, and FIG. 16D is a plan view of a fourth layer of the multi-layered printed board;

FIGS. 28A to 28D show a conventional multi-layered printed circuit board, in which FIG. 28A is a plan view of a first layer of the multi-layered printed board, FIG. 28B is a plan view of a second layer of the multi-layered printed board, FIG. 28C is a plan view of a third layer of the multi-layered printed board, and FIG. 28D is a plan view of a fourth layer of the multi-layered printed board.

DESCRIPTION OF THE PREFERRED EMBODIMENTS

The preferred embodiments of the present invention will be described hereinafter with reference to the accompanying drawings. Initially, a multi-layered printed circuit board will be explained below.

Figure 1C:
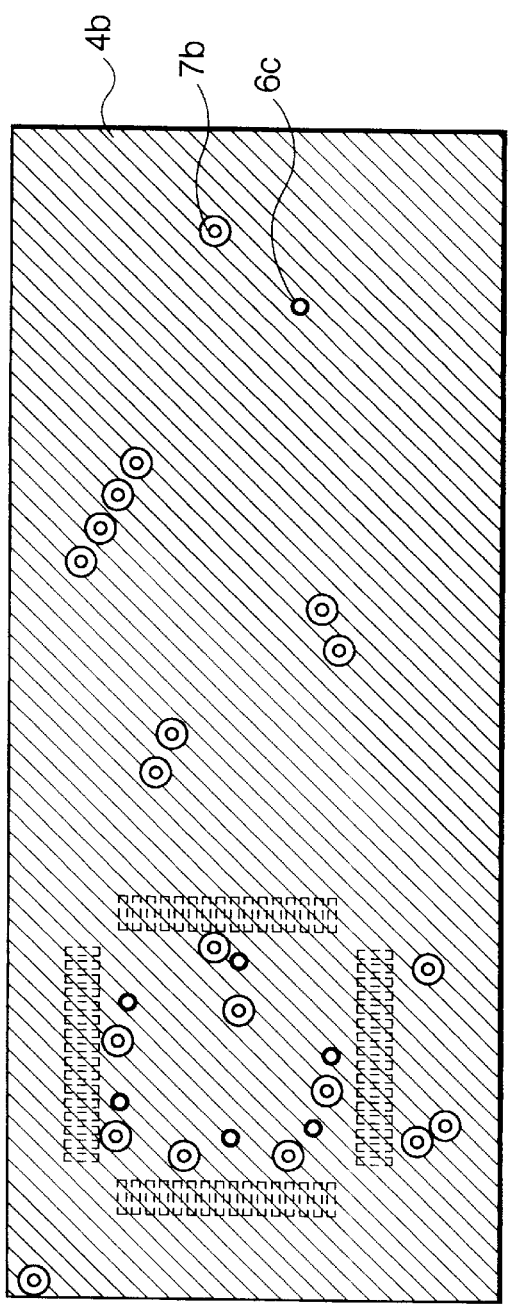
Figure 1D:
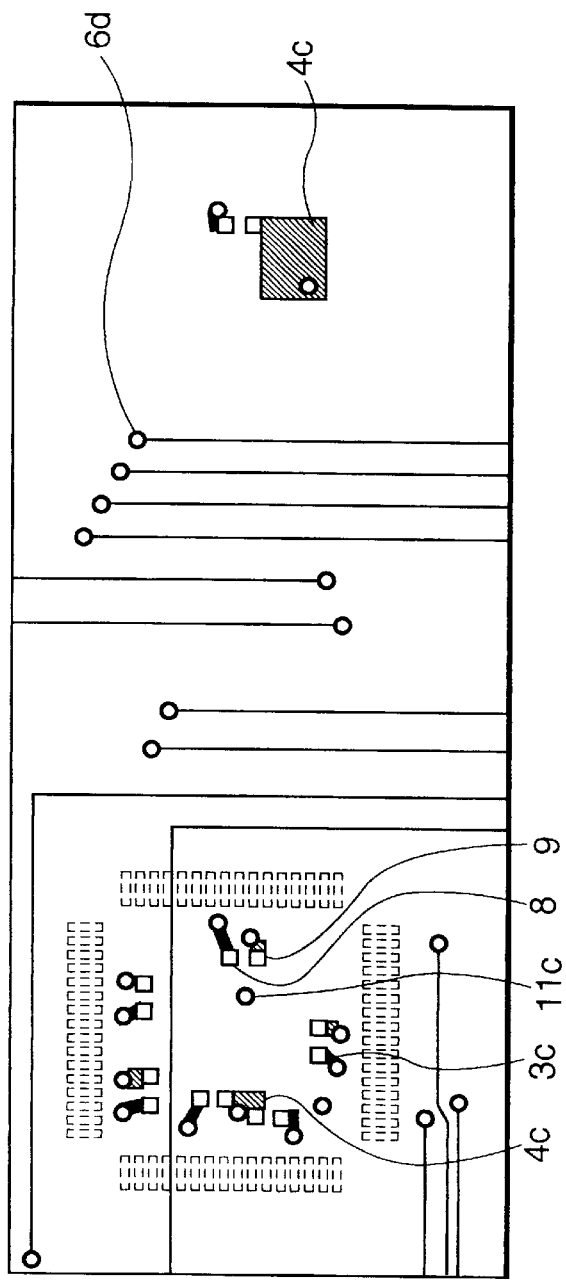
Figures 2A, 2B:
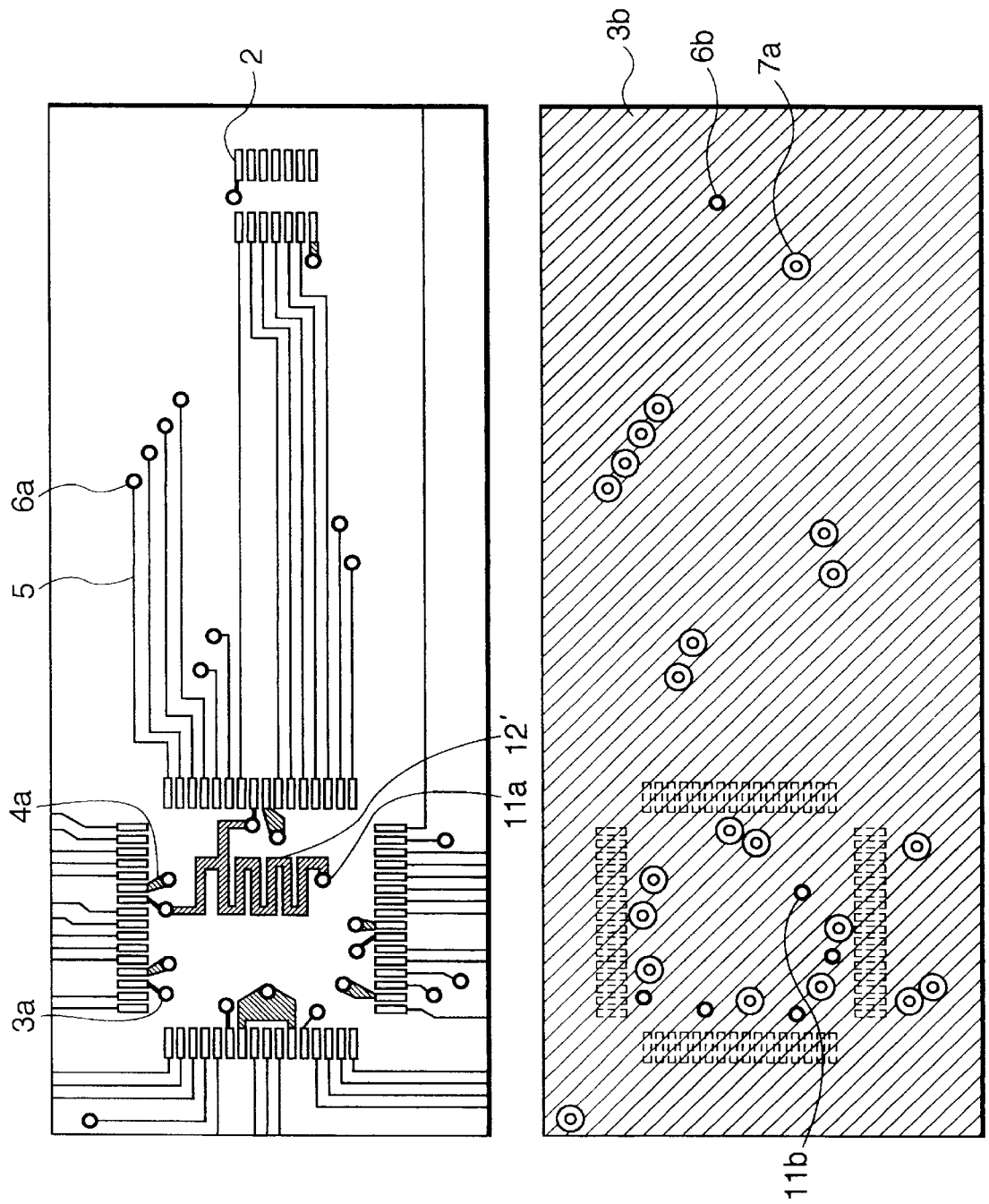
Figure 2C:
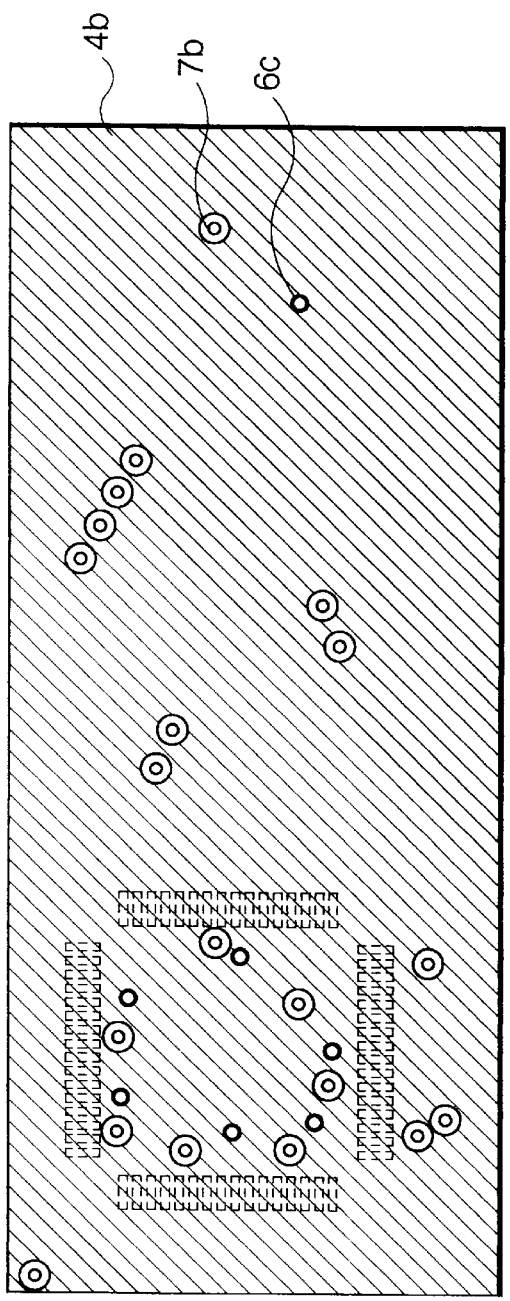
Figure 2D:
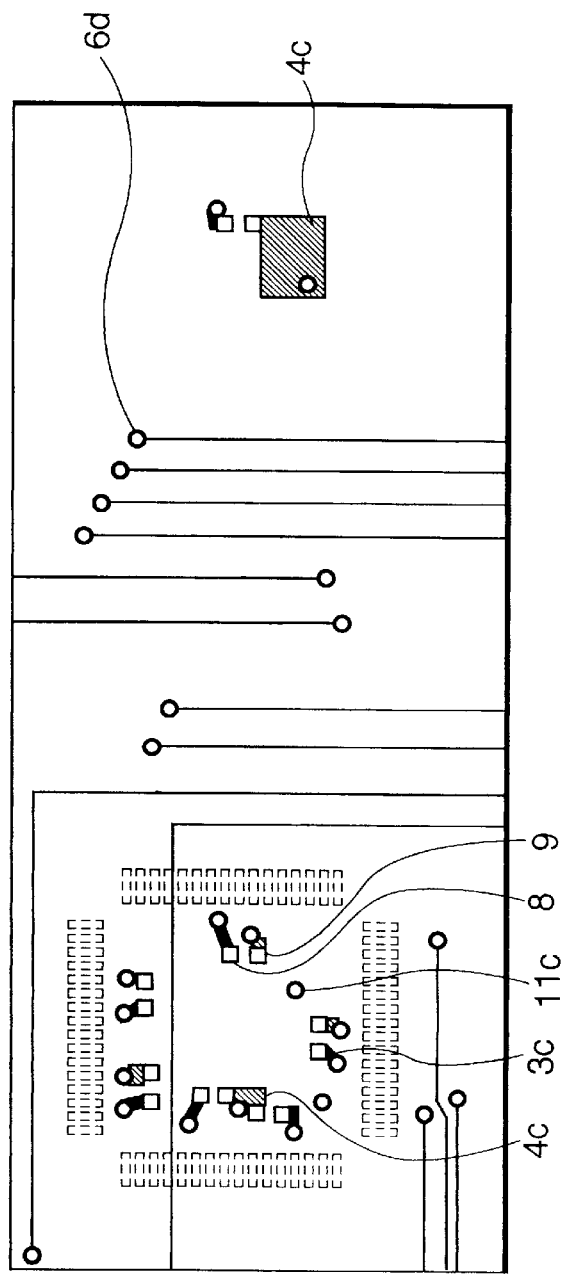

FIGS. 1A to 1D show the first embodiment of a multi-layered printed circuit board according to the present invention, in which FIG. 1A is a plan view of a first layer of the multi-layered printed board, FIG. 1B is a plan view of a second layer of the multi-layered printed board, FIG. 1C is a plan view of a third layer of the multi-layered printed board, and FIG. 1D is a plan view of a fourth layer of the multi-layered printed board. In order to allow easy understanding of the positional relationship among layers, FIGS. 1B to 1D are perspective views, and the positions of LSI mounting lands are indicated by dotted lines in FIGS. 1B to 1D.

A multi-layered printed circuit board of this embodiment is a four-layered printed circuit board on which a QFP as an LSI having a plurality of power supply pins and a plurality of signal pins is to be mounted, and is constituted by four layers, i.e., a first layer (signal layer), a second layer (power supply layer), a third layer (GND layer), and a fourth layer (signal layer).

Note that this layer arrangement is an embodiment of the present invention. For example, the second layer may serve as a GND layer, and the third layer may serve as a power supply layer. Hence, the present invention can be applied to various other layer arrangements. Also, the present invention is not limited to the four-layered printed circuit board.

The structures of the respective layers will be described in detail below.

As shown in FIG. 1A, the first layer is formed with LSI lands 1 on which a QFP LSI is to be mounted, IC lands 2 on which an SOS IC is to be mounted, a power supply pattern 3a (portions indicated by solid lines) connected to power supply lands of these lands 1 and 2, a GND pattern 4a (a light hatched portion), a signal pattern 5, and through hole lands 6a electrically connected to through holes for interlayer connections. The GND pattern 4a is electrically connected to the through hole lands 6a, and is also connected to a GND pattern 4b via through hole lands 6c of the third layer (to be described later), which are connected to the through hole lands 6a via through holes. Also, the first layer is formed with a through hole land 11a which is connected to a through hole land 11b of the second layer via a through hole, and a power supply pattern 13 which is connected to the through hole land 11a via a spiral-shaped inductance pattern 12. The inductance pattern 12 is connected to the power supply pattern 3a via the power supply pattern 13. The power supply pattern 3a is electrically connected to the through hole lands 6a, and is also connected to a power supply pattern connected to a land 8 of the fourth layer via a through hole.

The second layer is formed with a power supply pattern 3b (a dark hatched portion), through hole lands 6b and 11b (bold circles), and clearance holes 7a (double circles). The power supply pattern 3b is electrically connected to the through hole lands 6 b, and is also connected to the power supply pattern 3a connected to the power supply land of the IC lands 2 of the first layer. The through hole land 11b is connected to the through hole land 11a formed on the first layer via a through hole.

As shown in FIG. 1C, the third layer is formed with a GND pattern 4b (a light hatched portion), through hole lands 6c (bold circles), and clearance holes 7b (double circles). In each clearance hole 7b (double circle), a through hole is formed in the outer circle to extend through the third layer, and hence, each clearance hole 7b is not electrically connected to the GND pattern 4b.

As shown in FIG. 1D, the fourth layer is formed with a power supply pattern 3c (portions indicated by solid lines), a GND pattern 4c (a light hatched portion), through hole lands 6d (bold circles), and lands 8 and 9 on which a chip type bypass capacitor is to be mounted. The power supply pattern 3c is connected to the power supply pattern 3a of the first layer via through holes, and the power supply pattern 3a is electrically connected to the land 8. The land 9 is connected to a land, which is connected to the GND pattern 4a of the first layer via a through hole, of the through hole lands 6b via the GND pattern 4c.

In the multi-layered printed circuit board constituted by the first to fourth layers, since the inductance pattern 12 as a countermeasure against radiation noise is formed inside the lands of the first layer on which the LSI is to be mounted, the countermeasure against noise can be taken without disturbing high-density packaging.

The power supply pattern is a portion of the route of a high-level, high-frequency power supply, and is a portion of a radiation noise source. The inductance pattern 12 is effective for a countermeasure against noise since it is disposed in the vicinity of the power supply pin and can shorten the power supply pattern 13 decoupled from the power supply pattern 3b of the second layer.

FIGS. 2A to 2D show another example of the multi-layered printed circuit board in which the inductance pattern shown in FIGS. 1A to 1D is modified to have a parallel shape. In the multi-layered printed circuit board shown in FIGS. 2A to 2D, an inductance pattern 12' formed on the first layer has a parallel shape, and is connected to only two out of six power supply pins of the LSI. The inductance pattern 12' is connected to the through hole land 11b of the second layer via the through hole land 11a and a through hole. The remaining four power supply pins of the LSI are connected to the through hole lands of the second layer via the power supply pattern 3a and through holes.

The above-mentioned arrangement is particularly effective for a case wherein a countermeasure against noise is taken in the vicinity of signal pins that output a high-speed signal.

FIGS. 3A to 3D show the second embodiment of a multi-layered printed circuit board according to the present invention. In the multi-layered printed circuit board of the second embodiment, the inductance pattern shown in FIGS. 1A to 2D is disposed in the vicinity of the power supply pins. When such arrangement is formed on the fourth layer, radiation noise can be effectively prevented.

In the multi-layered printed circuit board shown in FIGS. 3A to 3D, a parallel-shaped inductance pattern 22 is formed on the fourth layer, and six power supply pins of an LSI are connected to a power supply pattern 23 on the fourth layer. The power supply pattern and a power supply pattern 3b of the second layer are connected to each other via the inductance pattern 22.

The inductance pattern 22 and the power supply pattern 3b of the second layer are connected to each other in such a manner that a through hole land 11c formed on one end of the inductance pattern 22 and a through hole land 11b formed on the power supply pattern 3b of the second layer are electrically connected via a through hole. With this arrangement, an inductance of several nH to several ten nH is obtained by the inductance pattern 22 between the power supply pattern 23 and the power supply pattern 3b of the first layer, thus suppressing radiation noise caused by the power supply pattern and assuring the route of a return current of a signal.

Figure 3C:
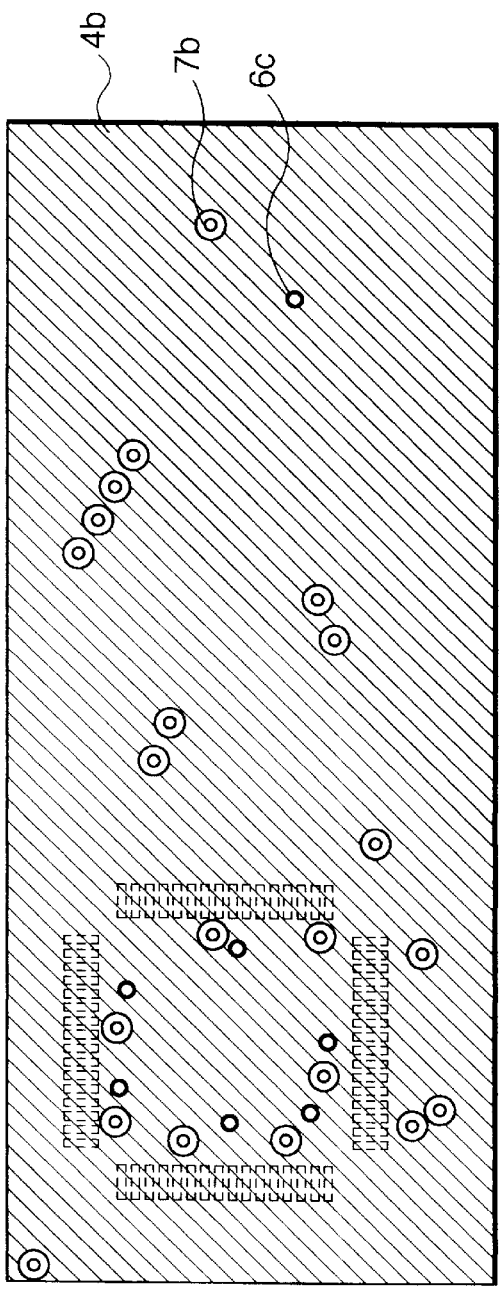
Figure 3D:
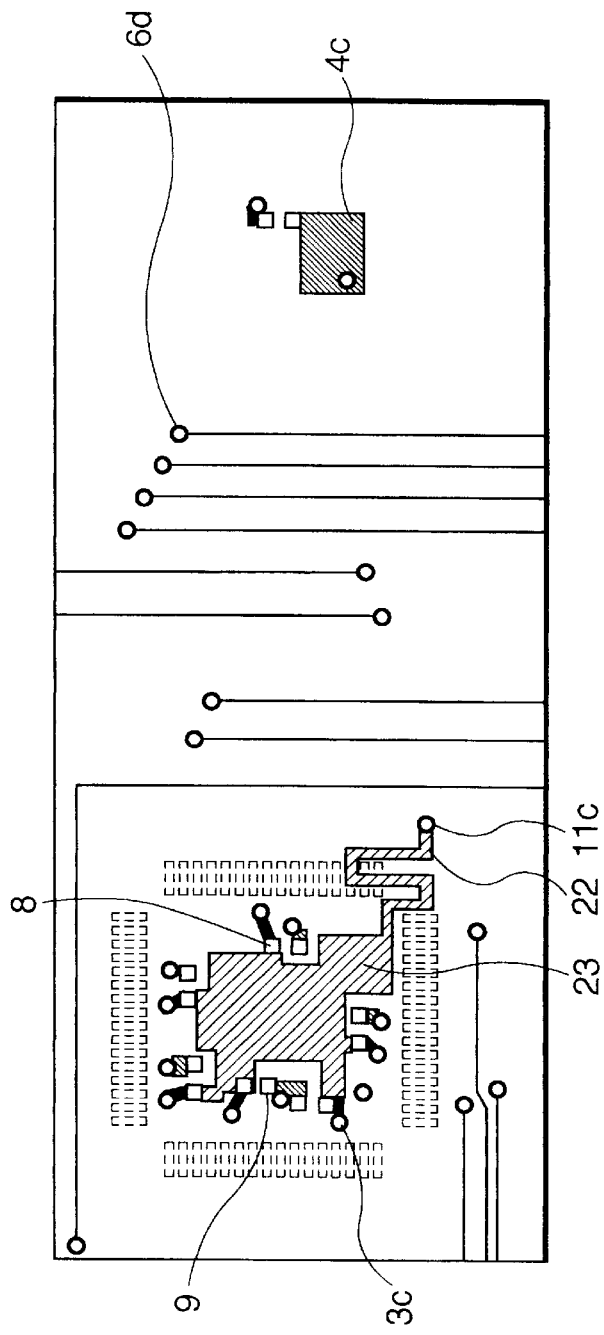
Figure 4C:
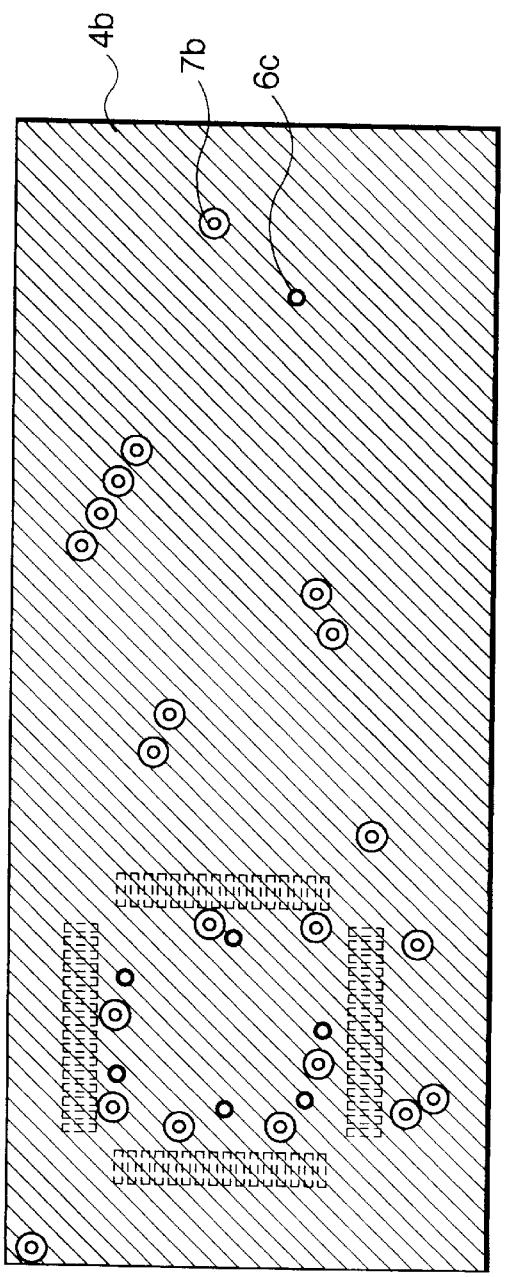
Figure 4D:
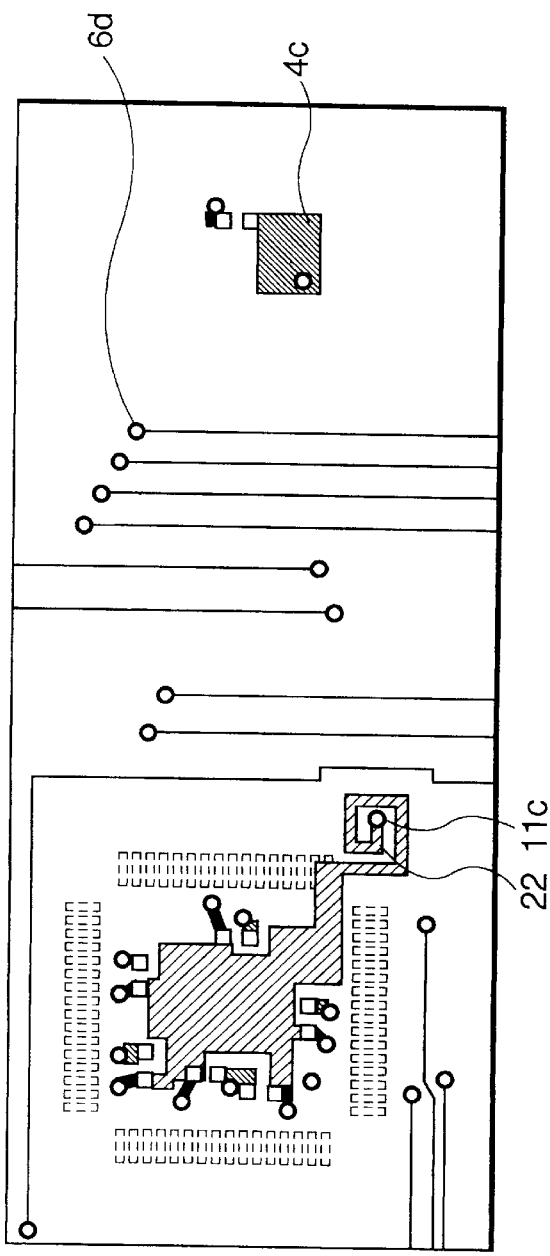

Note that the shape of the inductance pattern 22 is not limited to that shown in FIG. 3D. For example, the inductance pattern may have a spiral shape, as shown in FIG. 4D. When the inductance pattern has a spiral shape, a high inductance value can be obtained generally.

The arrangement for connecting the power supply pattern 23 and the power supply pattern 3b of the second layer via the inductance pattern 22 can be variously modified in correspondence with specific design purposes. Some examples will be explained below as the third embodiment of a multi-layered printed circuit board according to the present invention with reference to FIGS. 5A to 7D.

In FIGS. 5A to 5D, a through hole land 11b' is formed on the second layer in addition to the through hole land 11b, and a through hole land 11c', which is connected to the through hole land 11b' via a through hole, is formed on the fourth layer. The through hole land 11c' is connected to the power supply pattern 23 via a parallel-shaped inductance pattern 22'. More specifically, the power supply pattern 23 and the power supply pattern 3b of the second layer are connected via the inductance patterns 22 and 22' at two positions. Since a plurality of inductances (inductance patterns 22 and 22') are formed, two current routes can be assured, and such arrangement can be applied to an LSI that consumes relatively large electric power.

Figure 5A:
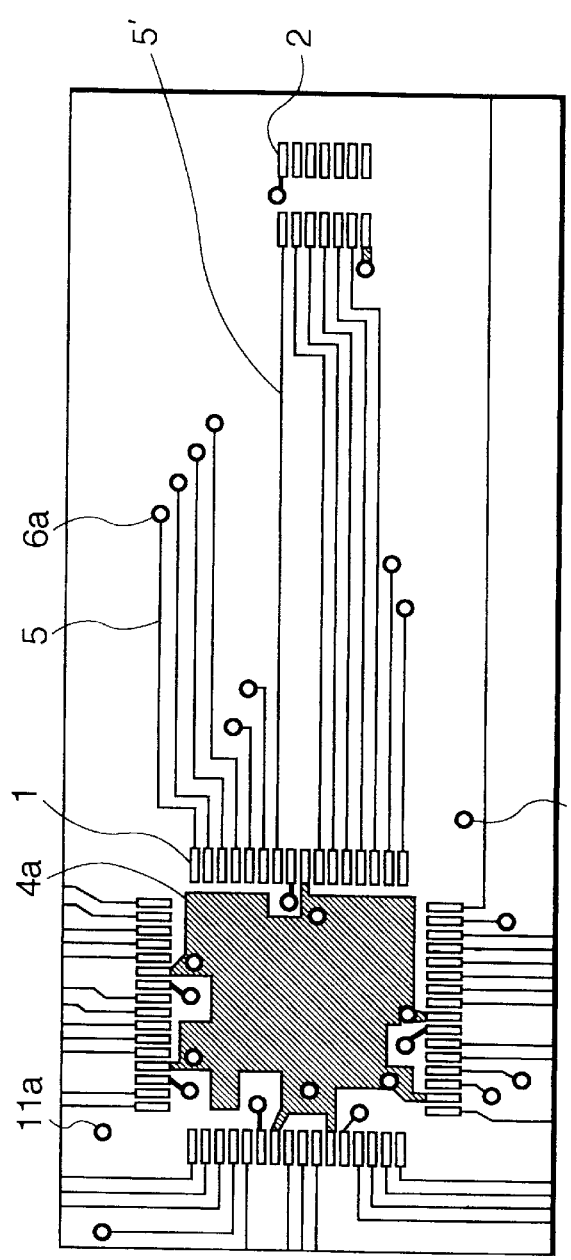
Figure 5B:
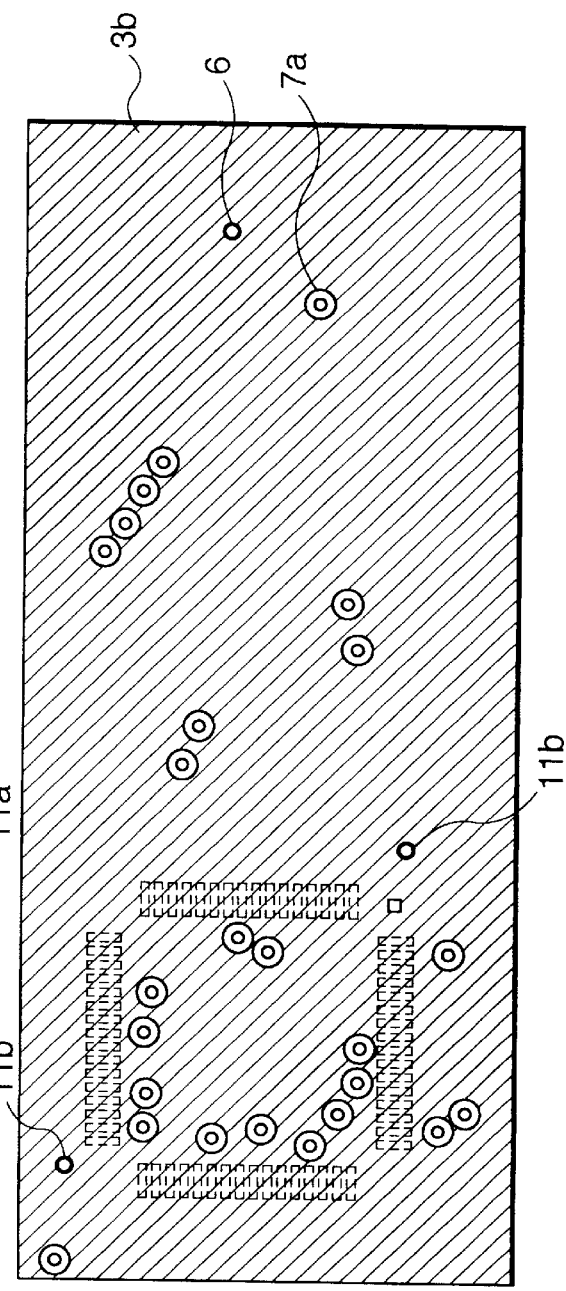
Figure 5C:
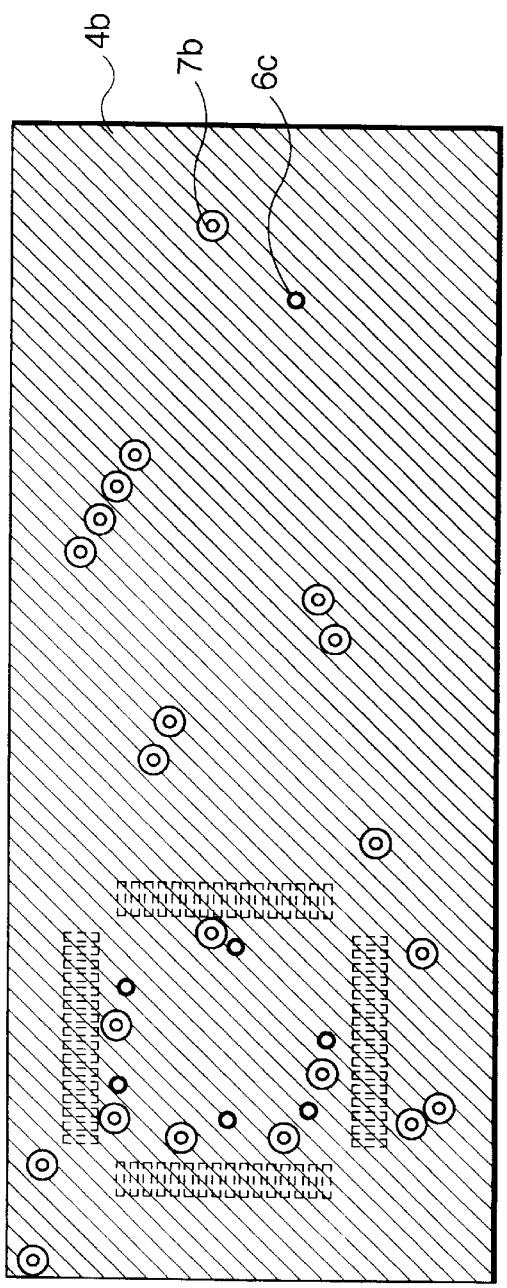
Figure 5D:
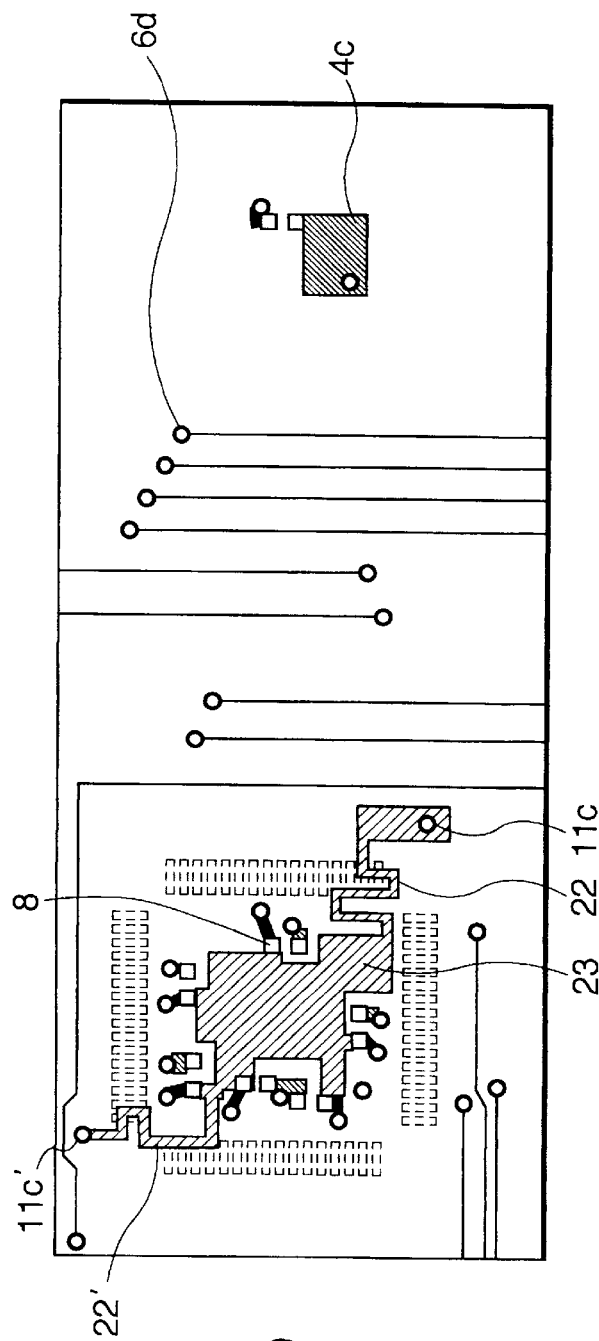
Figure 6A:
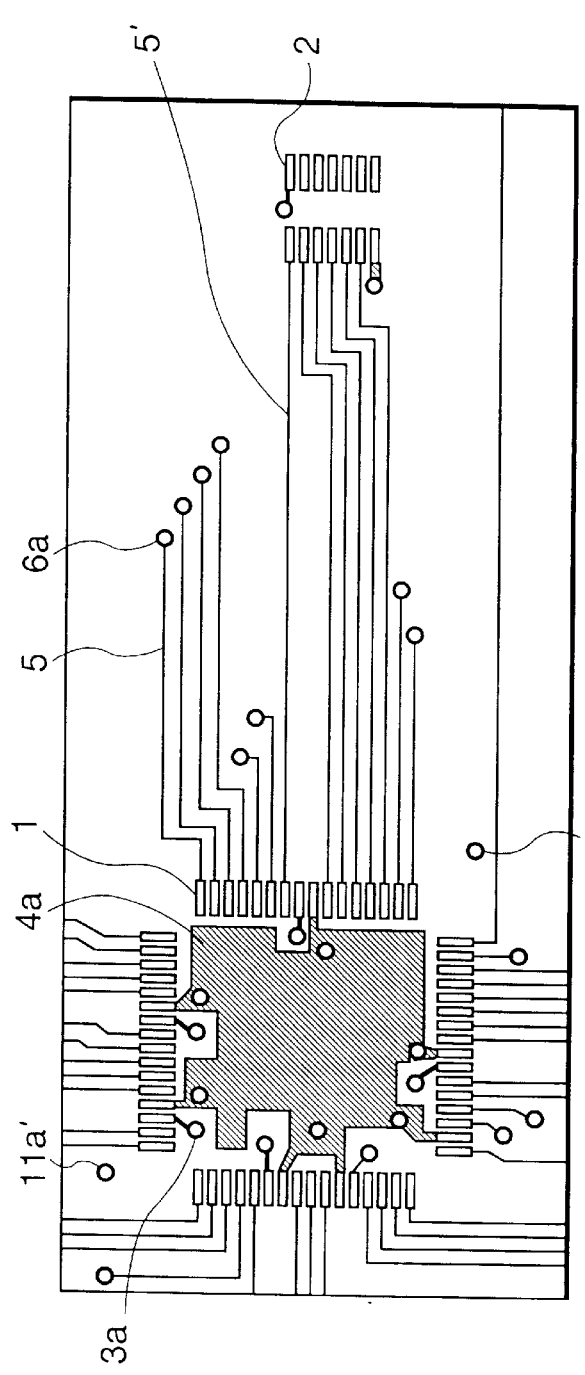
Figure 6B:
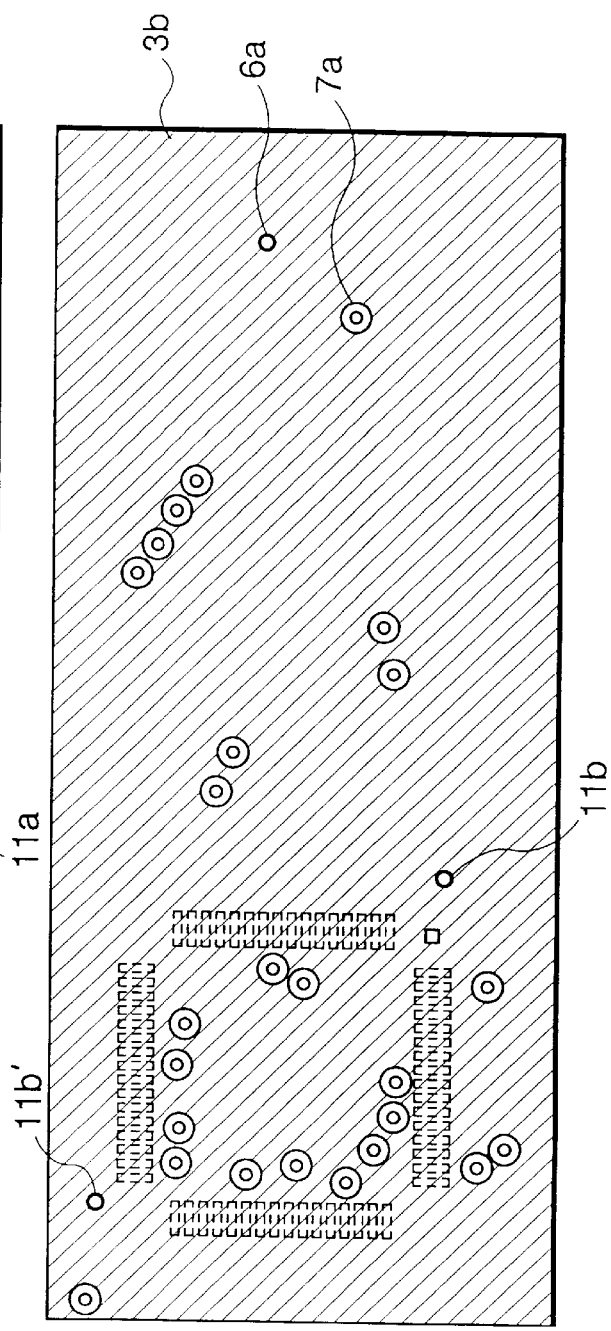
Figure 7A:
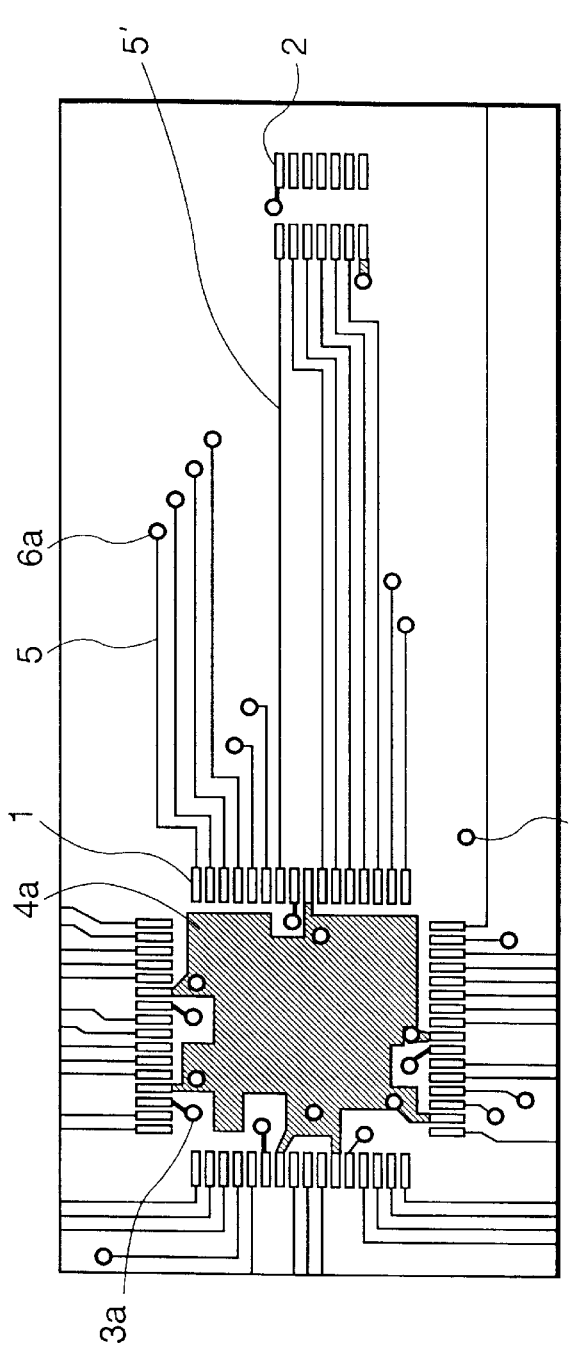
Figure 7B:
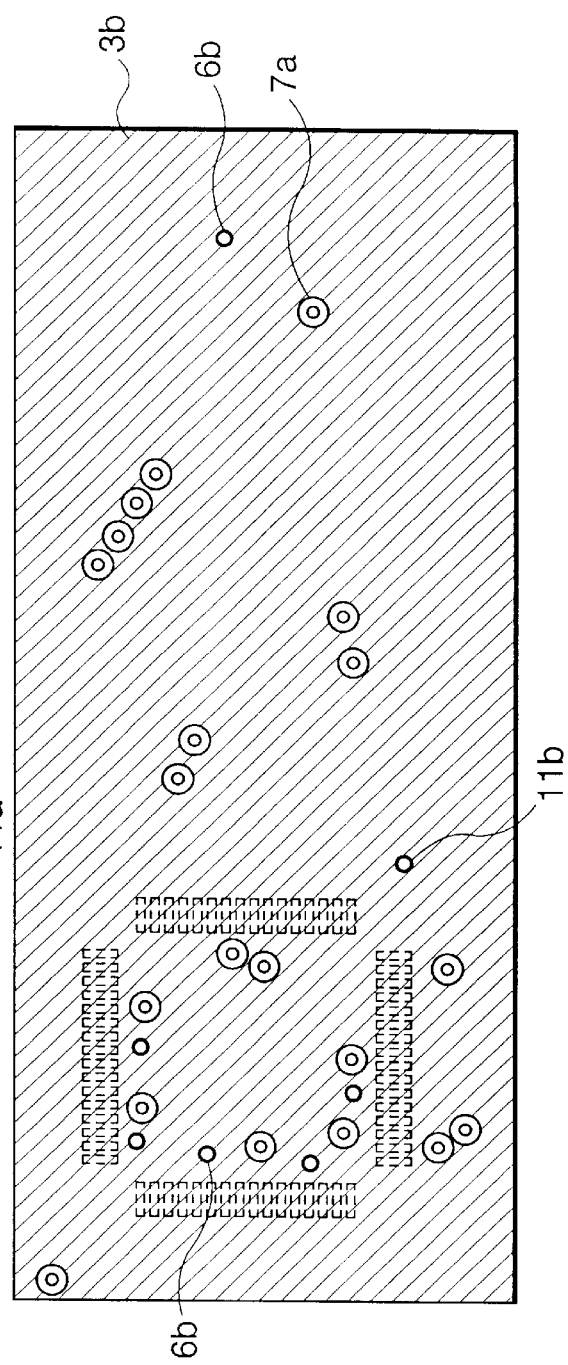
Figure 7C:
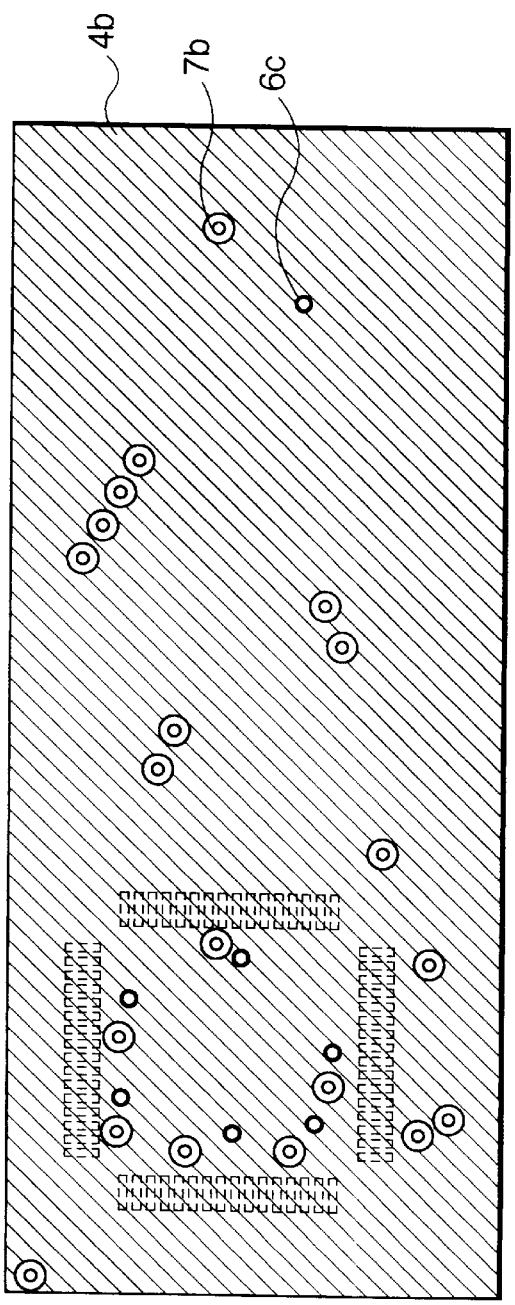
Figure 7D:
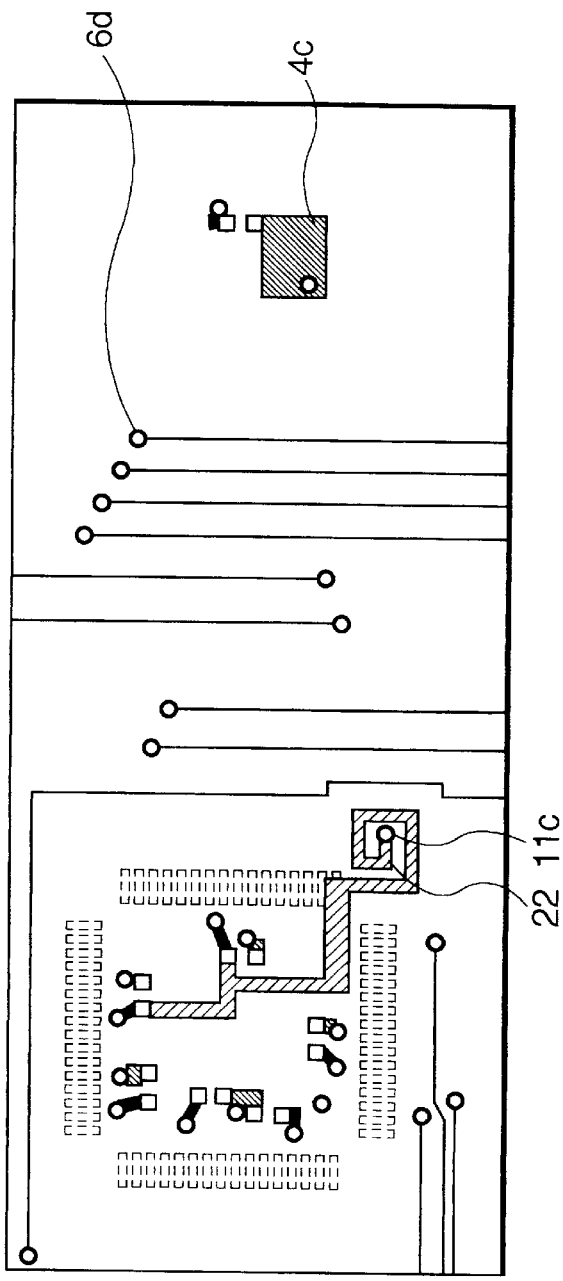
Figure 8A:
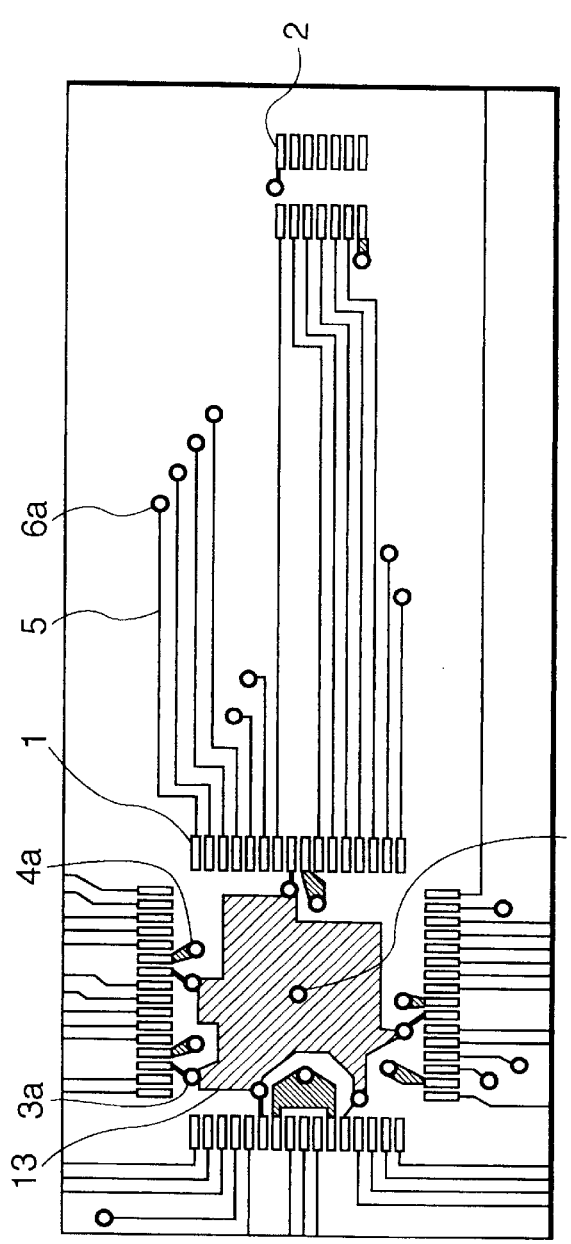
Figure 8B:
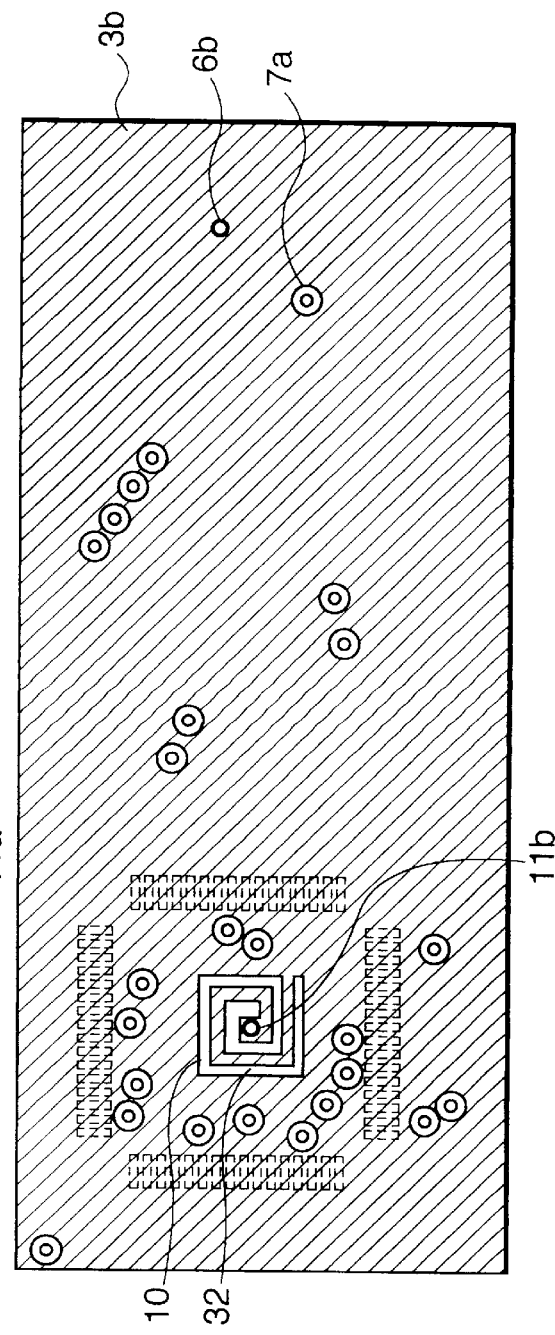
Figure 8C:
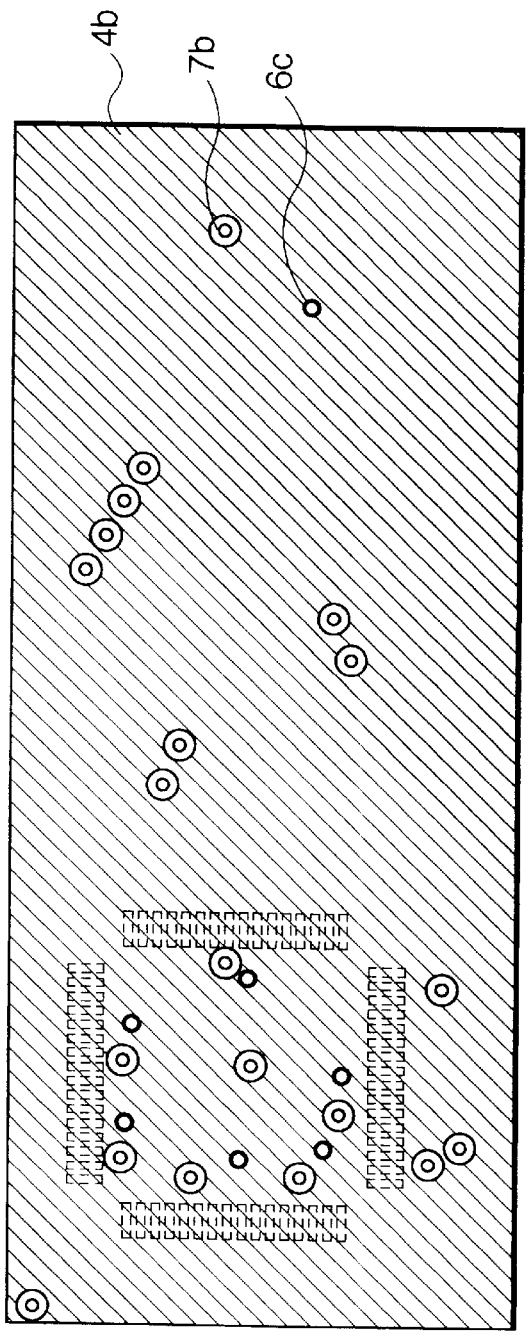
Figure 8D:
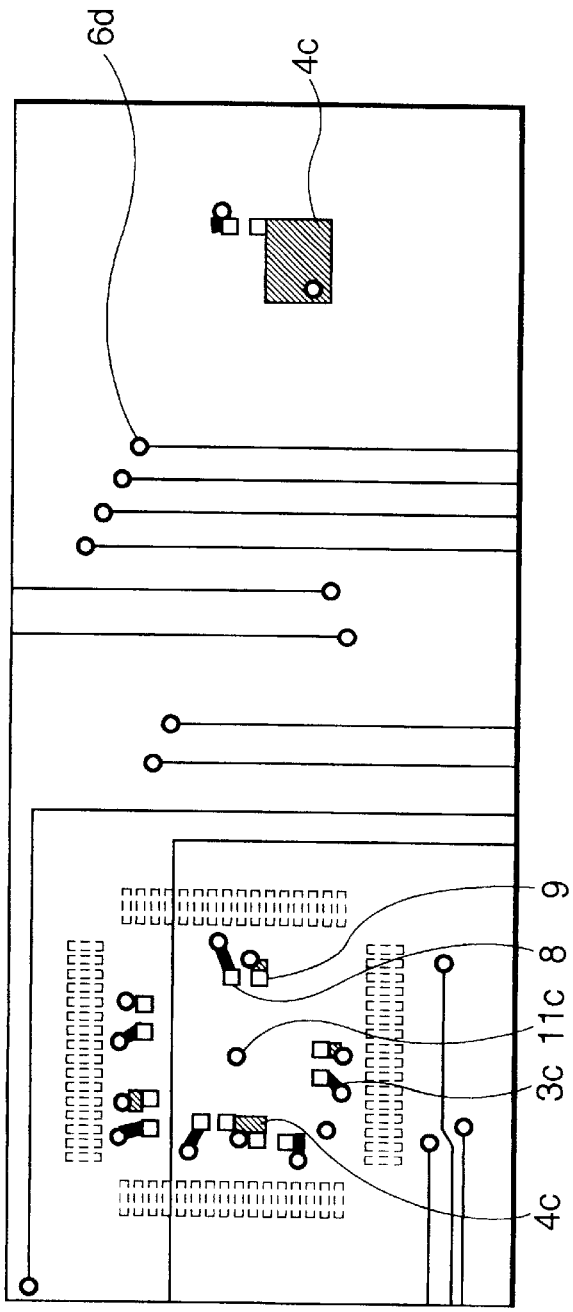

In FIGS. 6A to 6D, the power supply pattern 23 shown in FIG. 5D is divided into two blocks, i.e., power supply patterns 23a and 23b, and these blocks are connected to the power supply pattern 3b via the inductance patterns 22 and 22', respectively. With this arrangement, the inductance values can be set in correspondence with the power supply pins of an LSI, thus improving the degree of freedom in design.

In FIGS. 7A to 7D, a parallel-shaped inductance pattern 22 is formed on the fourth layer, and only two (those serving as radiation noise generation sources) out of six power supply pins of an LSI are connected to the power supply pattern 3b of the second layer via the inductance pattern 22. Other power supply pins are connected to the power supply pattern 3a of the first layer. Such arrangement is particularly effective for a case wherein a noise countermeasure is taken for only power supply pins in the vicinity of signal pins that output a high-speed signal, and no inductance need be formed for other power supply pins, thus further improving the degree of freedom in design.

Note that the arrangements shown in FIGS. 5A to 7D can be applied to the board shown in FIGS. 1A to 1D.

FIGS. 8A to 8D show the fourth embodiment of a multi-layered printed circuit board according to the present invention. In the multi-layered printed circuit board of the fourth embodiment, a spiral-shaped inductance pattern 32 is formed on a power supply pattern 3b of the second layer. The inductance pattern 32 is formed on a notched portion (notched portion 10) of the power supply pattern 3b. One end of the pattern 32 is contiguous with the power supply pattern 3b, and the other end is formed with a through hole land 11b. The through hole land 11b is connected to a power supply pattern 13 via a through hole. In this embodiment, the power supply pattern 3b of the second layer and a power supply pattern 3a of the first layer are electrically connected via the inductance pattern 32.

With this arrangement as well, the inductance pattern can be disposed at a position in the vicinity of the power supply pins, i.e., at a position where a high noise reduction effect is assured, and radiation noise can be effectively prevented as in the first to third embodiments described above.

Figure 9A:
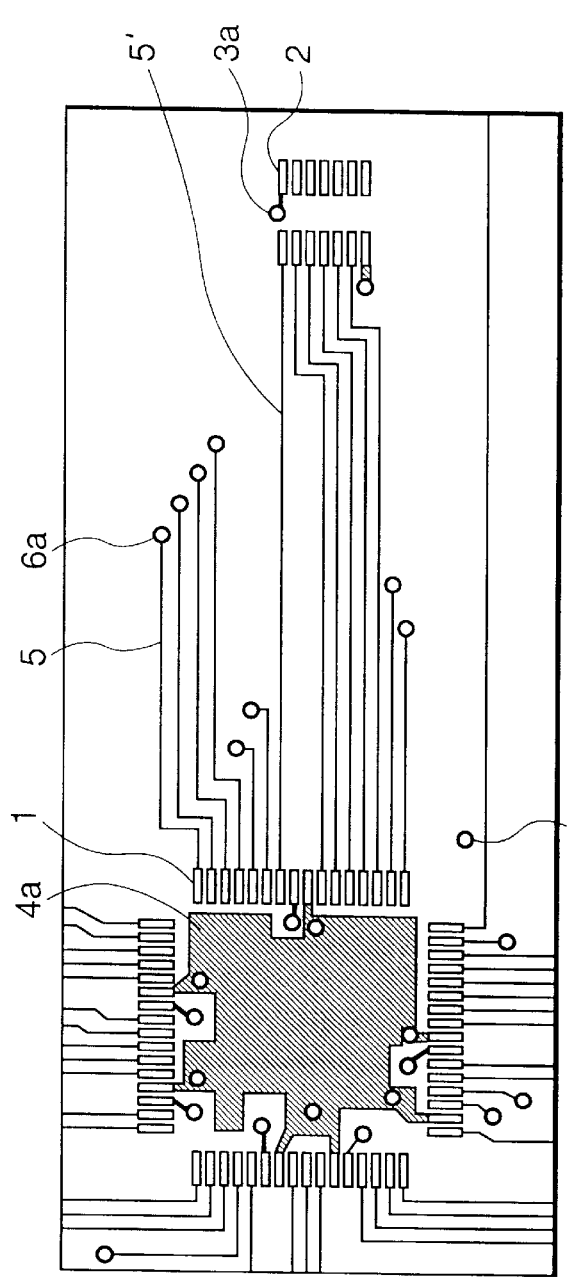
Figure 9B:
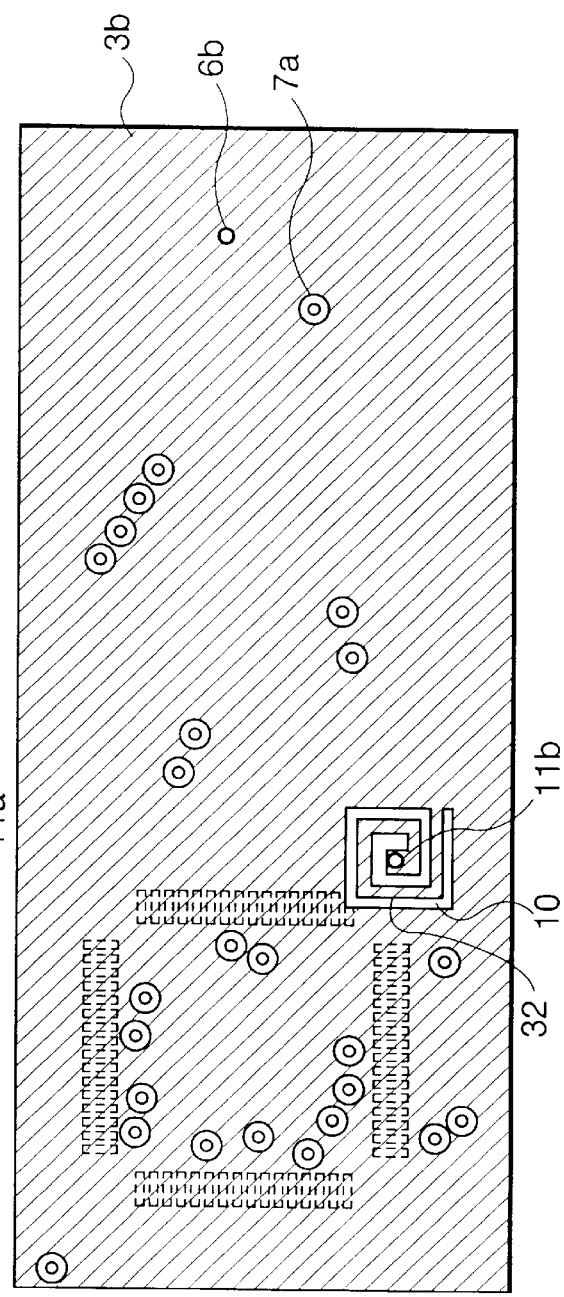

In this embodiment, the power supply pins of an LSI are electrically connected to the power supply pattern 3b of the second layer via the inductance pattern 32. Alternatively, the power supply pins of the LSI may be connected to a power supply pattern 23 on the fourth layer, and the power supply pattern 23 may be connected to the power supply pattern 3b of the second layer via the inductance pattern 32, as shown in FIG. 9. With this arrangement as well, radiation noise can be effectively suppressed, and the route of a return current of a signal can be assured.

On the other hand, a space of a portion of the third layer (GND layer) may be removed, and an inductance pattern may be formed by utilizing the space.

FIGS. 10A to 10D show the fifth embodiment of a multi-layered printed circuit board according to the present invention. In the multi-layered printed circuit board of the fifth embodiment, a notched portion 10 is formed on a power supply pattern 3b of the second layer to surround through hole lands (bold circles) connected to power supply pins of LSI lands 1 so as to form a power supply pattern 43. The power supply pattern 43 is connected to the power supply pattern 3b via parallel-shaped inductance patterns 42 and 42'.

With the above-mentioned arrangement as well, inductances can be formed along wiring routes that supply a power supply voltage from the power supply pattern to the power supply pins of an LSI, thus effectively preventing radiation noise. Furthermore, since no power supply pattern connected with the power supply pins of the LSI need be formed on the first layer or the fourth layer (signal layer), the arrangement of this embodiment is advantageous for higher-density packaging.

Figure 10A:
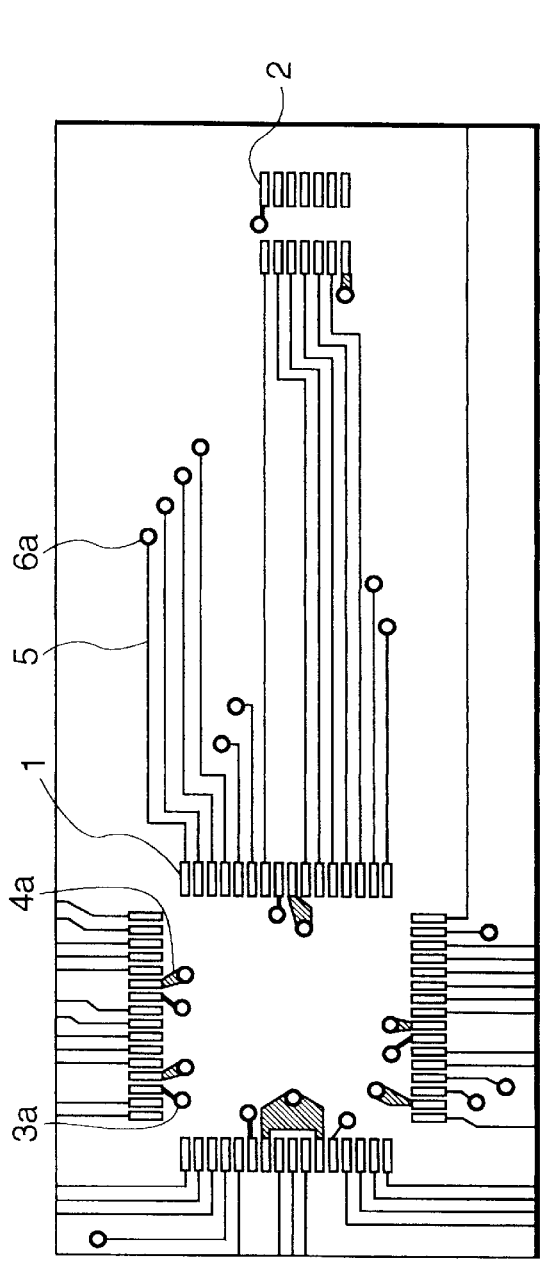
Figure 10B:
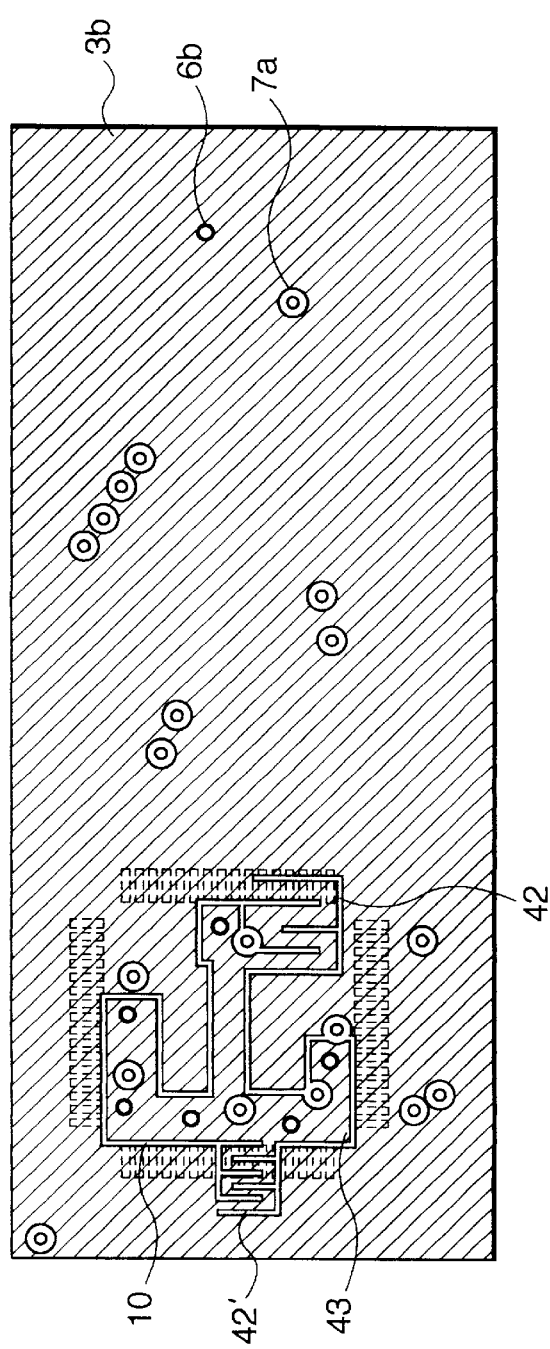
Figure 10C:
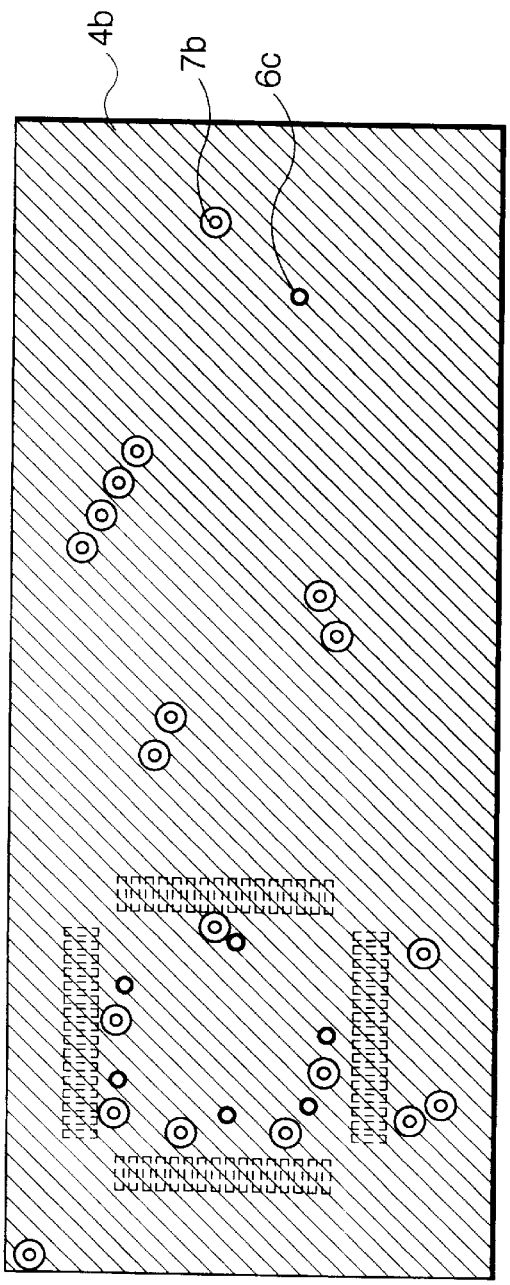
Figure 10D:
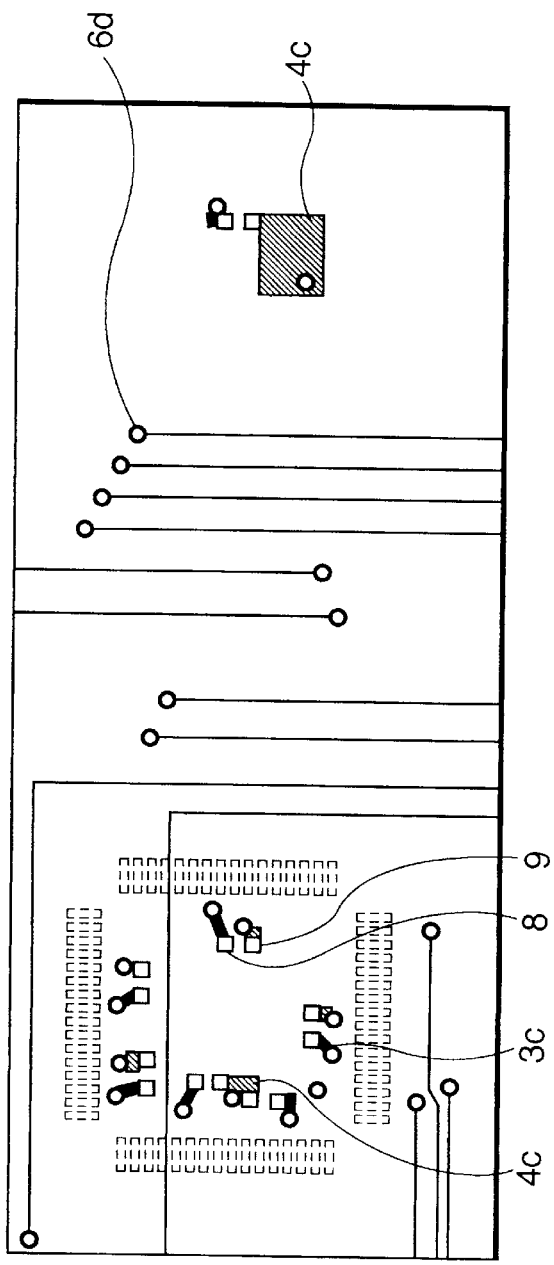

Note that the notched portion 10 formed on the power supply pattern 3b of the second layer is not limited to the shape shown in FIG. 10B. That is, inductances need only be formed between a portion inside the notched portion 10 and the power supply pattern 3b outside the portion 10, and the notched portion 10 may have various shapes in correspondence with specific use conditions. FIGS. 11A to 11D show examples of the shape of the notched portion 10 when inductances are formed between the notched portion 10 and the power supply pattern of the second layer.

Figure 11A:
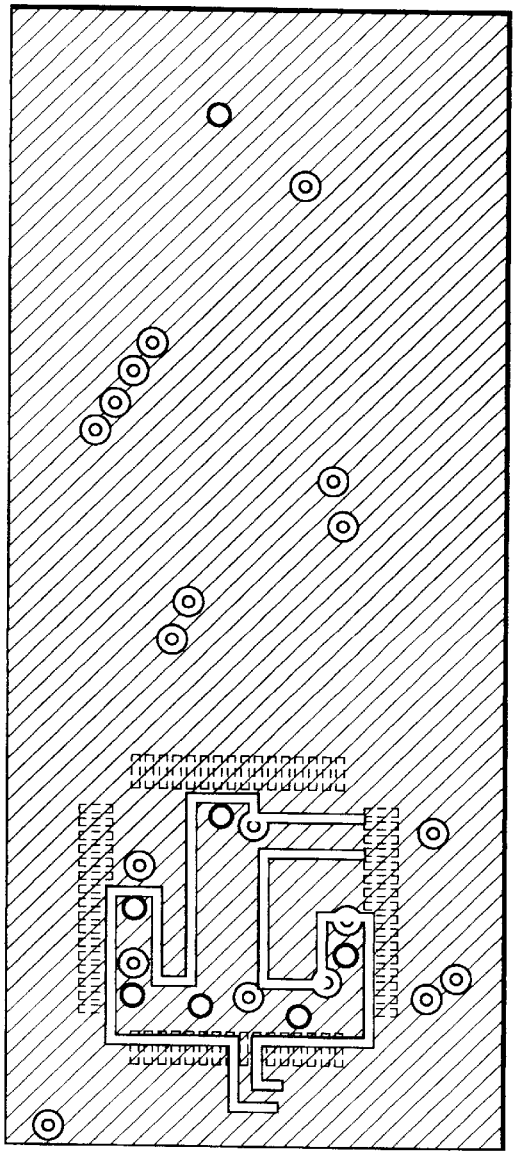

In FIG. 11A, the notched portion 10 is formed along an array of through hole lands connected to the power supply pins of the LSI to surround these lands, as in FIG. 10B. In this case, a portion inside the notched portion and the power supply pattern 3b outside the notched portion are connected via a linear pattern.

Figure 11B:
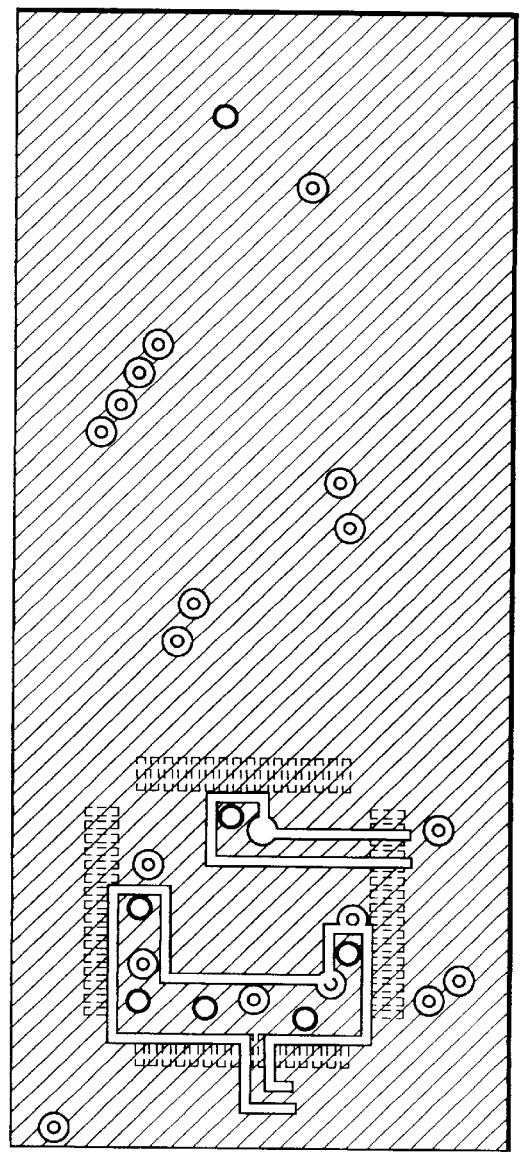

In FIG. 11B, the through hole lands connected to the power supply pins of the LSI are divided into two blocks, and the notched portion is formed to surround these lands in units of blocks. In addition, a portion inside the notched portion and the power supply pattern 3b outside the notched portion are connected via a linear pattern (which may be replaced by a parallel-shaped pattern). With this arrangement, the inductance values can be set in correspondence with the power supply pins of the LSI, thus improving the degree of freedom in design. In the case of a parallel-shaped inductance pattern, the inductance can be adjusted by adjusting the number of turns of a pattern formed into the parallel shape, and the degree of freedom in design can be improved.

Figure 11C:
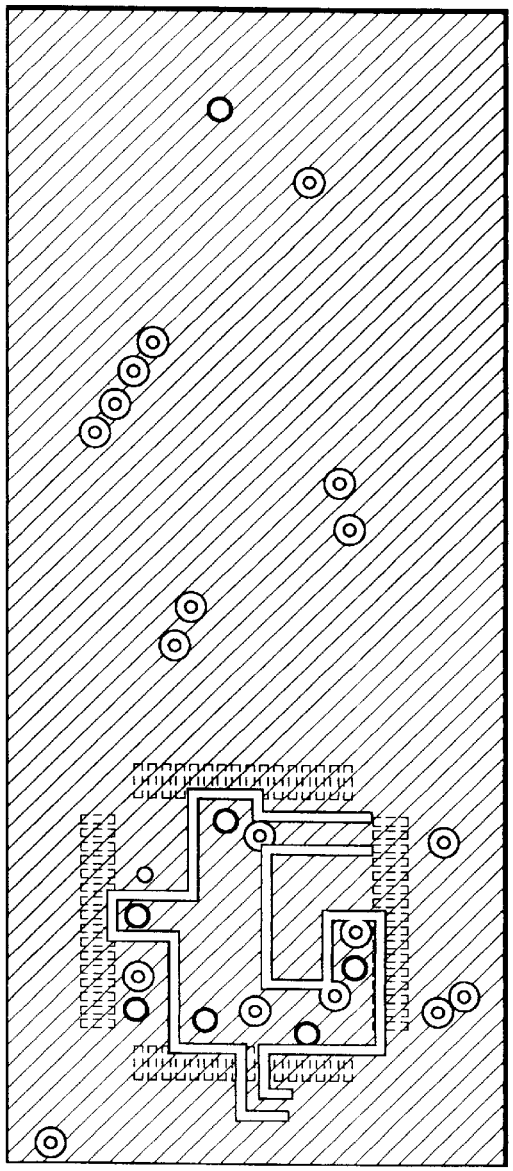
Figure 11D:
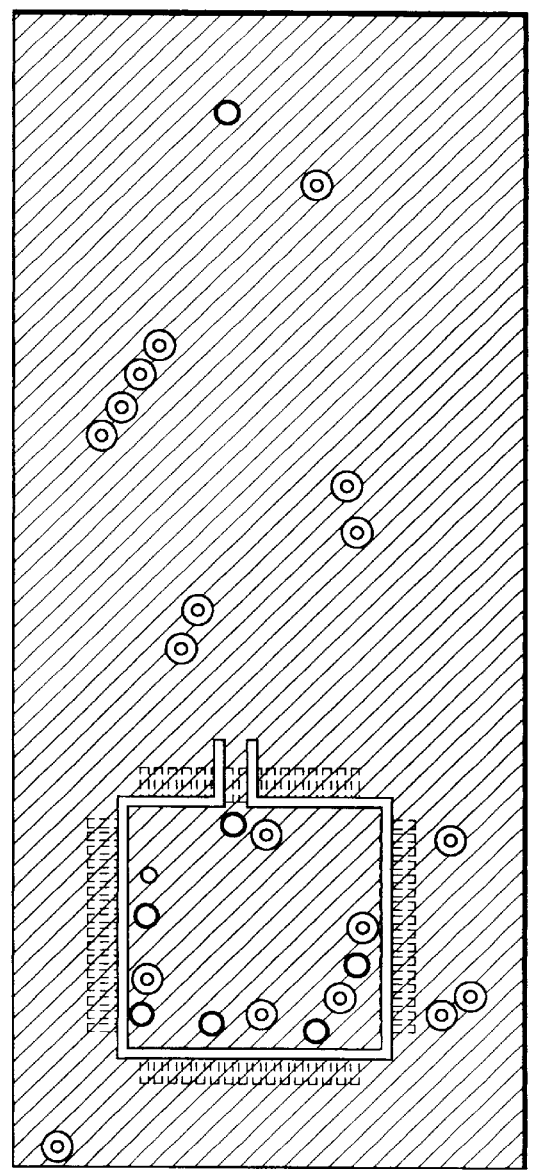
Figure 12C:
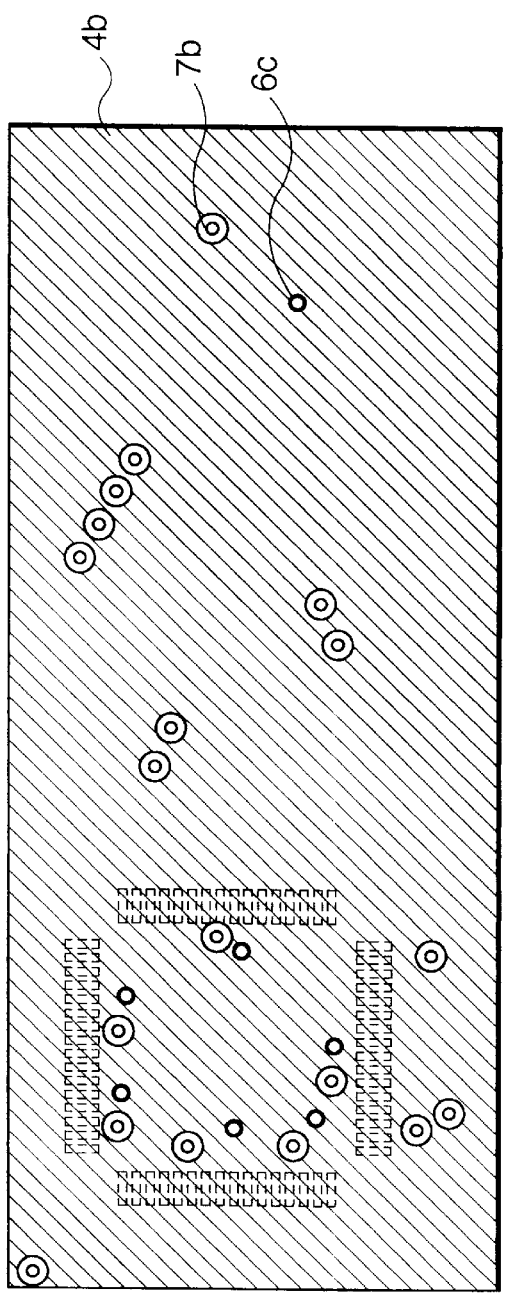
Figure 12D:
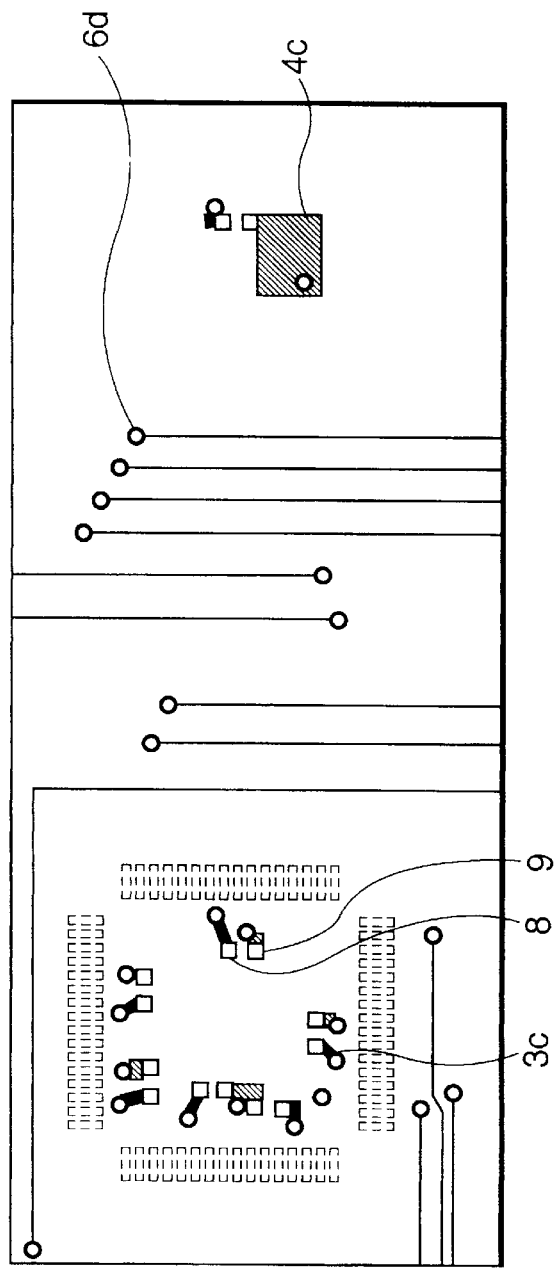
Figure 13A:
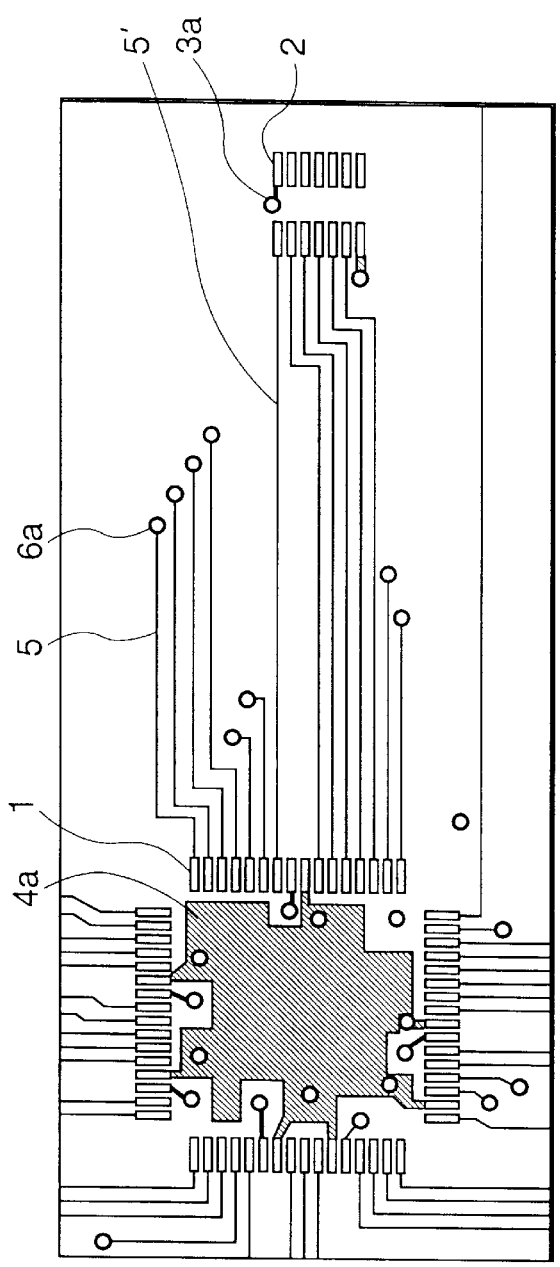
Figure 13B:
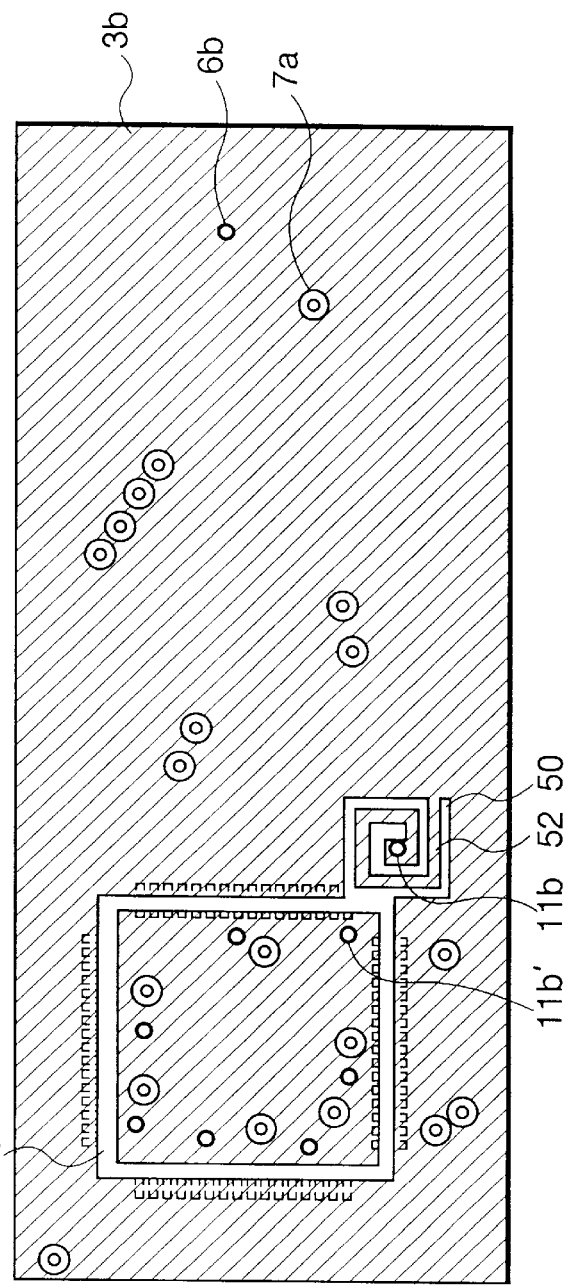
Figure 13C:
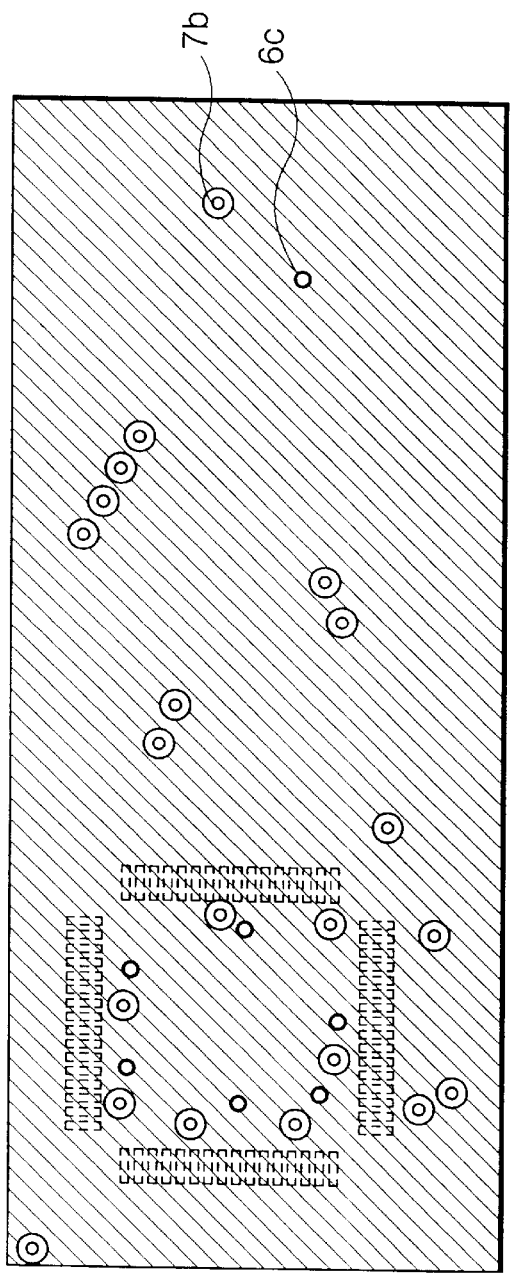
Figure 13D:
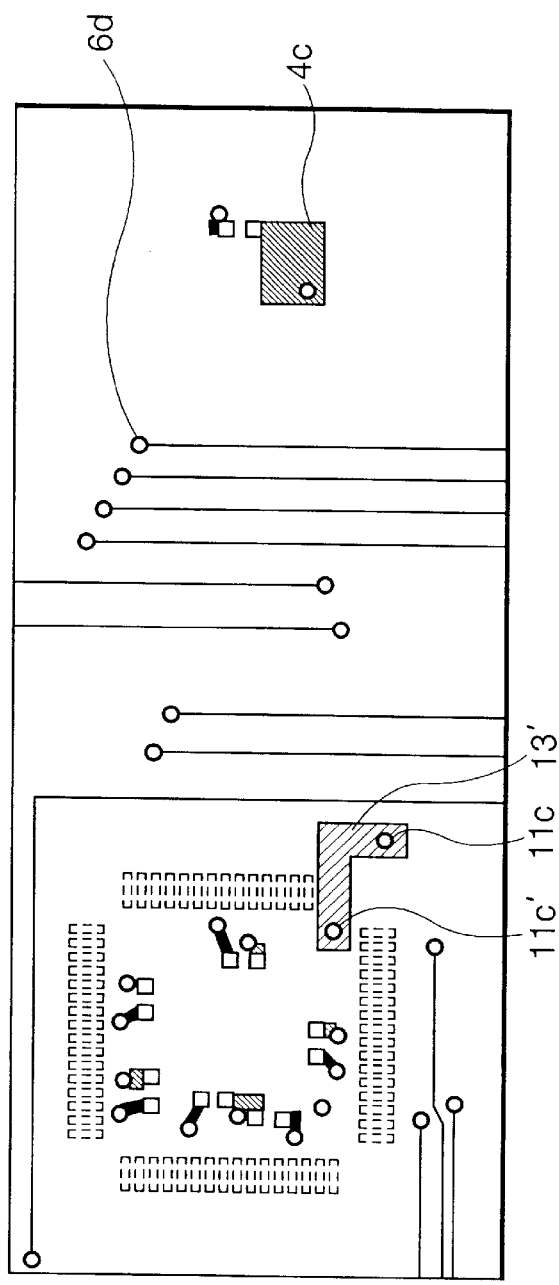
Figure 14C:
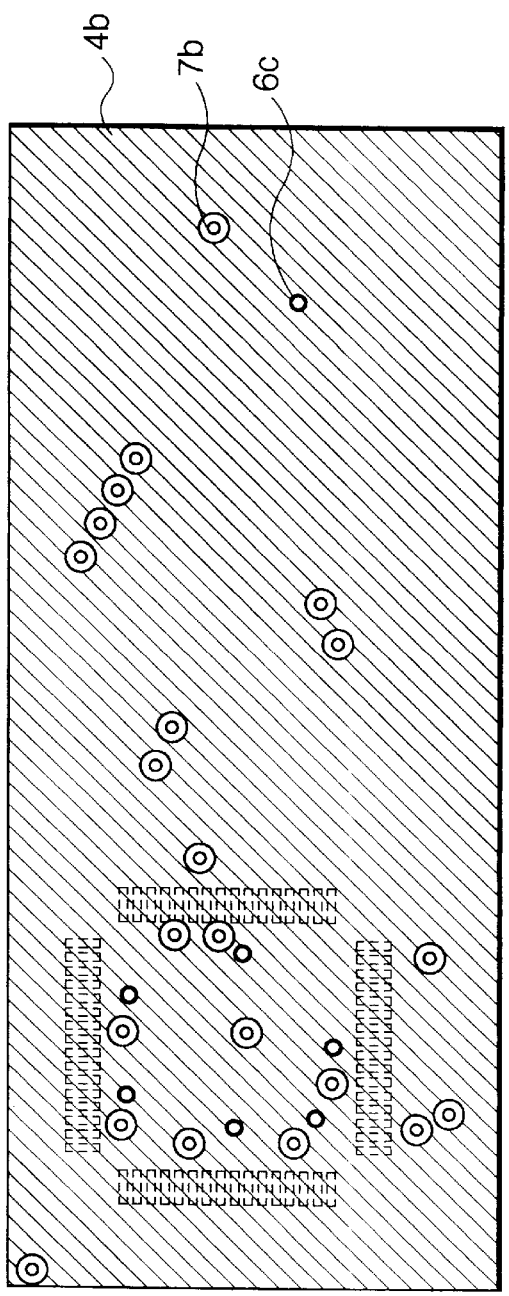
Figure 14D:
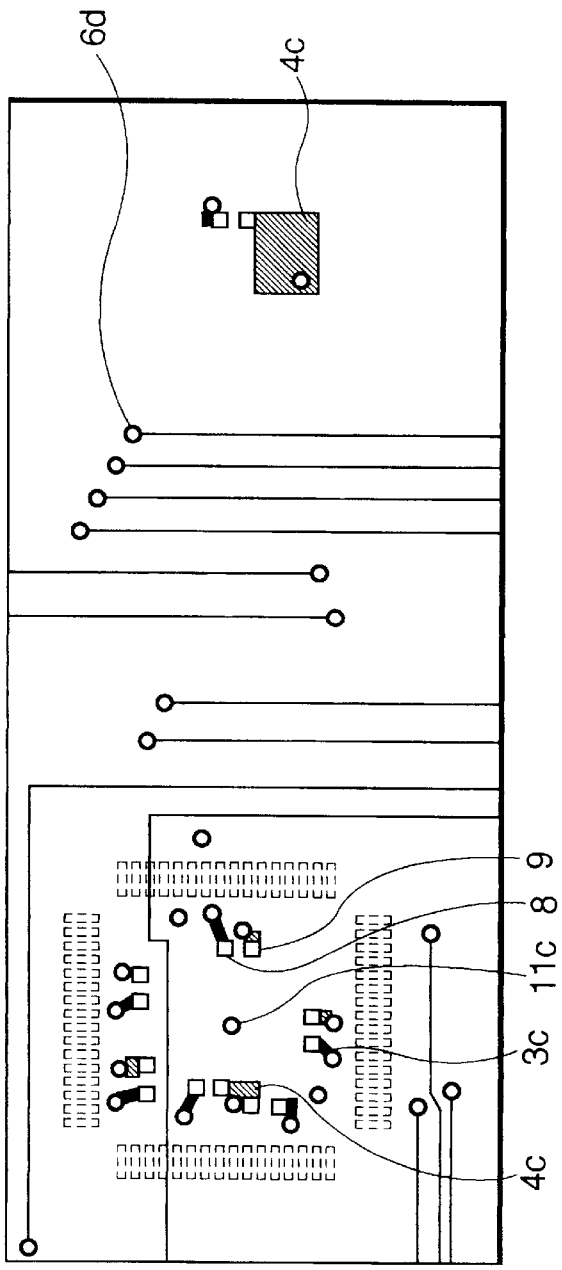
Figures 16A, 16B:
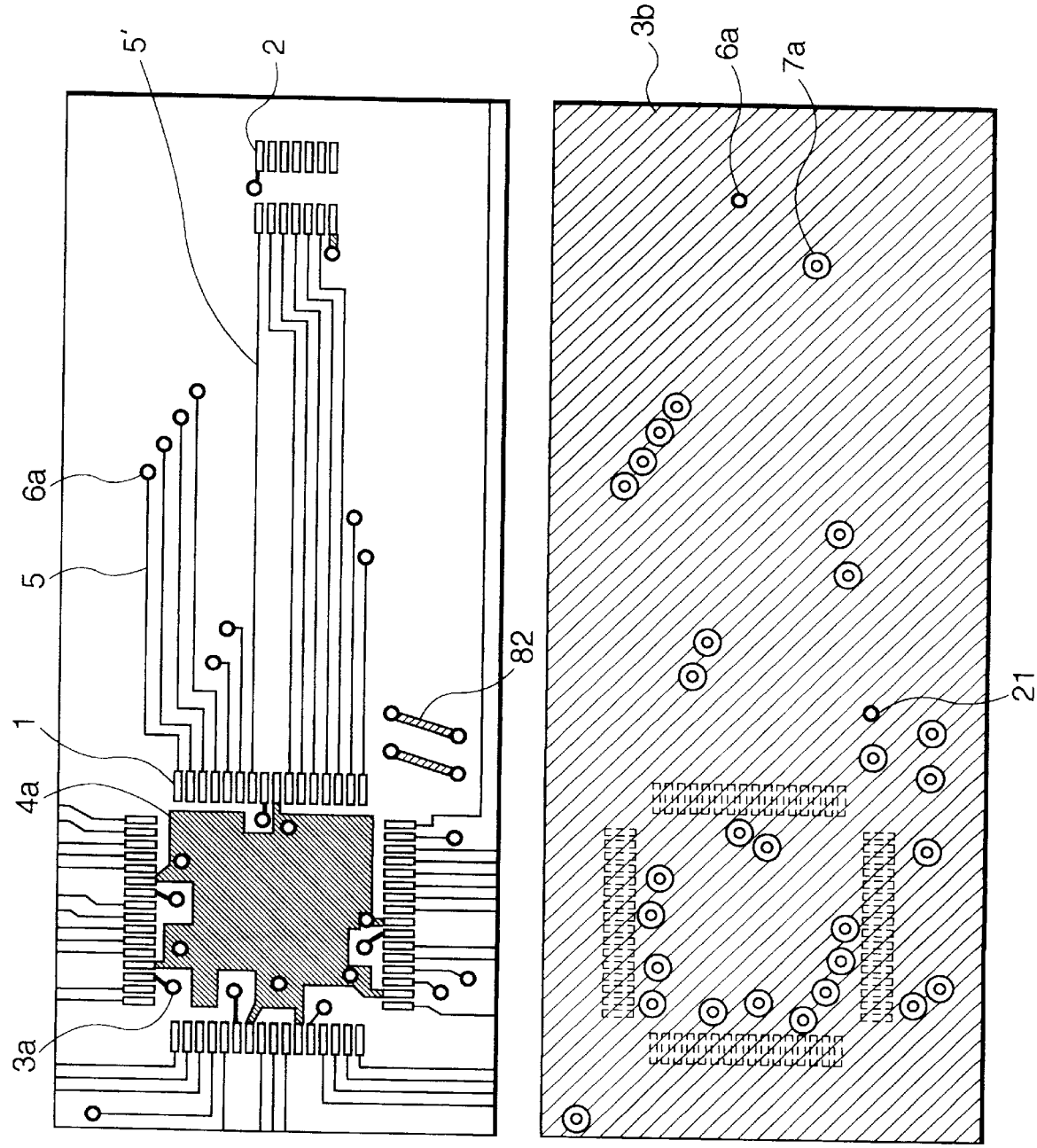
Figure 16C:
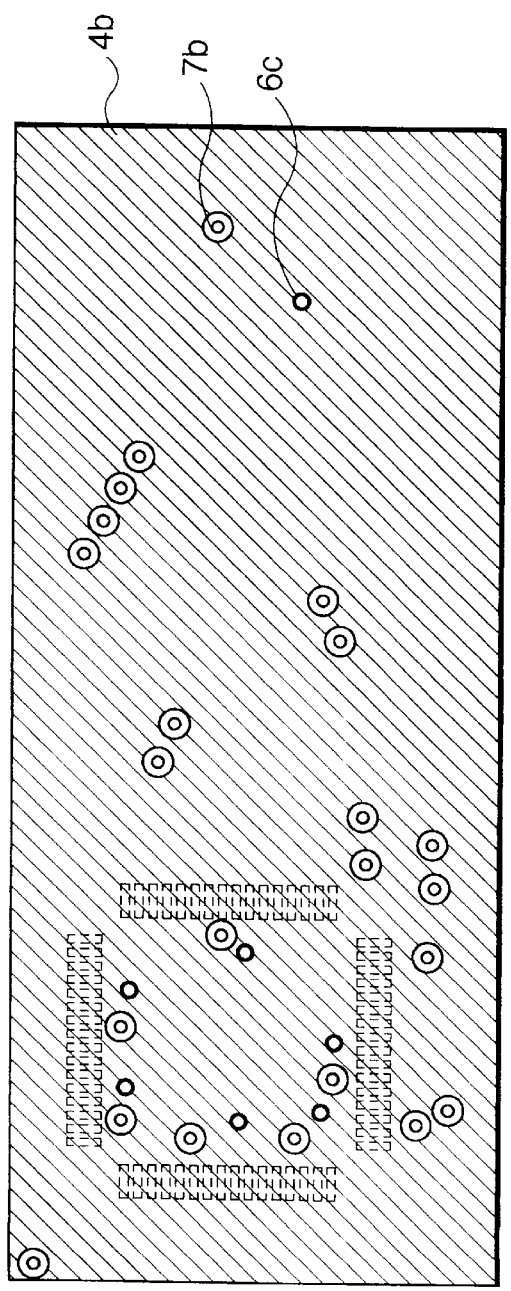
Figure 16D:
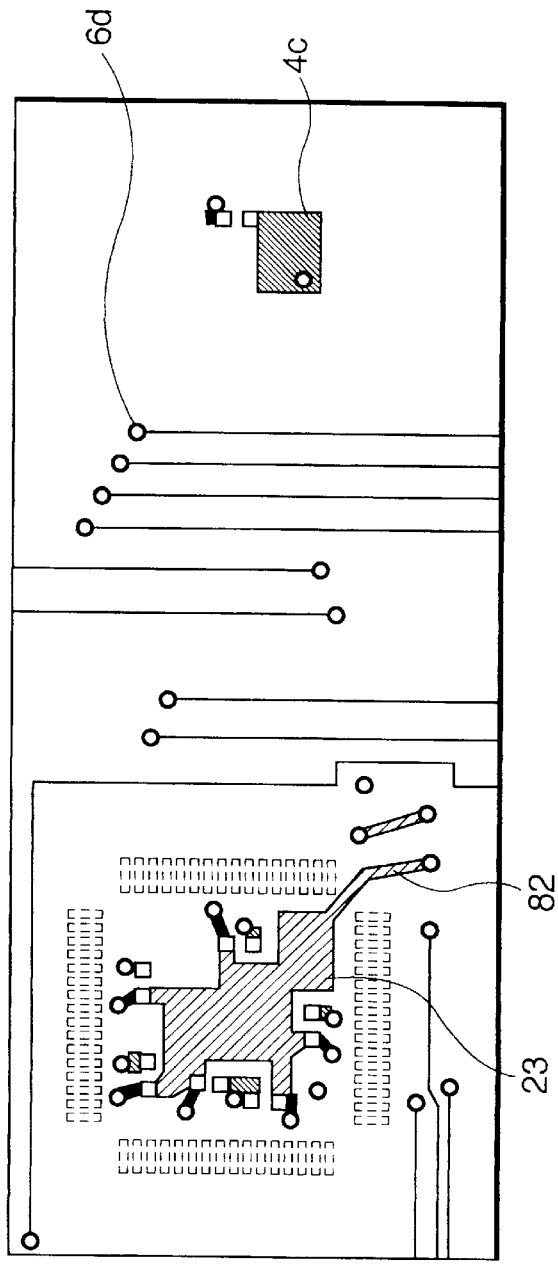

In FIG. 11C, since a power supply route for the internal logic of an LSI does not serve as any radiation noise generation source, an inductance is formed for power supply routes of power supply pins other than those for the logic. More specifically, the notched portion is formed to surround through hole lands connected to the power supply pins other than those for the logic of the LSI, and a portion inside the notched portion and the power supply pattern 3b outside the notched portion are connected via an inductance pattern (which may be replaced by a parallel-shaped pattern). Since the power supply pins that are related to radiation noise are those for supplying a power supply voltage to an I/O buffer, the notched portion may be formed in association with, e.g., the pins that supply a power supply voltage to the I/O buffer.

In FIG. 1D, since a signal pattern 5' that receives a clock signal from the first layer becomes a large radiation noise generation source, a pattern (which may be replaced by a parallel-shaped pattern) for connecting a portion inside the notched portion and the power supply pattern 3b outside the notched portion are located immediately below the signal pattern 5'. With this arrangement, the return current of the clock signal can have the shortest route.

As described above, in the multi-layered printed circuit board in which a portion surrounded by the notched portion is connected to the power supply pattern 3b via the inductance pattern, as the larger the inductance obtained by the inductance pattern becomes, radiation caused by a punch-through current can be prevented more effectively, but the return current of a signal becomes harder to flow. Hence, the inductance value that can minimize the total radiation noise level is preferably set in consideration of their balance. More specifically, when the inductance value of the inductance pattern is too small, the reduction effect of radiation caused by the power supply pattern is small; when it is too large, the return current of the signal becomes harder to flow via the shortest route, and radiation noise increases as a whole. Hence, in this embodiment, the inductance value of the inductance pattern is set to fall within the range from 5 nH to 1,000 nH, and preferably, 10 nH to 100 nH.

In order to remove noise more effectively, as shown in, e.g., FIGS. 12A to 12D, a GND pattern 4a connected to the GND pins of an LSI may be formed on the first layer, and a portion isolated by a notched portion on the second layer may be sandwiched between the GND pattern 4a and a GND pattern 4b on the third layer. With this arrangement, an inductance of several nH to several ten nH is formed between a portion inside the notched portion and the power supply pattern outside the notched portion, and radiation noise owing to the power supply pattern can be suppressed. In addition, since the notched portion is vertically sandwiched between the two GND patterns, radiation noise can be shielded.

The above-mentioned inductance pattern is formed on the second layer (power supply layer). However, the present invention is not limited to this. For example, a portion of the third layer (GND layer) may be removed, and an inductance pattern may be formed on the removed portion.

FIGS. 13A to 13D show the sixth embodiment of a multi-layered printed circuit board according to the present invention. In the multi-layered printed circuit board of the sixth embodiment, a notched portion 10 is formed to completely isolate a predetermined range including through hole lands 6b connected to the power supply pins of an LSI from a power supply pattern 3b. Furthermore, a notched portion 50 is formed on the power supply pattern 3b, and a spiral-shaped inductance pattern 52 is formed on the notched portion 50, so that the portion isolated by the notched portion 10 is connected to the power supply pattern 3b via the inductance pattern 52.

The inductance pattern 52 is formed with a through hole land 11b at the end portion at the center of the spiral pattern, and the other end is connected to the power supply pattern 3b. The through hold land 11b is connected to a through hole land 11c formed on a power supply pattern 53 of the fourth layer via a through hole. The power supply pattern 53 is formed with a through hole land 11c', which is electrically connected to a through hole land 51b' formed on the portion isolated by the notched portion 10 of the second layer via a through hole.

With this arrangement, as in the above-mentioned embodiments, since an inductance of several nH to several hundred nH can be formed along the wiring routes that supply a power supply voltage from the power supply pattern to the power supply pins of the LSI, radiation noise can be effectively prevented, and the return current route of a signal can be assured.

FIGS. 14A to 14D show the seventh embodiment of a multi-layered printed circuit board according to the present invention. In the multi-layered printed circuit board of the seventh embodiment, an LC circuit defined by an inductance and a capacitor is inserted in a line that connects a signal pin of an IC and that of an LSI so as to take a countermeasure against noise for the signal line, in addition to the arrangement of the fourth embodiment.

A notched portion 70 is formed on a power supply pattern 3b of the second layer in addition to a notched portion 10, and an inductance pattern 72 and a capacitor pattern 73 are formed on the portion of the notched portion 70. The inductance pattern 72 has a spiral shape, and is formed with a through hole land 71b at the end portion at the center of the spiral shape. The other end of the pattern 72 is connected to the capacitor pattern 73. The through hole land 71b is electrically connected to a through hole land 71a formed on the first layer via a through hole.

The capacitor pattern 73 constitutes a capacitor element since it is disposed to oppose a GND pattern 4b on the third layer, and is formed with a through hole land 71b' on a portion thereof. The through hole land 71b' is electrically connected to a through hole land 71a' formed on the first layer via a through hole. The through hole land 71a' is connected to a signal pattern 5' from a signal pin that repetitively outputs a clock signal having a periodicity, of those of the IC.

In the above-mentioned arrangement, the inductance pattern 72 is disposed at a position with a high noise reduction effect in the vicinity of the power supply pins, so as to effectively prevent radiation noise. In addition, a signal pin, which repetitively outputs a clock signal having a periodicity, of those of the IC is connected to that of the LSI via the LC circuit constituted by the inductance pattern 72 and the capacitor pattern 73, thus cutting high-frequency components of a signal, i.e., preventing generation of radiation noise.

FIGS. 15A to 15D show the eighth embodiment of a multi-layered printed circuit board according to the present invention. In the multi-layered printed circuit board of the eighth embodiment, a notched portion 10 is formed to completely isolate a predetermined range including through hole lands connected to the power supply pins of an LSI from a power supply pattern 3a, and the portion isolated by the notched portion 10 is connected to the power supply pattern 3b via an inductance pattern 82 formed in a coil shape across a plurality of layers, i.e., the first to fourth layers.

In this arrangement, since the inductance pattern 82 is formed into a coil shape, an inductance of several nH to several hundred nH is formed, i.e., an inductance larger than that of a parallel shape can be obtained. Hence, this arrangement is advantageous for the noise reduction effect.

As shown in FIGS. 16A to 16D, the power supply pins of the LSI may be connected via a power supply pattern 23 formed on the fourth layer without forming any notched portion 10, and the power supply pattern 23 may be connected to the power supply pattern 3b via the inductance pattern 82, thus obtaining the same effect.

A grid array package that adopts the multi-layered printed circuit board will be explained below.

In the following description, examples will be explained wherein the countermeasure against noise using the inductance pattern and the countermeasure against noise using an LC circuit constituted by the inductance pattern and the capacitor pattern described in the first to eighth embodiments of the multi-layered printed circuit boards are applied to a printed circuit board for a grid array package, and the arrangements will be described below.

As a grid array package, a BGA package and a PGA package are available. However, since these packages have basically the same structure except that electrodes connected to a printed circuit board have a ball shape or pin shape, the BGA package will be exemplified below.

Figure 17:
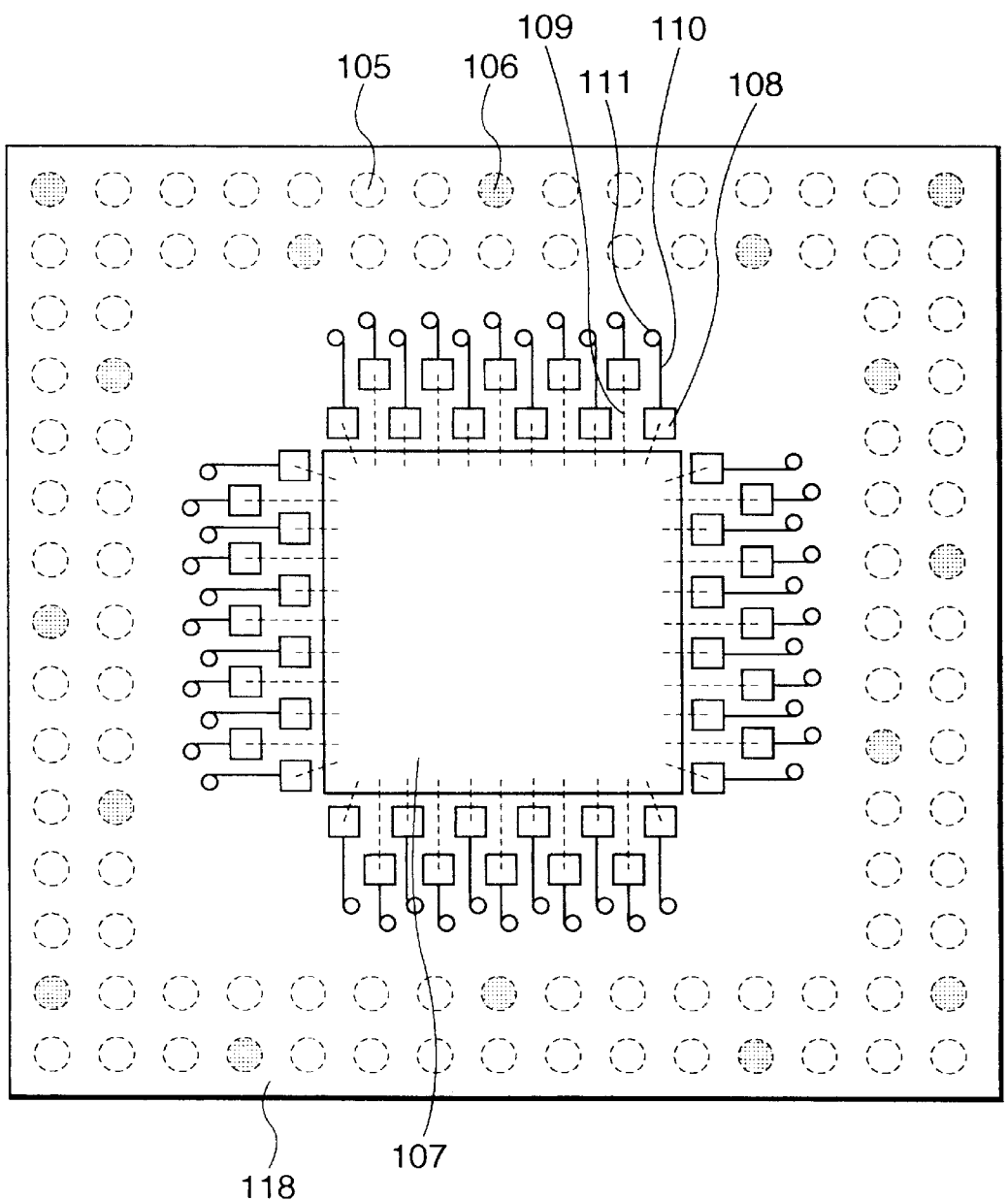
FIG. 17 is a plan view showing the first embodiment of a grid array package that adopts a multi-layered printed circuit board according to the present invention.
Figure 18:
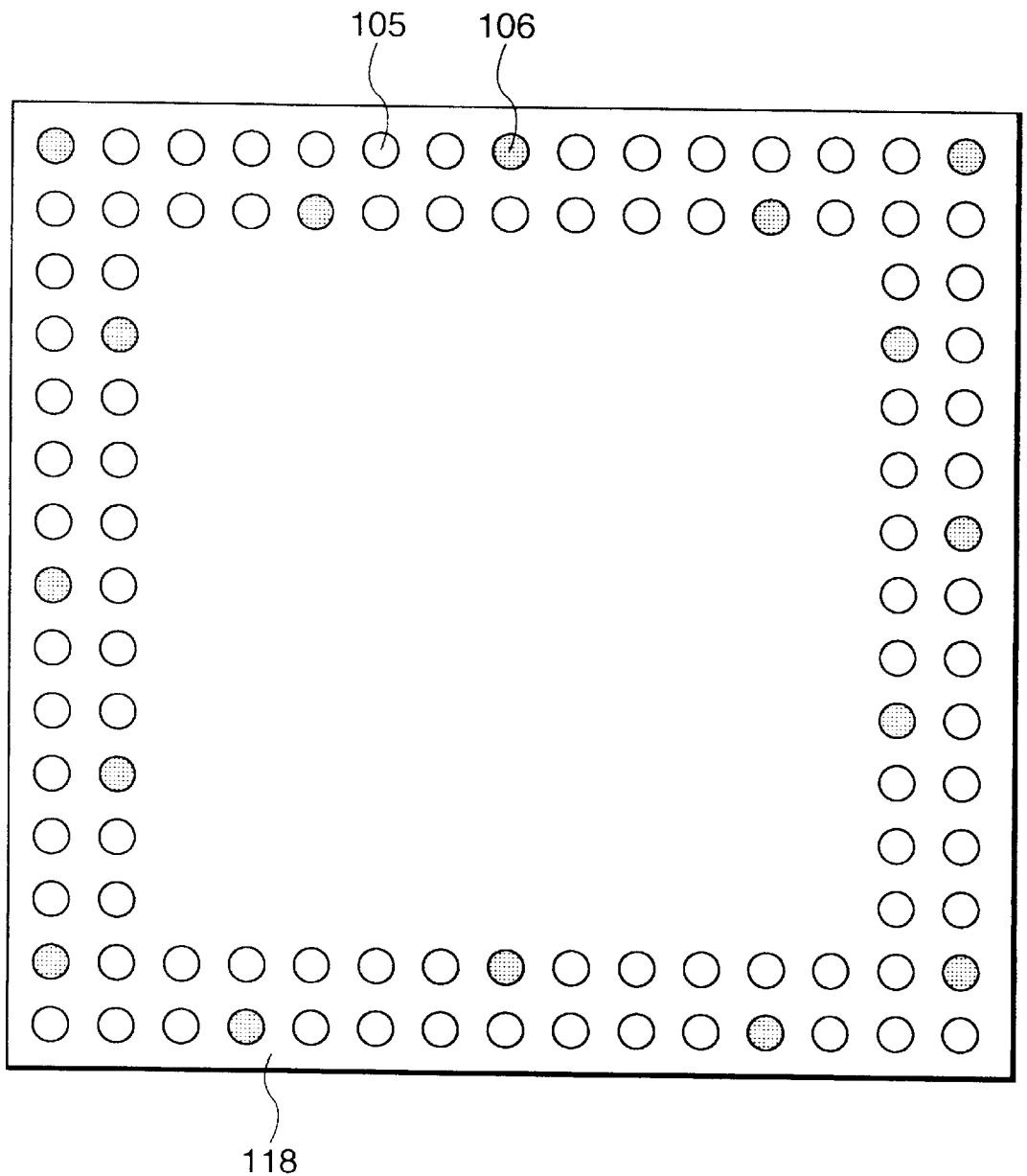
FIG. 18 is a bottom view of the grid array package shown in FIG. 17.
Figure 19:
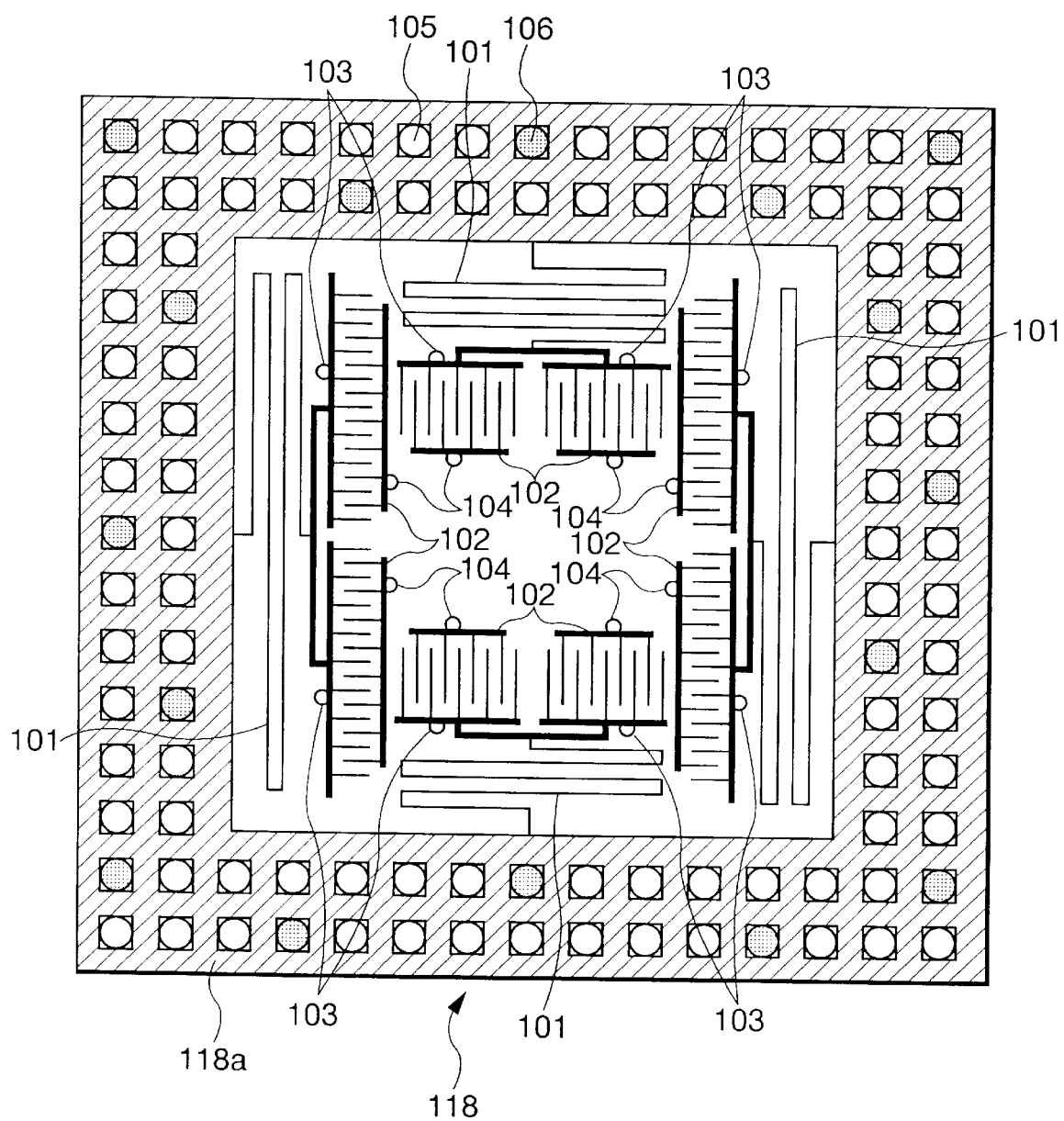
FIG. 19 is a plan view of a base board of the grid array package shown in FIG. 17.

FIG. 17 shows the first embodiment of a grid array package according to the present invention, FIG. 18 is a bottom view of the grid array package shown in FIG. 17, and FIG. 19 is a plan view showing a power supply layer of a base board of the grid array package shown in FIG. 17.

As shown in FIG. 17, a semiconductor chip 107 is mounted on the surface of a base board 118 having a multi-layered structure. A plurality of wire bonding pads 108 are arranged around the semiconductor chip 107, which is electrically connected to these wire bonding pads 108 via bonding wires 109. Signal lines 110 respectively extend from the wire bonding pads 108. These signal lines 110 are electrically connected, via through holes 111 and the wiring pattern in the base board 118, to ball grids 105 for signal connections or ball grids 106 for power supply connections, which are formed on the rear surface of the base board 118, as shown in FIGS. 17 and 18.

On the other hand, as shown in FIG. 19, inductor patterns 101 formed by parallel-shaped patterns and capacitor patterns 102 formed by interdigital-shaped patterns are arranged on a power supply layer 118a as one of inner layers of the base board 118. The inductor patterns 101 are disposed in units of sides as power supply blocks of the grid array package. The capacitor patterns 102 are disposed in units of power supply pins of the grid array package, and are connected to through holes for supplying a power supply voltage to the grid array package and through holes 104 for grounding the capacitor patterns 102. With this arrangement, the inductor patterns 101 and the capacitor patterns 102 can serve as an LC filter.

Note that a portion painted in black in FIG. 19 corresponds to a copper foil remaining portion of the power supply layer 118a, and is used as power supply lines, and the power supply and GND terminals of the capacitor patterns 102.

As described above, since a filter element for decoupling is formed as patterns on the base board 118, the power supply can be decoupled at a position closer to the semiconductor chip 107 than a case wherein a filter element is similarly formed on a printed circuit board (not shown) on which a grid array package is mounted, thus eliminating electromagnetic wave radiation noise from the printed circuit board. In addition, the density of signal lines and members on the printed circuit board around the grid array package can be reduced. As a result, the layout of signal lines can be easily attained, and the number of layers of the printed circuit board can be reduced. Hence, the structure of the printed circuit board itself can be simplified.

In order to form the inductor patterns 101 and the capacitor patterns 102 on the base board 118, very high-density wiring specifications are required. However, since the area of the base board 118 is very smaller than the printed circuit board on which the grid array package is to be mounted, the total cost can be reduced in consideration of disposal and the like of defective products as compared to that required when the entire printed circuit board is designed to have high-density specifications.

As the material of the base board 118, normal substrate materials such as thermo-setting resin materials such as a glass-epoxy base material, a polyimide base material, a fluorine resin base material, and the like, thermoplastic resin materials such as a polyether sulfone base material, a polyether imide base material, and the like, a ceramic material, and the like can be used. Furthermore, in consideration of the characteristics of an element formed by the patterns, a plurality of substrate materials may be combined to increase, e.g., the dielectric constant.

This embodiment is applied to the power supply lines. Alternatively, a filter element may be formed for the signal lines. In this case as well, since high-frequency components included in the signal lines can be cut at a position closer to the semiconductor chip, electromagnetic wave radiation noise from the printed circuit board can be eliminated.

Figure 20:
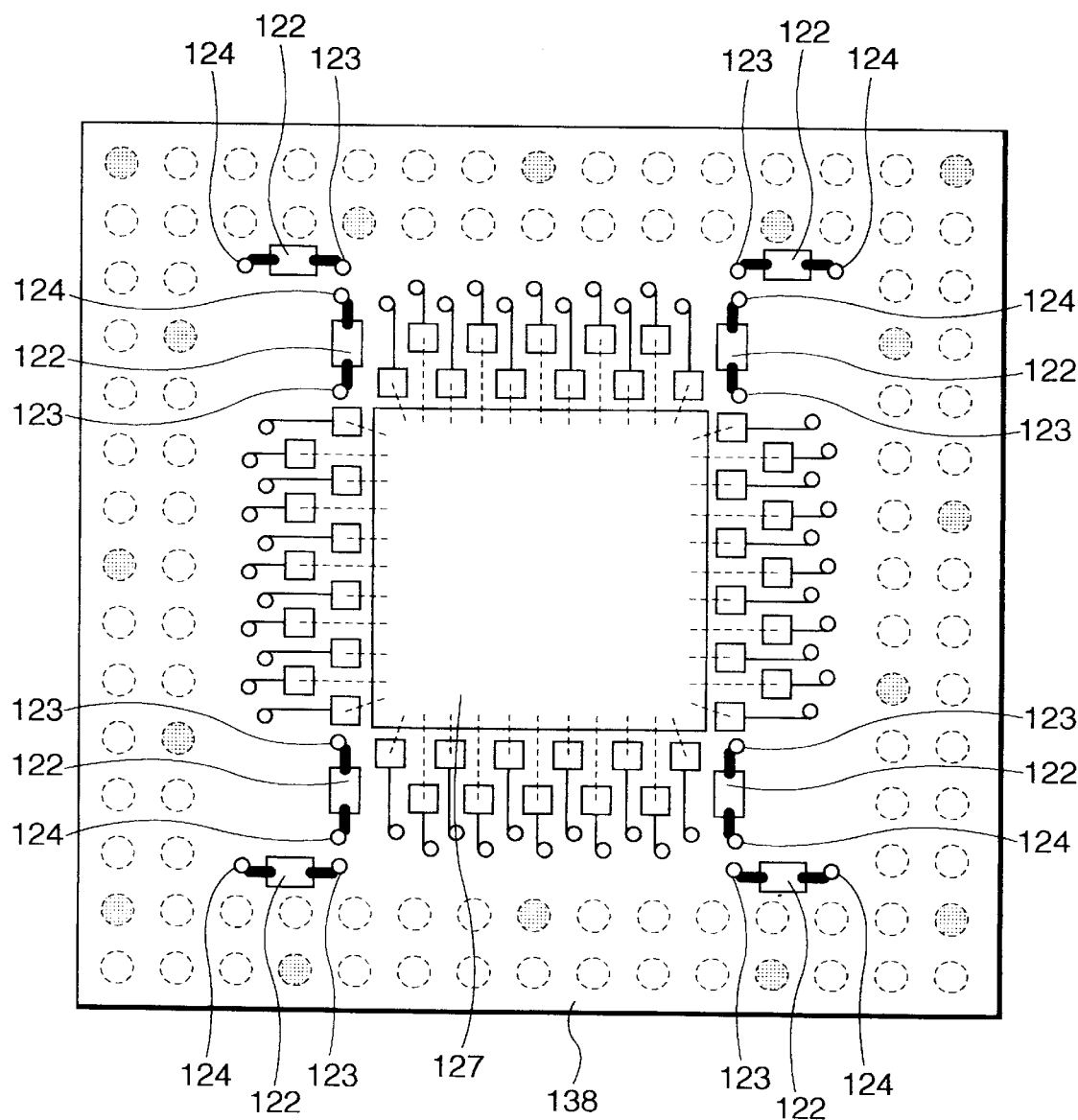
FIG. 20 is a plan view showing the second embodiment of a grid array package that adopts a multi-layered printed circuit board according to the present invention.
Figure 21:
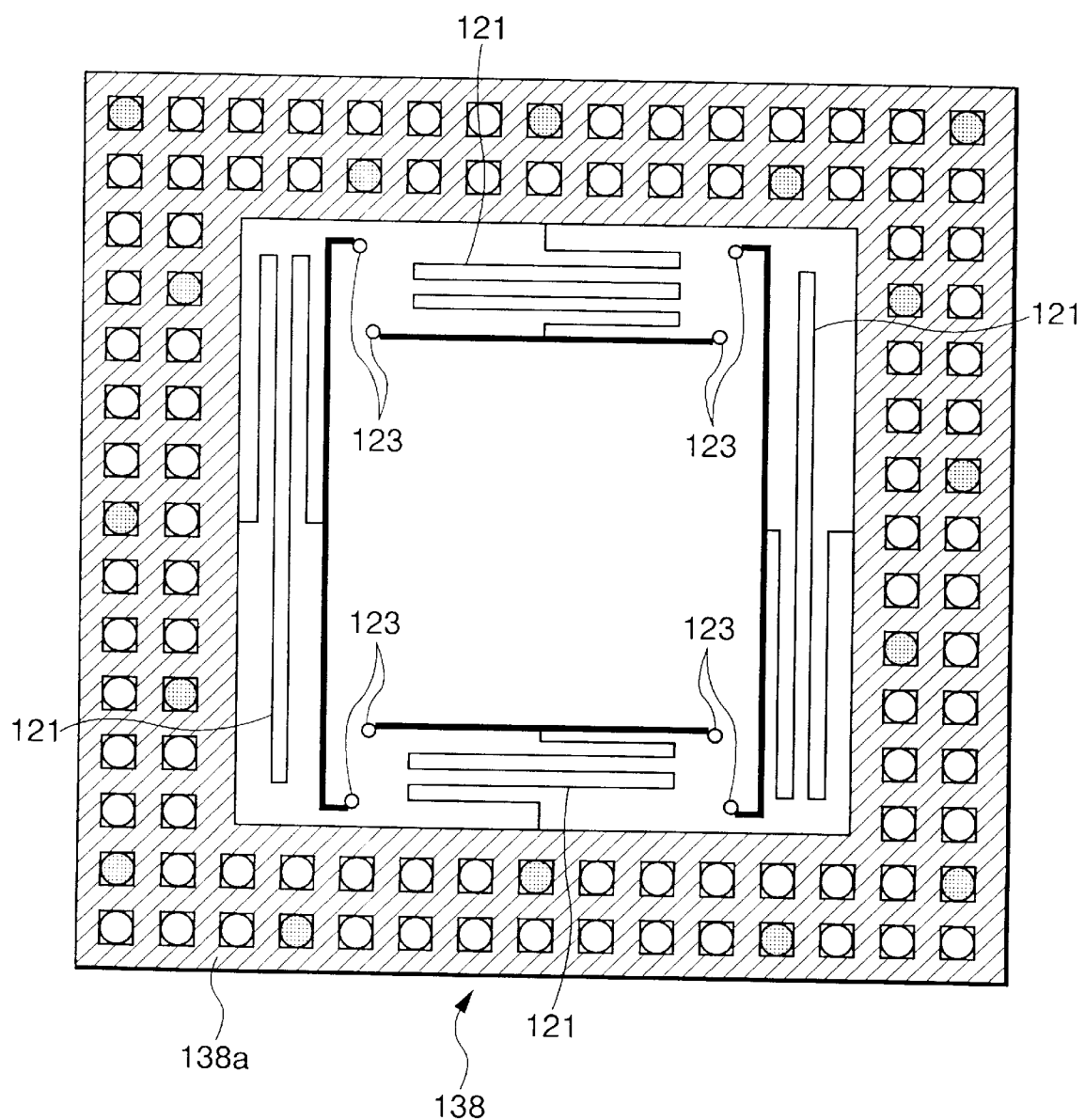
FIG. 21 is a plan view of a power supply layer of a base board of the grid array package shown in FIG. 20.

FIG. 20 shows the second embodiment of a grid array package according to the present invention, and FIG. 21 is a plan view of a power supply layer of a base board of the grid array package shown in FIG. 20.

In this embodiment, only inductance patterns 121 are formed on a power supply layer 138a of a base board 138. Also, capacitor elements 122 as chip members are mounted on the surface layer on which a semiconductor chip 127 is mounted. The inductor patterns 121 and the capacitor elements 122 are respectively connected to power supply lines via through holes 123. The capacitor elements 122 are grounded via through holes 124. A circuit constituted by these inductor patterns 121 and the capacitor elements 122 is equivalent to that shown in FIG. 19, and serves as an LC filter. Other arrangements are the same as those in the first embodiment of the grid array package described above, and a detailed description thereof will be omitted.

In this way, when the filter element is constituted on the base board 138 by combining the inductor patterns 121 and the capacitor elements 122 as chip members, electromagnetic wave radiation noise from the printed circuit board can be reduced as in the first embodiment, and the structure of the printed circuit board can be simplified.

When chip members are used, since a space for mounting the chip members must be assured in advance, the size of the base board 138 may be increased as needed.

Figure 22:
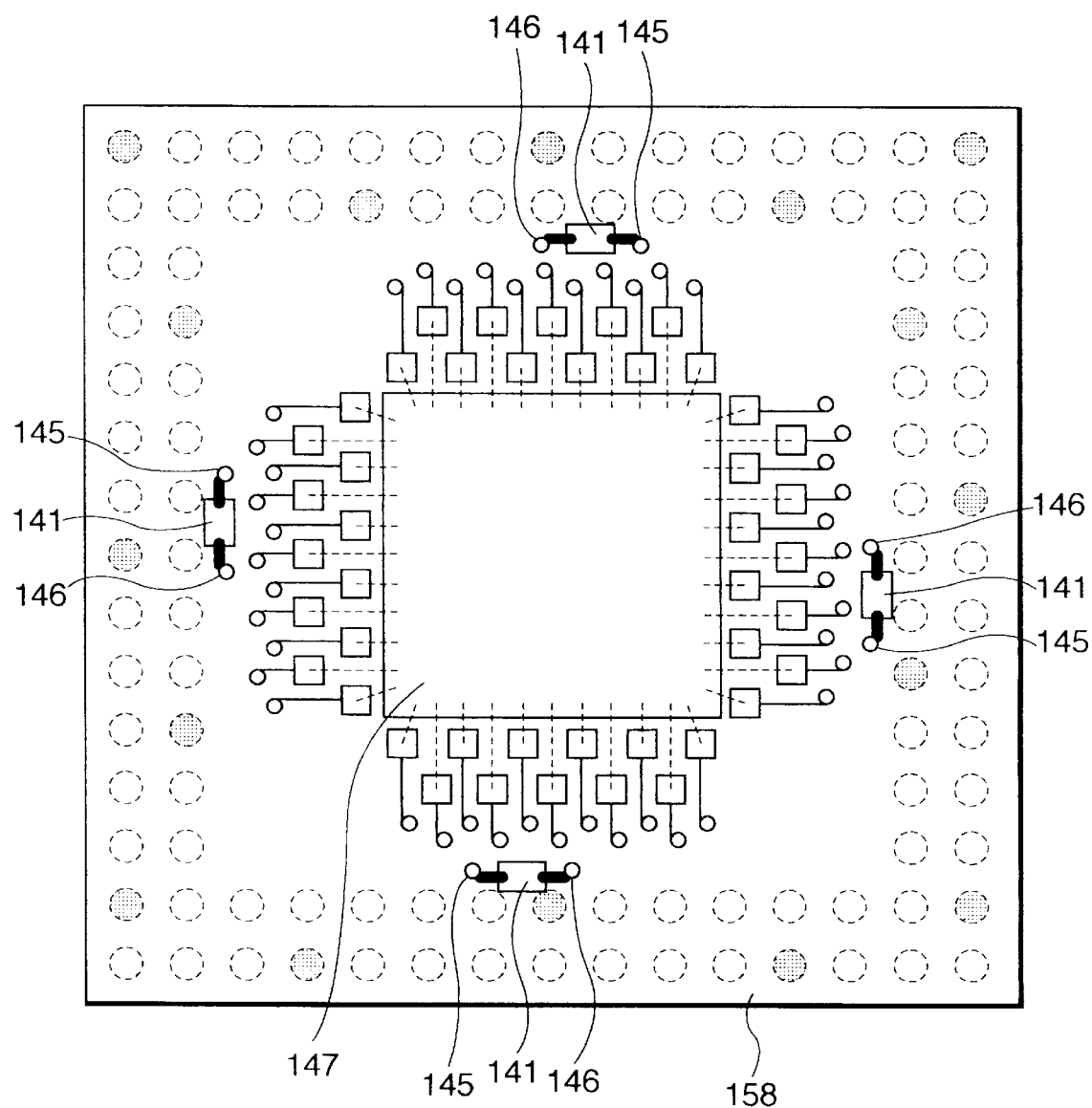
FIG. 22 is a plan view showing the third embodiment of a grid array package that adopts a multi-layered printed circuit board according to the present invention.
Figure 23:
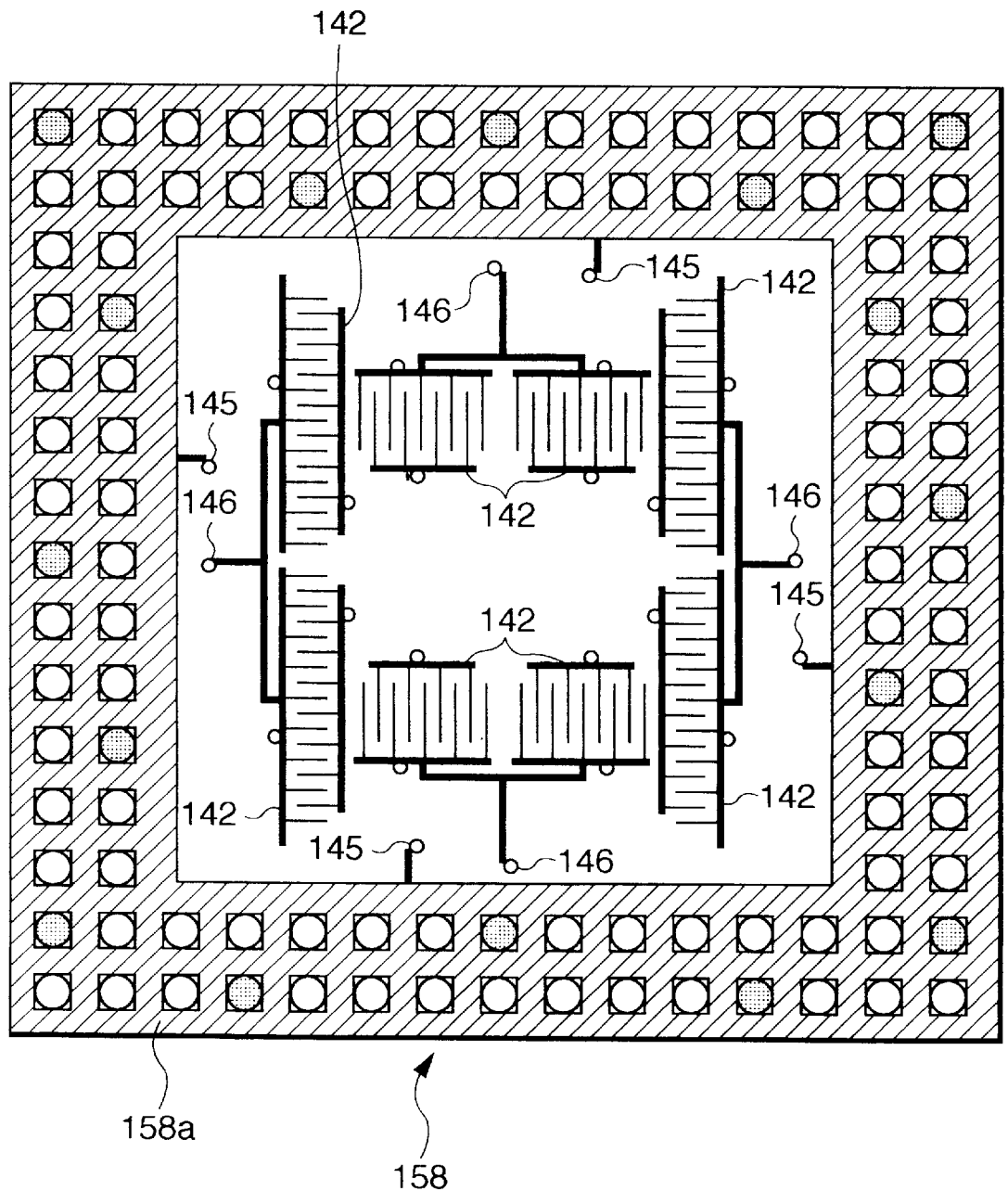
FIG. 23 is a plan view of a power supply layer of a base board of the grid array package shown in FIG. 22.

FIG. 22 shows the third embodiment of a grid array package according to the present invention, and FIG. 23 is a plan view of a power supply layer of a base board of the grid array package shown in FIG. 22.

In this embodiment, only capacitor patterns 142 are formed on a power supply layer 158a of a base board 158. Also, inductor elements 141 as chip members are mounted on the surface layer on which a semiconductor chip 147 is mounted. The inductor elements 141 are connected to power supply lines and the capacitor patterns 142 via through holes 145 and 156, respectively. A circuit constituted by these inductor elements 141 and capacitor patterns 142 is equivalent to that shown in FIG. 19, and serves as an LC filter. Other arrangements are the same as those in the first embodiment of the grid array package described above, and a detailed description thereof will be omitted.

In this manner, when the filter element is constituted on the base board 158 by combining the capacitor patterns 142 and the inductor elements 141 as chip members, electromagnetic wave radiation noise from the printed circuit board can be reduced as in the first embodiment, and the structure of the printed circuit board can be simplified.

Figure 24:
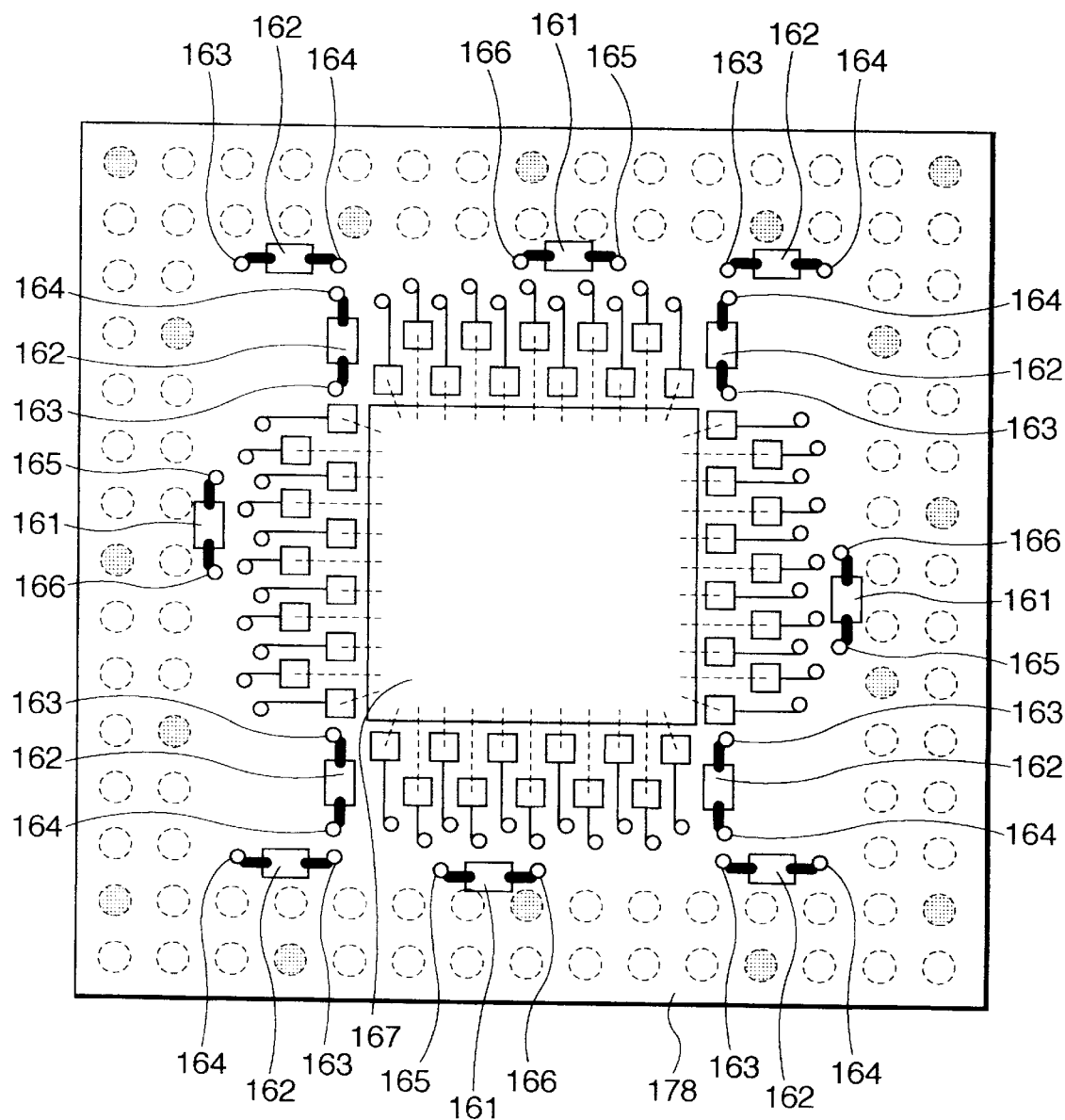
FIG. 24 is a plan view showing the fourth embodiment of a grid array package that adopts a multi-layered printed circuit board according to the present invention.
Figure 25:
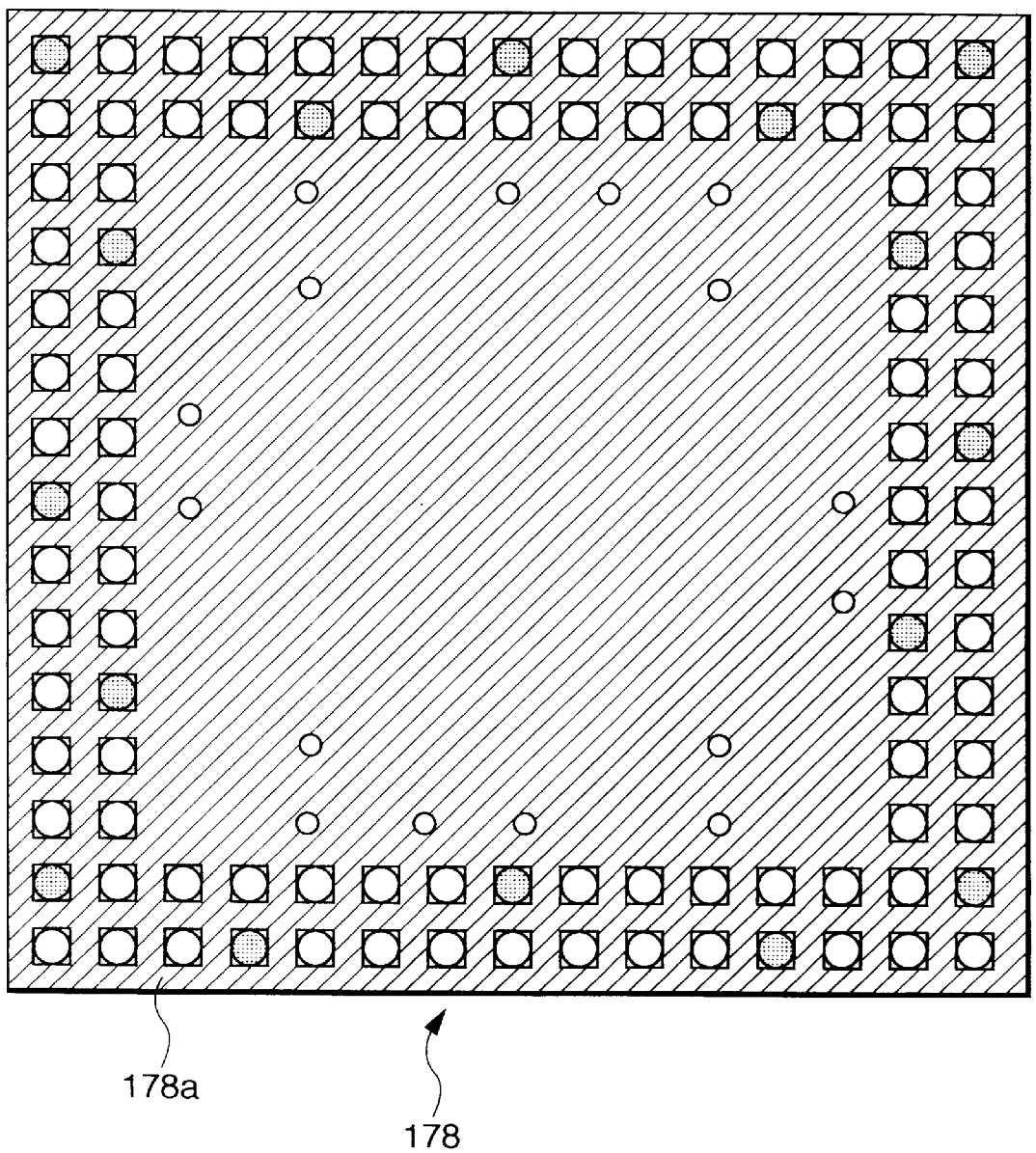
FIG. 25 is a plan view of a power supply layer of a base board of the grid array package shown in FIG. 24.

FIG. 24 shows the fourth embodiment of a grid array package according to the present invention, and FIG. 25 is a plan view of a power supply layer of a base board of the grid array package shown in FIG. 24.

In this embodiment, mat-shaped power supply lines are formed on a power supply layer 178a of a base board 178. Inductor elements 161 and capacitor elements 162 as chip members are mounted on the surface layer on which a semiconductor chip 167 is mounted. The inductor elements 161 are connected to the power supply lines and the capacitor elements 162 via through holes 165 and 166, respectively. Furthermore, the capacitor elements 162 are connected to a power supply via through holes 163, and are grounded via through holes 164. A circuit constituted by these inductor elements 161 and capacitor elements 162 is equivalent to that shown in FIG. 19, and serves as an LC filter. Other arrangements are the same as those in the first embodiment of the grid array package described above, and a detailed description thereof will be omitted.

In this manner, when the filter element is constituted on the base board 158 by mounting the capacitor elements 162 and the inductor elements 161 as chip members, electromagnetic wave radiation noise from the printed circuit board can be reduced as in the first embodiment, and the structure of the printed circuit board can be simplified.

According to the present invention, for example, since an inductance pattern is formed by utilizing an inner layer of the multi-layered printed circuit board, an inductance can be disposed at an optimal position for a radiation noise countermeasure.

Since an inductance and a capacitor are constituted by printed patterns, no members such as ferrite beads, inductance members, filters, and the like against radiation noise attributed to the power supply pattern are required, and the number of members of a filter and an inductance can be reduced. In addition, since the inductance and capacitor can be formed on an inner layer of the multi-layered board or under another member such as a QFP, the board can be packed at high density.

Furthermore, in the grid array package, since a countermeasure against noise is taken by forming an inductance pattern on the base board for the grid array package, radiation noise can be further reduced. In equation (1) above, since radiation noise is harder to generate as the loop area A is smaller, it is effective to take a countermeasure at a position as close to a semiconductor chip as possible. The countermeasure against noise using an inductance pattern is also advantageous for a size reduction of the board.

In the power supply pattern, a portion of which is isolated by a notch, the portion surrounded by the notch and the power supply pattern are connected via an inductance pattern. Hence, an inductance of several nH to several hundred nH can be obtained between the portion surrounded by the notch and the power supply pattern. With this arrangement radiation noise due to the power supply pattern can be suppressed, and the route of a return current of a signal can be assured.

Figure 26:
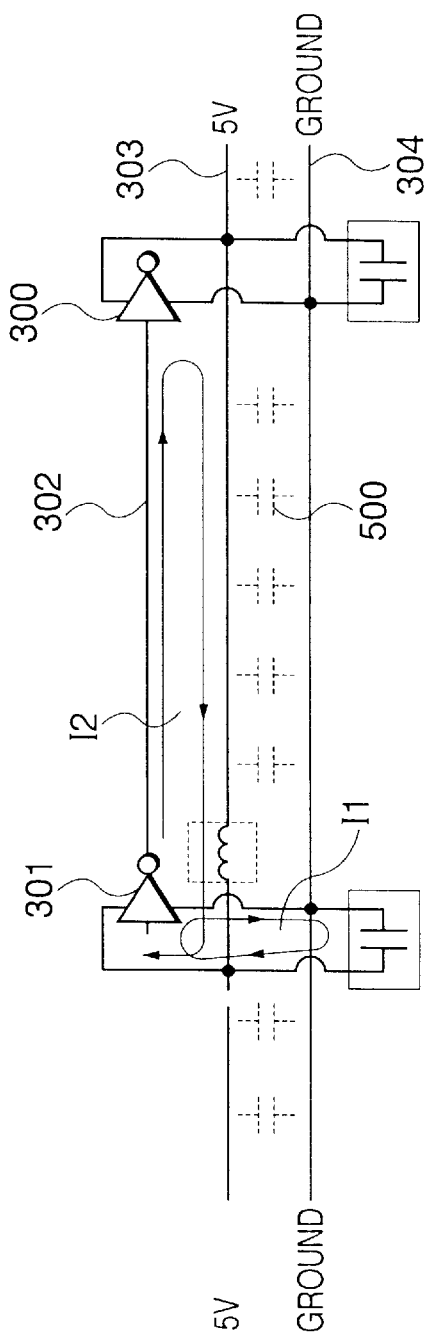
FIG. 26 is a view for explaining the route of a punch-through current in an arrangement in which a portion surrounded by a notch and a power supply pattern are connected via an inductance pattern.
Figure 27:
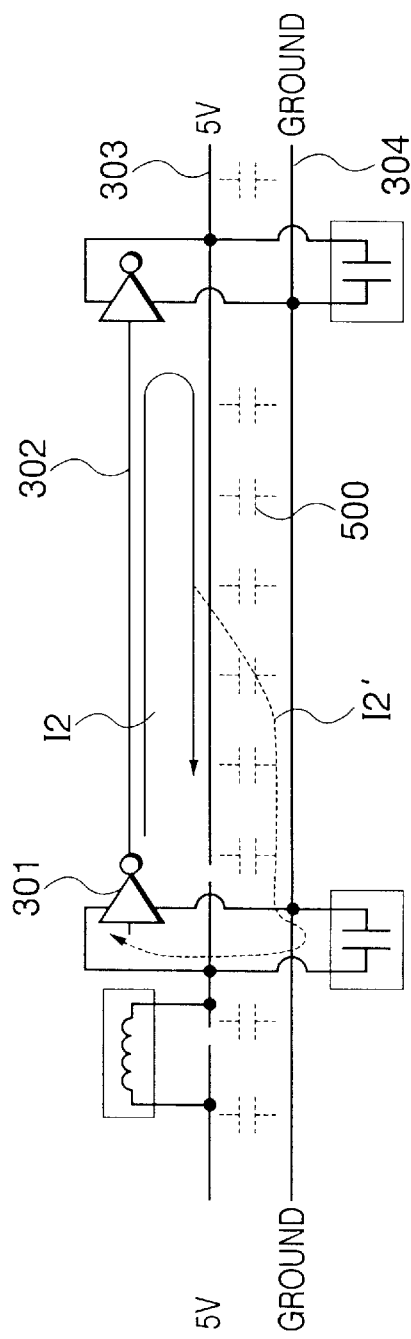
FIG. 27 is a view for explaining the route of a charging current flowing through a signal pattern of a circuit in which a portion of a power supply pattern is physically isolated, and the isolated power supply patterns are connected via an inductance member.
Figures 28A, 28B:
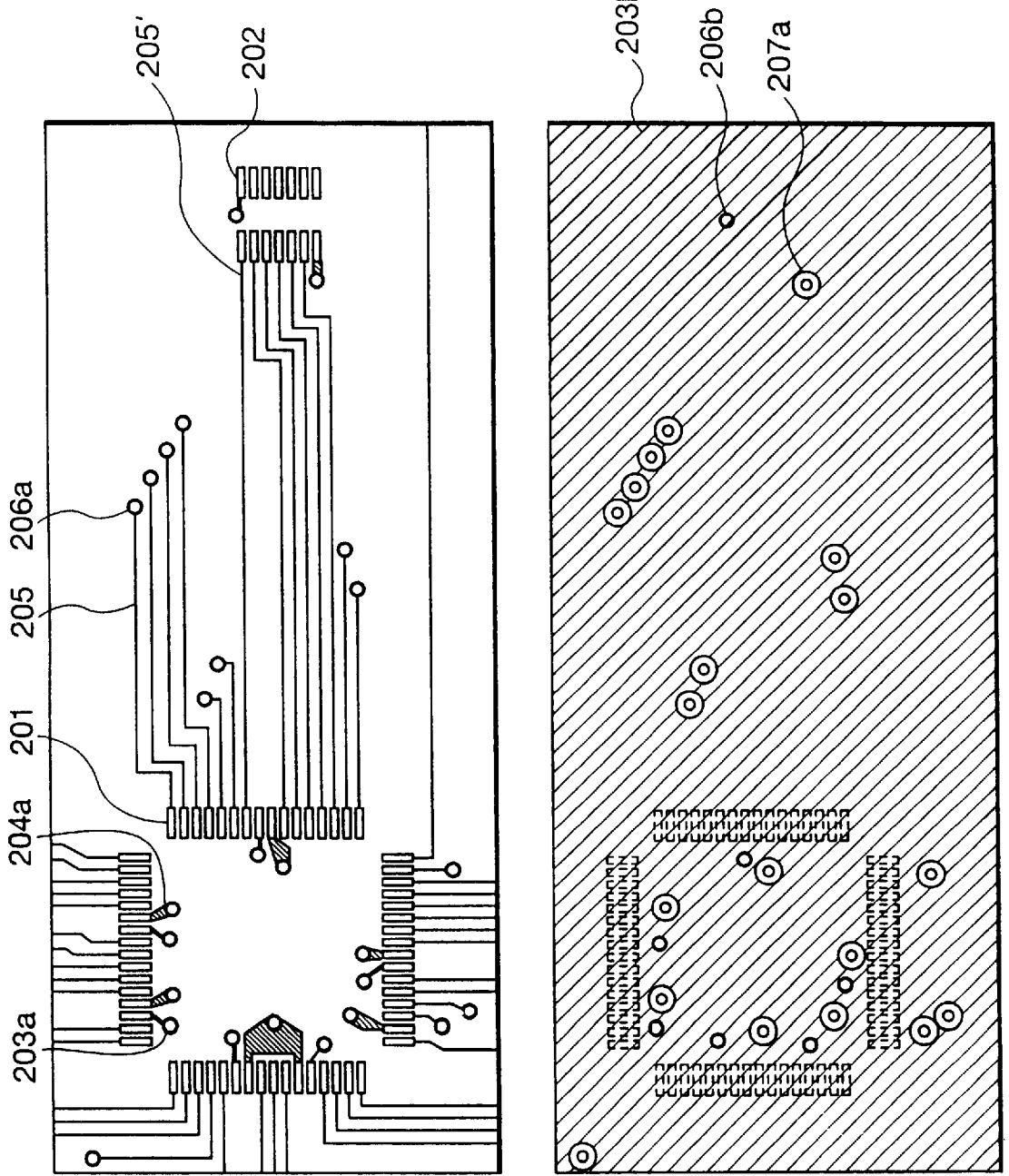
Figure 28C:
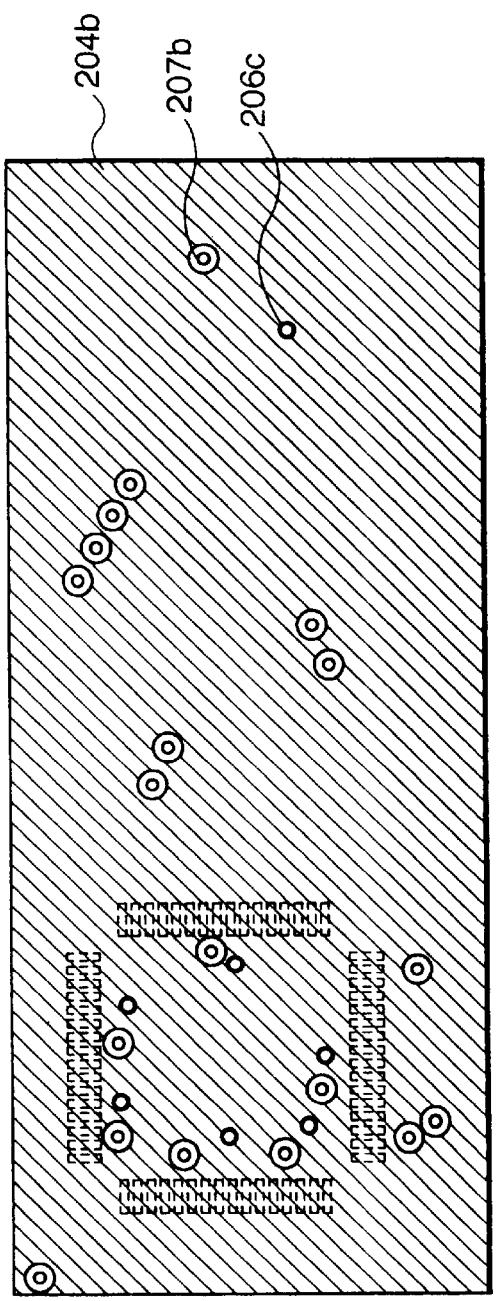
Figure 28D:
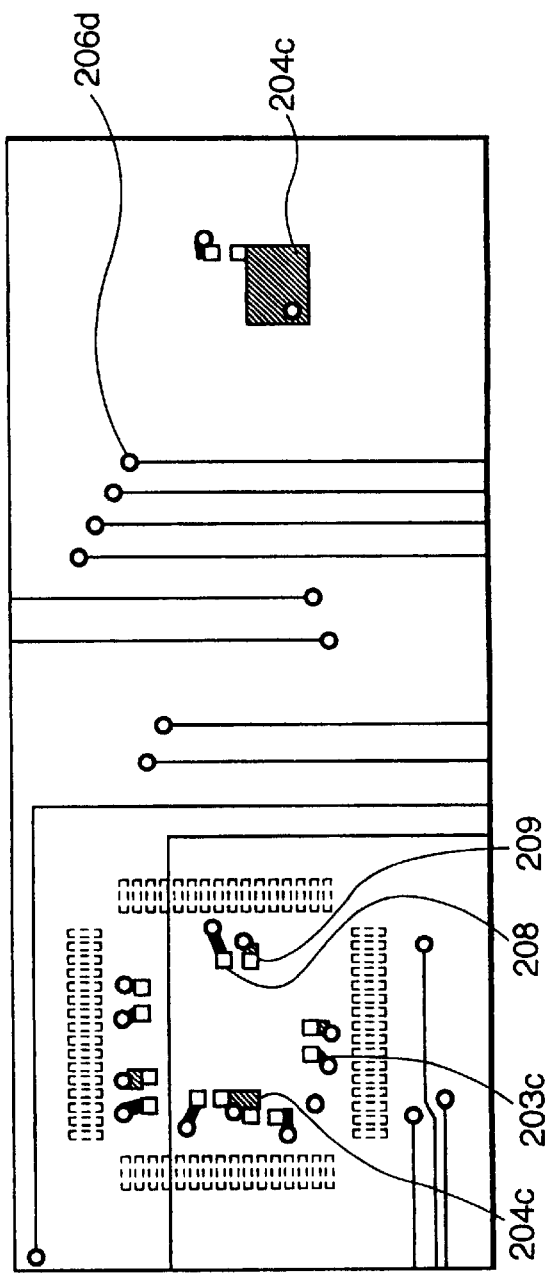

In particular, a circuit board on which an inductance pattern is formed in the vicinity of a signal pattern for repetitively receiving a clock signal having a periodicity has a circuit arrangement, as shown in FIG. 26. In FIG. 26, a signal pattern 302 receives a clock signal, and is formed on the first layer. A power supply pattern 303 is formed on a power supply layer as the second layer, and a GND pattern 304 is formed on a GND layer as the third layer. Capacitors 500 indicated by dotted lines are not actual members, but are stray capacitances formed between the power supply pattern 303 of the second layer and the GND pattern 304 of the third layer. A buffer circuit 301 in a semiconductor chip (LSI) outputs a clock signal, and an IC circuit 300 receives the clock signal. In FIG. 26, I1 indicates a punch-through current. With this arrangement, since the shortest route of a return current with respect to a charging current I2 can be prevented from being shielded, as shown in FIG. 27 and the loop area can be prevented from increasing, as indicated by a route I2', the shortest route of the return current of the clock signal can be assured, and a more effective countermeasure against radiation noise can be taken.

What is claimed is:
1. A multi-layered printed circuit board comprising:

an LSI mounted on said circuit board, sa d LSI having a plurality of power supply pins and a plurality of signal pins;

an inductance pattern formed as a circuit pattern on said circuit board, one end of said inductance pattern being connected to at least one of the plurality of power supply pins of said LSI; and a power supply pattern formed on said circuit board, said power supply pattern being connected to the other end of said inductance pattern.

2. A circuit board according to claim 1, wherein said inductance pattern is formed on an inner layer of said circuit board.

3. A circuit board according to claim 1, wherein through hole lands connected to the plurality of power supply pins are formed on said power supply pattern, a notch is formed to surround a predetermined range including some or all of said through hole lands, and a portion surrounded by the notch is connected at least at one position to said power supply pattern via said inductance pattern.

4. A circuit board according to claim 3, wherein said inductance pattern is disposed at a position in the vicinity of a signal line connected to a signal pin, which receives a clock signal having a periodicity, of the plurality of signal pins.

5. A circuit board according to claim 1, wherein said inductance pattern has a parallel shape.

6. A circuit board according to claim 1, wherein said inductance pattern has a spiral shape.

7. A circuit board according to claim 1, wherein said inductance pattern constitutes a low-pass filter together with a capacitor element arranged in the vicinity thereof.

8. A circuit board according to claim 1, wherein said capacitor element is formed by a circuit pattern.

9. A multi-layered printed circuit board comprising:

an LSI mounted on said circuit board, said LSI having a plurality of power supply pins and a plurality of signal pins;

an inductance pattern formed on a signal layer of said circuit board, one end of said inductance pattern being connected to at least one of the plurality of power supply pins of said LSI;

a power supply pattern formed on a power supply layer of said circuit board; and a through hole for connecting said power supply pattern and the other end of said inductance pattern.

10. A multi-layered printed circuit board comprising:

an LSI mounted on said circuit board, said LSI having a plurality of power supply pins and a plurality of ground pins;

an inductance pattern formed on a first layer of said circuit board, one end of said inductance pattern being connected to at least one of the plurality of power supply pins of said LSI;

a power supply pattern formed on a second supply layer of said circuit board;

a first through hole for connecting said inductance pattern and the other end of said power supply pattern;

a ground pattern formed on a third layer of said circuit board; and a second through hole for connecting said ground pattern and the ground pins.

11. A multi-layered printed circuit board comprising:

an LSI mounted on said circuit board, said LSI having a plurality of signal pins;

an inductance pattern formed as a circuit pattern on said circuit board, one end of said inductance pattern being connected to a predetermined pin of the plurality of signal pins of said LSI; and a signal line pattern formed on said circuit board, said signal line pattern being connected to the other end of said inductance pattern.

12. A circuit board according to claim 11, wherein said inductance pattern has a parallel shape.

13. A circuit board according to claim 11, wherein said inductance pattern has a spiral shape.

14. A circuit board according to claim 11, wherein said inductance pattern constitutes a low-pass filter together with a capacitor element arranged in the vicinity thereof.

15. A circuit board according to claim 11, wherein said capacitor element is formed by a circuit pattern.

16. A grid array package which adopts a multi-layered printed circuit board, comprising:

a semiconductor chip mounted on said package, said semiconductor chip having a plurality of power supply pins and a plurality of signal pins;

an inductance pattern formed as a circuit pattern on said package, one end of said inductance pattern being connected to at least one of the plurality of power supply pins of said semiconductor chip; and a power supply pattern formed on said package, said power supply pattern being connected to the other end of said inductance pattern.

17. A package according to claim 16, wherein said inductance pattern has a parallel shape.

18. A package according to claim 16, wherein said inductance pattern has a spiral shape.

19. A package according to claim 16, wherein said inductance pattern constitutes a low-pass filter together with a capacitor element arranged in the vicinity thereof.

20. A package according to claim 19, wherein said capacitor element is formed by a circuit pattern.

21. A grid array package comprising:

a semiconductor chip mounted on a package board, said semiconductor chip having a plurality of signal pins;

an inductance pattern formed as a circuit pattern on said package board, one end of said inductance pattern being connected to a predetermined pin of the plurality of signal pins of said semiconductor chip; and a signal line pattern formed on said package board, said signal line pattern being connected to the other end of said inductance pattern.

22. A package according to claim 21, wherein said inductance pattern has a parallel shape.

23. A package according to claim 21, wherein said inductance pattern has a spiral shape.

24. A package according to claim 21, wherein said inductance pattern constitutes a low-pass filter together with a capacitor element arranged in the vicinity thereof.

25. A package according to claim 24, wherein said capacitor element is formed by a circuit pattern.

26. A grid array package comprising:

a semiconductor chip mounted on a first layer of a package board, said semiconductor chip having a plurality of power supply pins and a plurality of signal pins;

an inductance pattern formed on a second layer of said package board, one end of said inductance pattern being connected to at least one of the plurality of power supply pins of said semiconductor chip;

a power supply pattern formed on the second layer of said package board, said power supply pattern being connected to one end of said inductance pattern; and a through hole for connecting the other end of said power supply pattern and at least one of the plurality of power supply pins.

* * * * *

UNITED STATES PATENT AND TRADEMARK OFFICE
CERTIFICATE OF CORRECTION

PATENT NO.  : 5,847,451

DATED       : December 8, 1998

INVENTOR(S) : TORU OHTAKI et al.

It is certified that error appears in the above-identified patent and that said Letters Patent is hereby corrected as shown below:

On the title page, item

[76] INVENTORS

"[76] Inventors: Toru Ohtaki; Yasuteru Ichida; Yasushi Takeuchi, all of c/o Canon Kabushiki Kaisha 30-2, Shimomaruko 3-chome, Ohta-ku, Tokyo, Japan" should read --[75] Inventors: Toru Ohtaki, Tokyo; Yasuteru Ichida, Tokyo; Yasushi Takeuchi, Tokyo, all of Japan--.

[73] Assignee

--[73] Assignee: Canon Kabushiki Kaisha, Tokyo, Japan-- should be inserted after the Inventors.

[56] References Cited

--Attorney, Agent, or Firm--Fitzpatrick, Cella, Harper & Scinto-- should be inserted after the Foreign Patent Documents.

Column 3

Line 36, "pines" should read --pins--.

UNITED STATES PATENT AND TRADEMARK OFFICE
CERTIFICATE OF CORRECTION

PATENT NO.   :   5,847,451

DATED        :   December 8, 1998

INVENTOR(S)  :   TORU OHTAKI et al.

It is certified that error appears in the above-identified patent and that said Letters Patent is hereby corrected as shown below:

Column 5

Line 24, "which" should read --in which--.

Column 7

Line 29, "lands 6 b," should read --lands 6b,--.

Column 9

Line 1, "23 b," should read --23b,--.
   Line 29, "pattern 3 b," should read --pattern 3b,--.

Column 13

Line 49, "very" should read --much--.

UNITED STATES PATENT AND TRADEMARK OFFICE
CERTIFICATE OF CORRECTION

PATENT NO.  : 5,847,451

DATED       : December 8, 1998

INVENTOR(S) : TORU OHTAKI et al.

It is certified that error appears in the above-identified patent and that said Letters Patent is hereby corrected as shown below:

Column 16

Line 1, "sa d" should read --said--.

Signed and Sealed this

Twelfth Day of October, 1999

Attest:

Attesting Officer

Q. TODD DICKINSON

Acting Commissioner of Patents and Trademarks